(12) United States Patent
Cheng et al.

(10) Patent No.: US 10,985,265 B2
(45) Date of Patent: Apr. 20, 2021

(54) METHOD FOR FORMING SEMICONDUCTOR DEVICE STRUCTURE

(71) Applicant: TAIWAN SEMICONDUCTOR MANUFACTURING CO., LTD., Hsinchu (TW)

(72) Inventors: Chung-Liang Cheng, Changhua County (TW); I-Ming Chang, ShinChu (TW); Hsiang-Pi Chang, New Taipei (TW); Hsueh-Wen Tsau, Miaoli County (TW); Ziwei Fang, Hsinchu (TW); Huang-Lin Chao, Hillsboro, OR (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/548,446

(22) Filed: Aug. 22, 2019

(65) Prior Publication Data

US 2021/0057550 A1 Feb. 25, 2021

(51) Int. Cl.
*H01L 29/66* (2006.01)
*H01L 29/78* (2006.01)

(52) U.S. Cl.
CPC .. *H01L 29/66795* (2013.01); *H01L 29/66545* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,583,399 B1 * | 2/2017 | Chen | H01L 29/161 |
| 9,608,116 B2 | 3/2017 | Ching et al. | |
| 2017/0170027 A1 * | 6/2017 | Hou | H01L 21/3215 |
| 2018/0012767 A1 * | 1/2018 | Aoyama | H01L 21/67115 |

* cited by examiner

*Primary Examiner* — Khaja Ahmad
(74) *Attorney, Agent, or Firm* — Birch, Stewart, Kolasch & Birch, LLP

(57) ABSTRACT

A method for forming a semiconductor device structure is provided. The method includes forming a semiconductor layer on a semiconductor substrate, forming an interfacial layer on the semiconductor layer, forming a first gate dielectric layer on the interfacial layer, introducing fluorine on the first gate dielectric layer, annealing the first gate dielectric layer, forming a second gate dielectric layer on the first gate dielectric layer, introducing fluorine on the second gate dielectric layer, annealing the second gate dielectric layer, and forming a gate stack structure on the second gate dielectric layer.

20 Claims, 40 Drawing Sheets

METHOD FOR FORMING SEMICONDUCTOR DEVICE STRUCTURE

BACKGROUND

The electronics industry is experiencing an ever-increasing demand for smaller and faster electronic devices which are able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, continued improvements are still needed.

DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2B-1, 2C-1, 2D-1, 2E-1, 2F-1, 2G-1, 2H-1, 2I-1, 2J-1, 2K-1, 2L-1, 2M-1, 2N-1, 2O-1, 2P-1, 2Q-1, and 2R-1 are cross-sectional views illustrating the formation of semiconductor device structures along line I-I in FIG. 1 at various intermediate stages, in accordance with some embodiments.

FIGS. 2A-2, 2B-2, 2C-2, 2D-2, 2E-2, 2F-2, 2G-2, 2H-2, 2I-2, 2J-2, 2K-2, 2L-2, 2M-2, 2N-2, 2O-2, 2P-2, 2Q-2, and 2R-2 are cross-sectional views illustrating the formation of semiconductor device structures along line II-II in FIG. 1 at various intermediate stages, in accordance with some embodiments.

DETAILED DESCRIPTION

Figure 1:
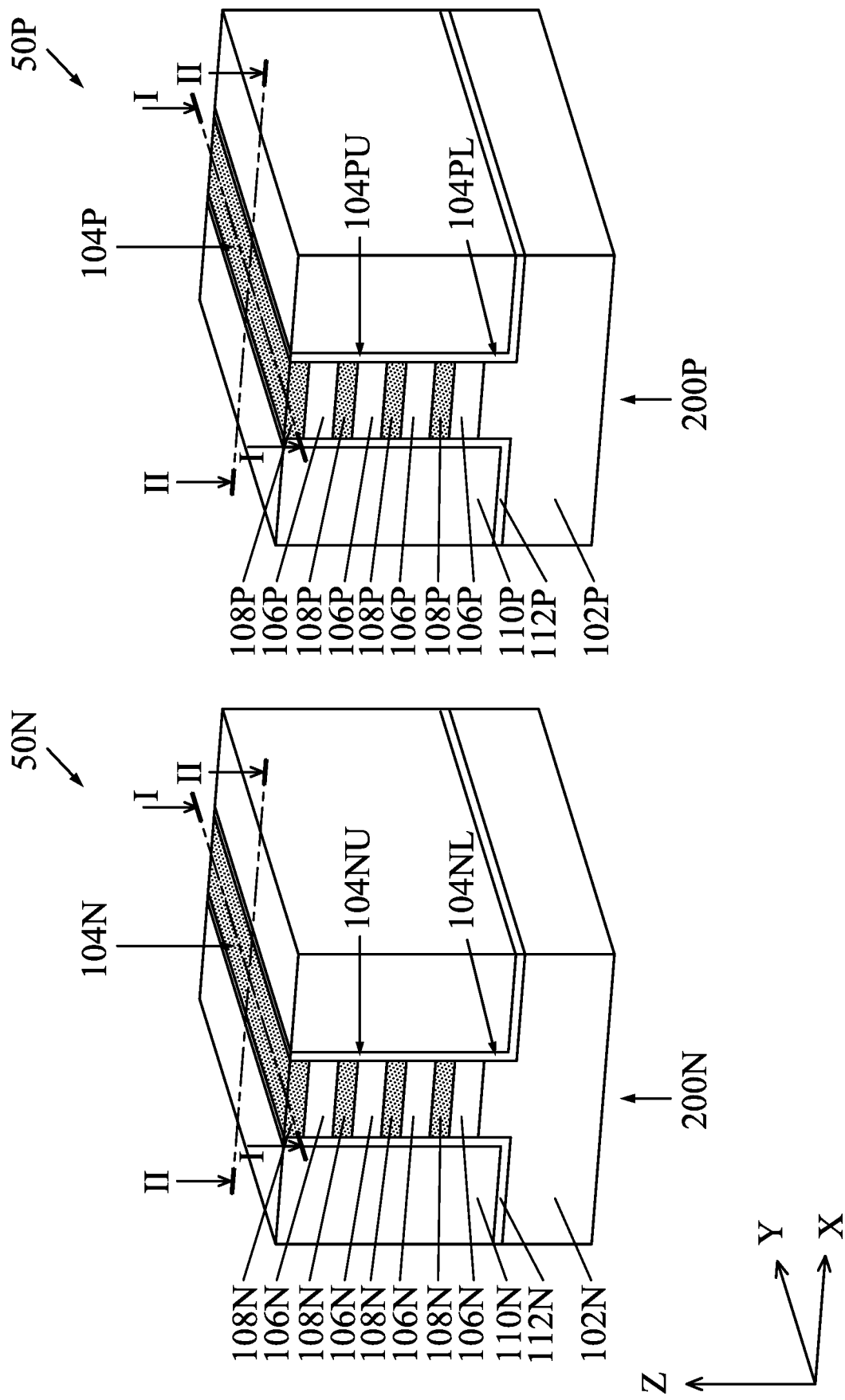
FIG. 1 is a perspective view of semiconductor device structures, in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device structure (e.g., GAA structure) are provided. The method for forming the semiconductor device structure may include forming an interfacial layer on a semiconductor layer, forming a first gate dielectric layer on the interfacial layer, and forming a second gate dielectric layer on the first gate dielectric layer. The method may also include introducing fluorine on the first gate dielectric layer and the second gate dielectric layer, and annealing the first gate dielectric layer and the second gate dielectric layer, so that the defects (e.g., dangling bonds) at the interface between the semiconductor layer and the interfacial layer and the defects (e.g., dangling bonds) at the interface between the first gate dielectric layer and the second gate dielectric layer may be reduced.

FIG. 1 is a perspective view of a semiconductor device structure 50N and a semiconductor device structure 50P, in accordance with some embodiments of the present disclosure. The semiconductor device structure 50N is located in an NMOS region 200N, and the semiconductor device structure 50P is located in a PMOS region 200P, in accordance with some embodiments. Although the NMOS region 200N and the PMOS region 200P are shown as being separate in the figure, the NMOS region 200N and the PMOS region 200P are part of an integrated circuit (IC) device, in accordance with some embodiments.

The formation of the semiconductor device structures 50N and 50P includes providing a bulk substrate, in accordance with some embodiments. The bulk substrate includes a substrate 102N in the NMOS region 200N and a substrate 102P in the PMOS region 200P, in accordance with some embodiments.

A fin structure 104N and an isolation structure 110N are formed on the substrate 102N, in accordance with some embodiments. The fin structure 104N is surrounded by the isolation structure 110N, in accordance with some embodiments. A fin structure 104P and an isolation structure 110P are formed on the substrate 102P, in accordance with some embodiments. The fin structure 104P is surrounded by the isolation structure 110P, in accordance with some embodiments.

In some embodiments, the bulk substrate (including the substrates 102N and 102P) is a semiconductor substrate such as a silicon substrate. In some embodiments, the bulk substrate includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. In some embodiments, the bulk substrate includes an epitaxial layer (epi-layer) formed thereon. In some embodiments, the bulk substrate is a semiconductor-on-insulator (SOI) substrate which includes a semiconductor substrate, a buried oxide layer over the substrate, and a semiconductor layer over the buried oxide layer.

The fin structure 104N extends in the Y direction, in accordance with some embodiments. The fin structure 104N includes a lower portion 104NL and an upper portion 104NU, in accordance with some embodiments. The lower portion 104NL of the fin structure 104N is formed by a portion of the substrate 102N, in accordance with some embodiments. The upper portion 104NU of the fin structure 104N is formed by a stacked semiconductor structure, which includes first semiconductor layers 106N and second semiconductor layers 108N alternately stacked over the lower portion 104NL, in accordance with some embodiments.

The fin structure 104P extends in the Y direction, in accordance with some embodiments. The fin structure 104P includes a lower portion 104PL and an upper portion 104PU, in accordance with some embodiments. The lower portion 104PL of the fin structure 104P is formed by a portion of the substrate 102P, in accordance with some embodiments. The upper portion 104PU of the fin structure 104P is formed by a stacked semiconductor structure, which includes first semiconductor layers 106P and second semiconductor layers 108P alternately stacked over the lower portion 104PL, in accordance with some embodiments.

As explained in detail below, the first semiconductor layers 106N and 106P of the fin structures 104N and 104P will be removed so that the second semiconductor layers 108N and 108P of the fin structures 104N and 106P form nanowire structures extending between source/drain features, in accordance with some embodiments. The nanowire structures of the second semiconductor layers 108N and 108P will be surrounded by respective gate stack structures to serve as channel regions of the semiconductor device structures, in accordance with some embodiments. For example, the embodiments described herein illustrate processes and materials that may be used to form nanowire structures with a GAA design for n-type FinFETs and p-type FinFETs.

In some embodiments, the formation of the fin structures 104N and 104P includes forming a stacked semiconductor structure including a first semiconductor material for the first semiconductor layers 106N and 106P and a second semiconductor material for the second semiconductor layers 108N and 108P over the bulk substrate.

The first semiconductor material for the first semiconductor layers 106N and 106P have a lattice constant different from that of the second semiconductor material for the second semiconductor layers 108N and 108P, in accordance with some embodiments. In some embodiments, the first semiconductor layers 106N and 106P are made of SiGe, where the percentage of germanium (Ge) in the SiGe is in the range from about 20 atomic % to about 50 atomic %, and the second semiconductor layers 108N and 108P are made of silicon. In some embodiments, the first semiconductor layers 106N and 106P are $Si_{1-x}Ge_x$, where x is more than about 0.3, or Ge (x=1.0) and the second semiconductor layers 108N and 108P are Si or $Si_{1-y}Ge_y$, where y is less than about 0.4, and x>y.

In some embodiments, the first semiconductor material and the second semiconductor material are formed using low pressure chemical vapor deposition (LPCVD), epitaxial growth process, another applicable method, or a combination thereof. In some embodiments, the epitaxial growth process includes molecular beam epitaxy (MBE), metal organic chemical vapor deposition (MOCVD), or vapor phase epitaxy (VPE).

In some embodiments, the thickness of each of the first semiconductor layers 106N and 106P is in a range from about 1.5 nanometers (nm) to about 20 nm. In some embodiments, the first semiconductor layers 106N and 106P are substantially uniform in thickness. In some embodiments, the thickness of each of the second semiconductor layers 108N and 108P is in a range from about 1.5 nm to about 20 nm. In some embodiments, the second semiconductor layers 108N and 108P are substantially uniform in thickness.

Afterwards, the stacked semiconductor structure including the first semiconductor material and the second semiconductor material and the underlying bulk substrate are patterned into the fin structure 104N and the fin structure 104P, in accordance with some embodiments.

In some embodiments, the patterning process includes forming a hard mask layer (not shown in the figures) over the stacked semiconductor structure, and etching the semiconductor structure and the underlying bulk substrate through the hard mask layer. In some embodiments, the etching process of the patterning process removes portions of the stacked semiconductor structure uncovered by the hard mask layer and further recesses the bulk substrate to form trenches.

In some embodiments, after the etching process, the substrate 102N has a portion which protrudes from between the trenches to form the lower portion 104NL of the fin structure 104N. In some embodiments, a remaining portion of the stacked semiconductor structure directly above the lower portion 104NL forms the upper portions 104NU of the fin structure 104N.

In some embodiments, after the etching process, the substrate 102P has a portion which protrudes from between the trenches to form the lower portion 104PL of the fin structure 104P. In some embodiments, a remaining portion of the stacked semiconductor structure directly above the lower portion 104PL forms the upper portions 104PU of the fin structure 104P.

Afterward, a lining layer 112N is conformally formed along the substrate 102N and the fin structure 104N, in accordance with some embodiments. Similarly, a lining layer 112P is conformally formed along the substrate 102P and the fin structure 104P, in accordance with some embodiments. In some embodiments, the lining layers 112N and 112P are further formed along the hard mask layer.

In some embodiments, the lining layers 112N and 112P are formed by a bilayer structure, such as a silicon oxide layer and a silicon nitride layer formed on the silicon oxide layer. In some embodiments, the lining layers 112N and 112P are formed using thermal oxidation, CVD, atomic layer deposition (ALD), another applicable method, and/or a combination thereof.

Afterwards, an insulating material for the isolation structures 110N and 110P is formed over the lining layers 112N and 112P, in accordance with some embodiments. The insulating material fills the trenches and covers the upper surface of the hard mask layer, in accordance with some embodiments.

In some embodiments, the insulating material includes silicon oxide, silicon nitride, silicon oxynitride (SiON), another applicable insulating material, and/or a combination thereof. In some embodiments, the insulating material is formed using LPCVD, plasma enhanced CVD (PECVD), high density plasma CVD (HDP-CVD), high aspect ratio process (HARP), flowable CVD (FCVD), ALD, another applicable method, and/or a combination thereof.

Afterwards, the insulating material and the lining layers 112N and 112P formed above the hard mask layer are removed to form the isolation structures 110N and 110P, in accordance with some embodiments. In some embodiments, the removal process further removes the hard mask layer and exposes the upper surfaces of the fin structures 104N and 104P. In some embodiments, the removal process is an etch-back process, a chemical mechanical polishing (CMP) process, another applicable process, and/or a combination thereof.

Figure 2A:
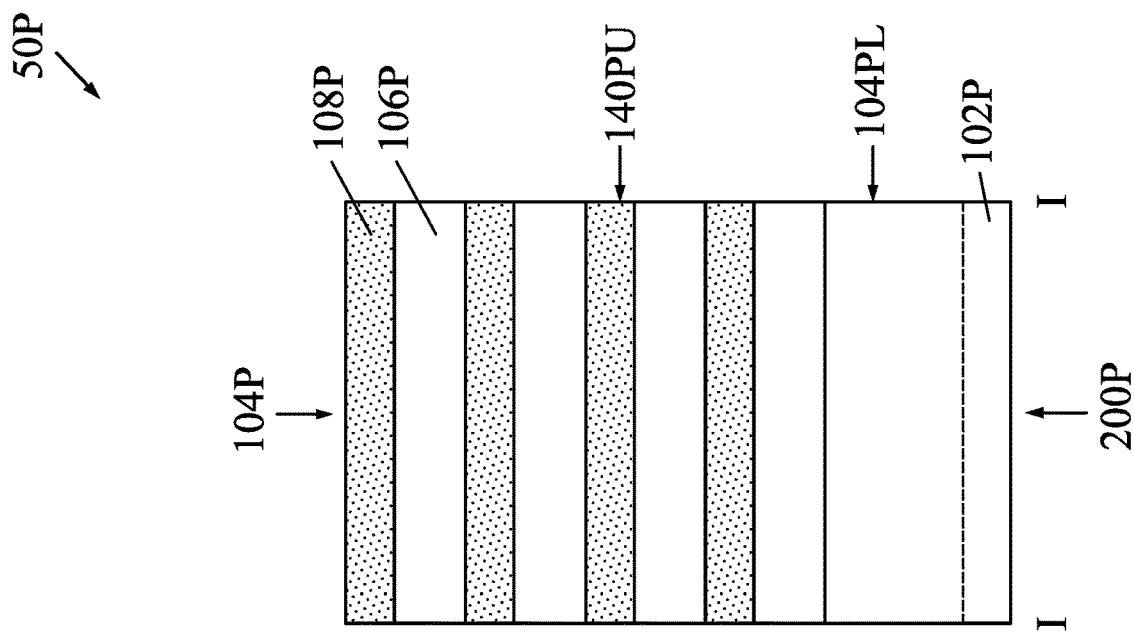
Figure 1:
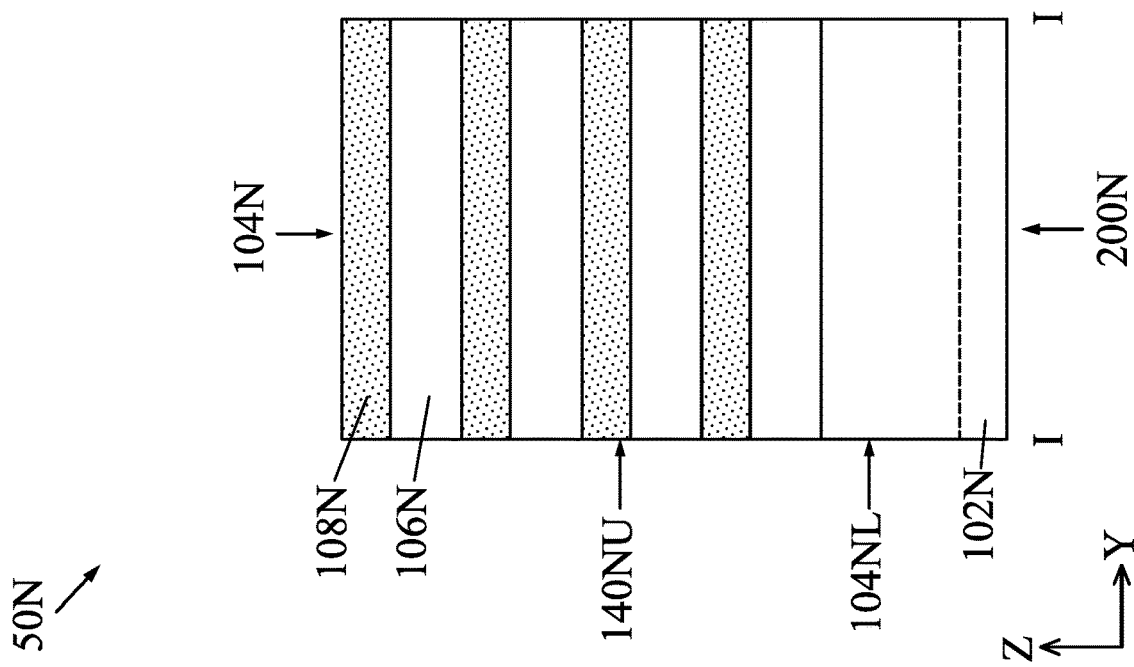
Figures 2, 2A:
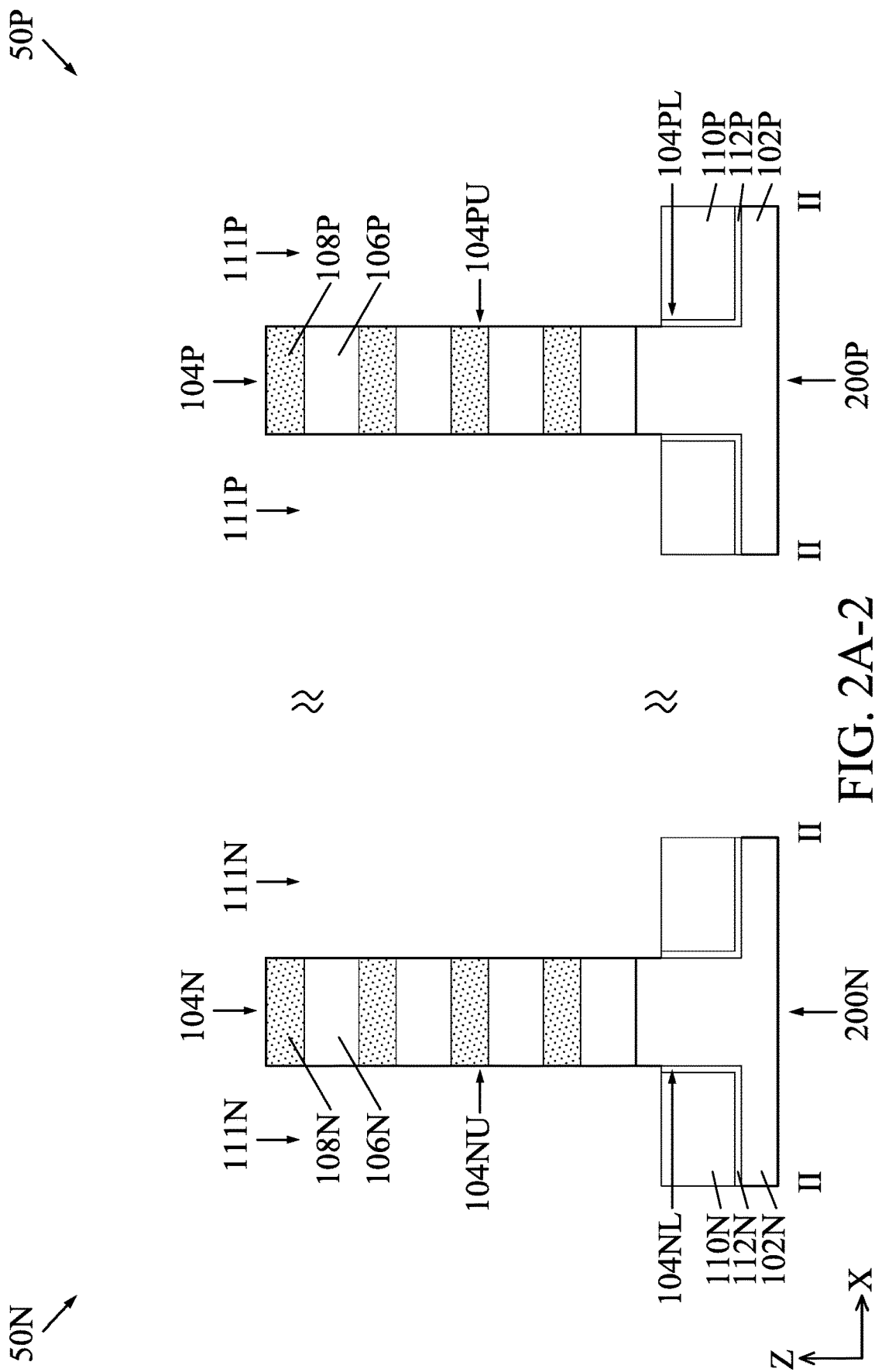
Figures 1, 2B:
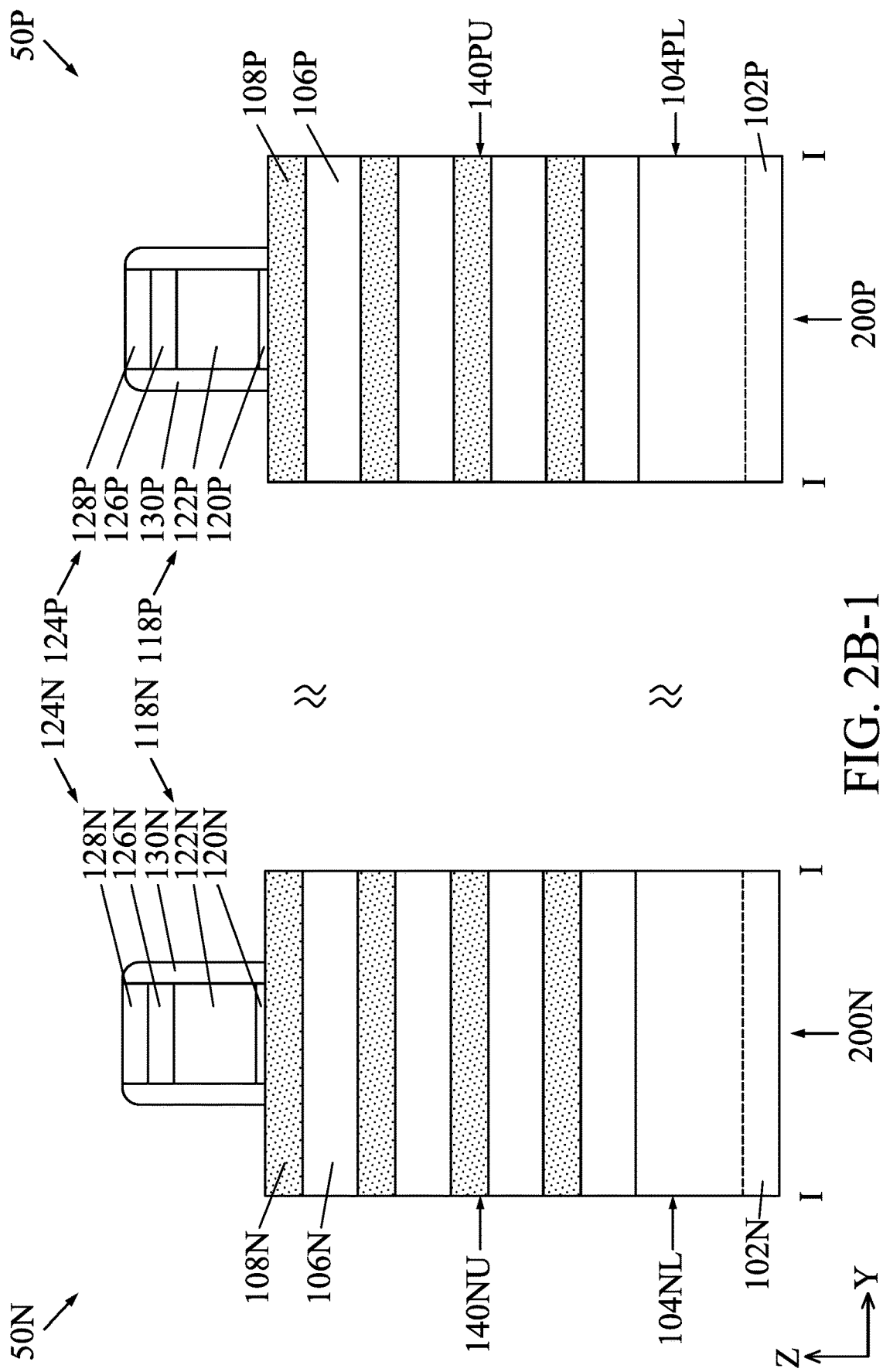
Figures 2, 2B:
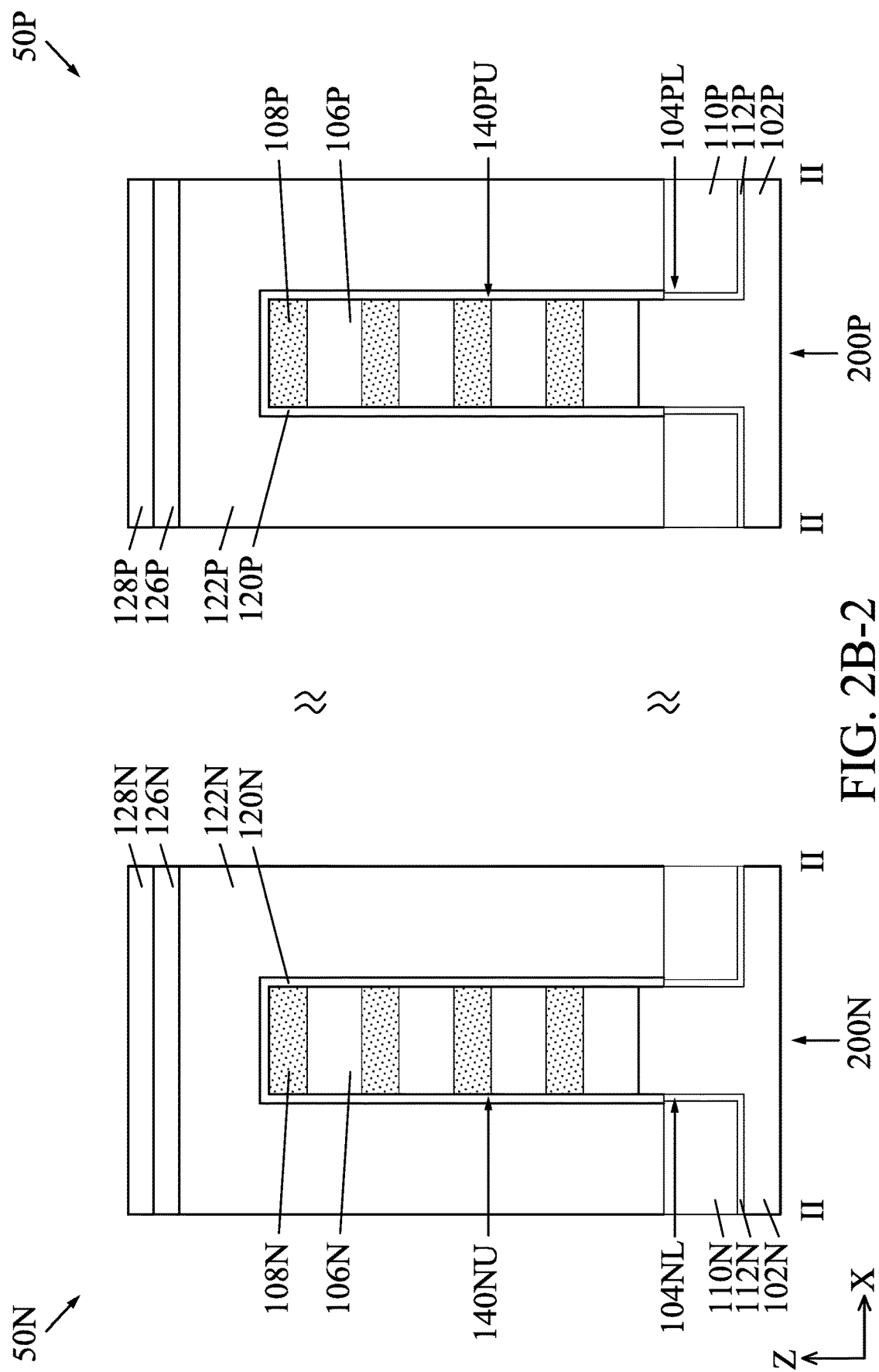
Figures 1, 2C:
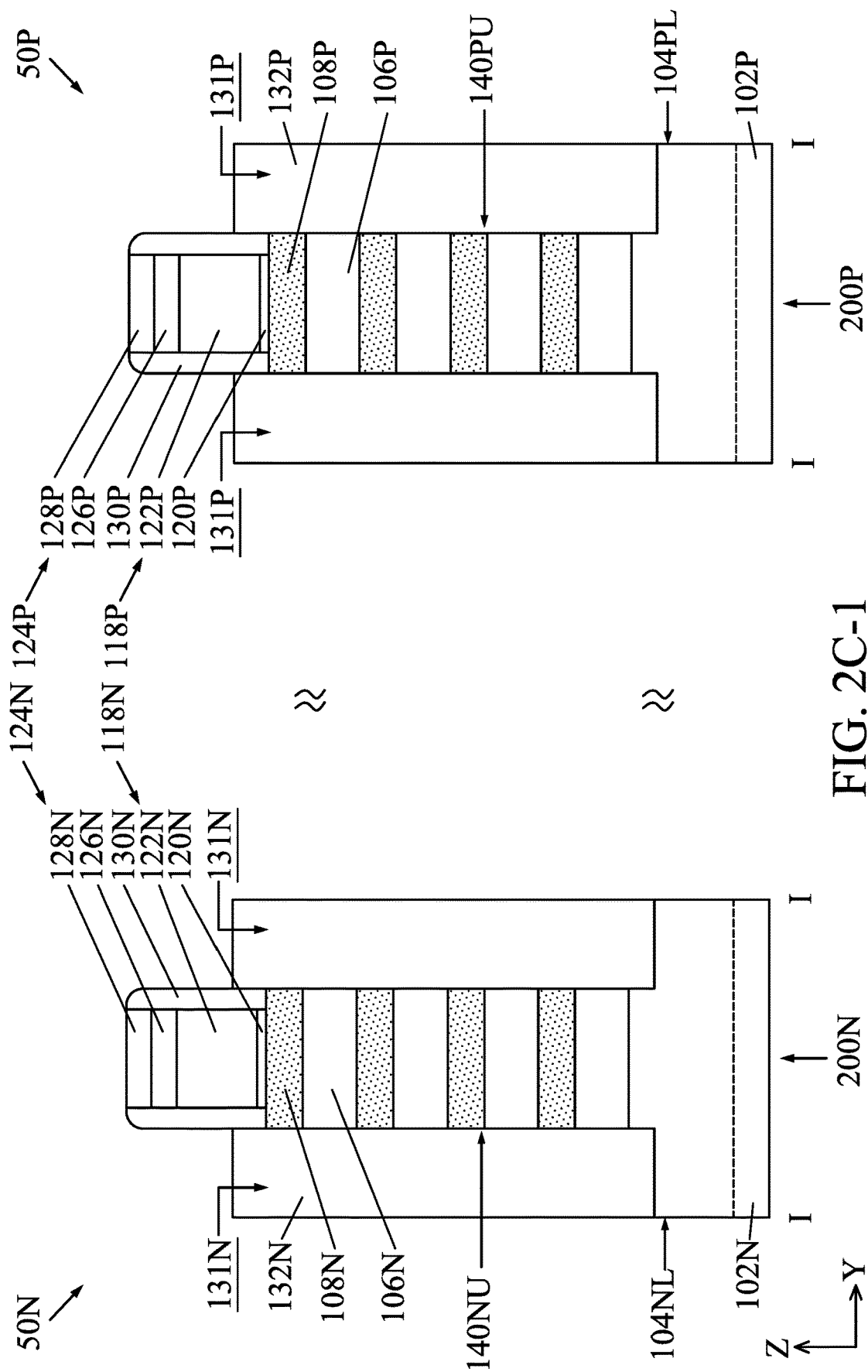
Figures 2, 2C:
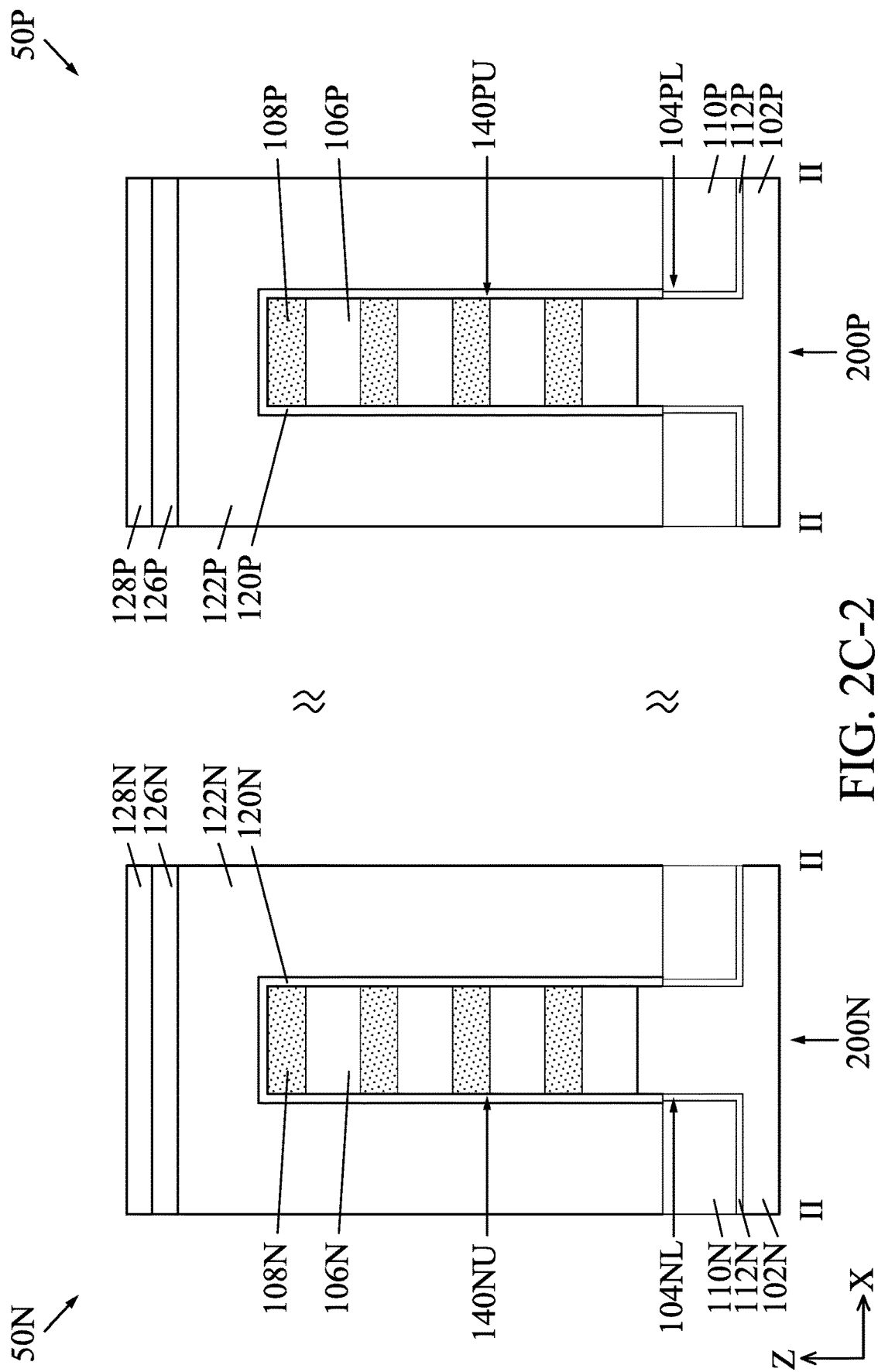
Figures 1, 2D:
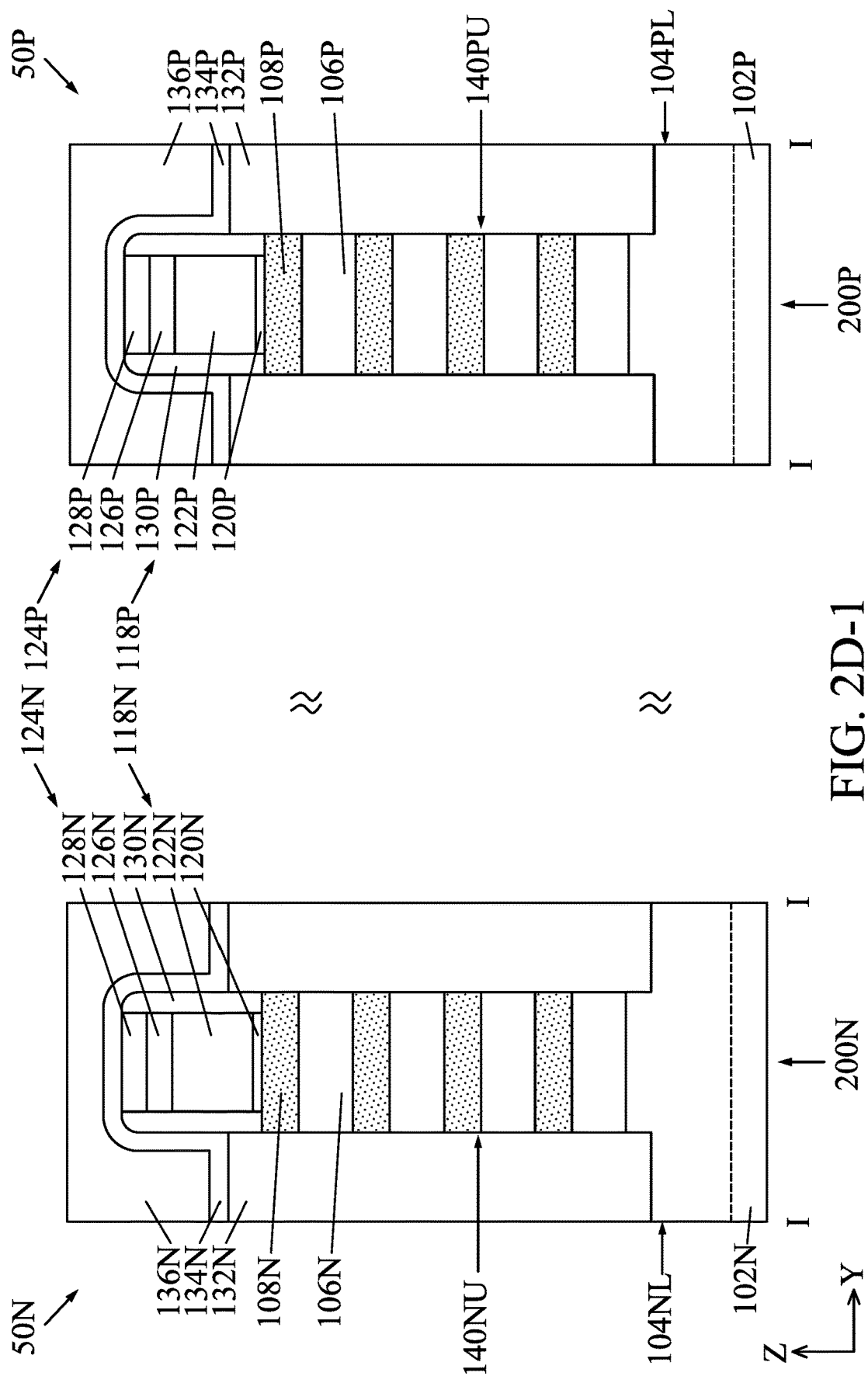
Figures 2, 2D:
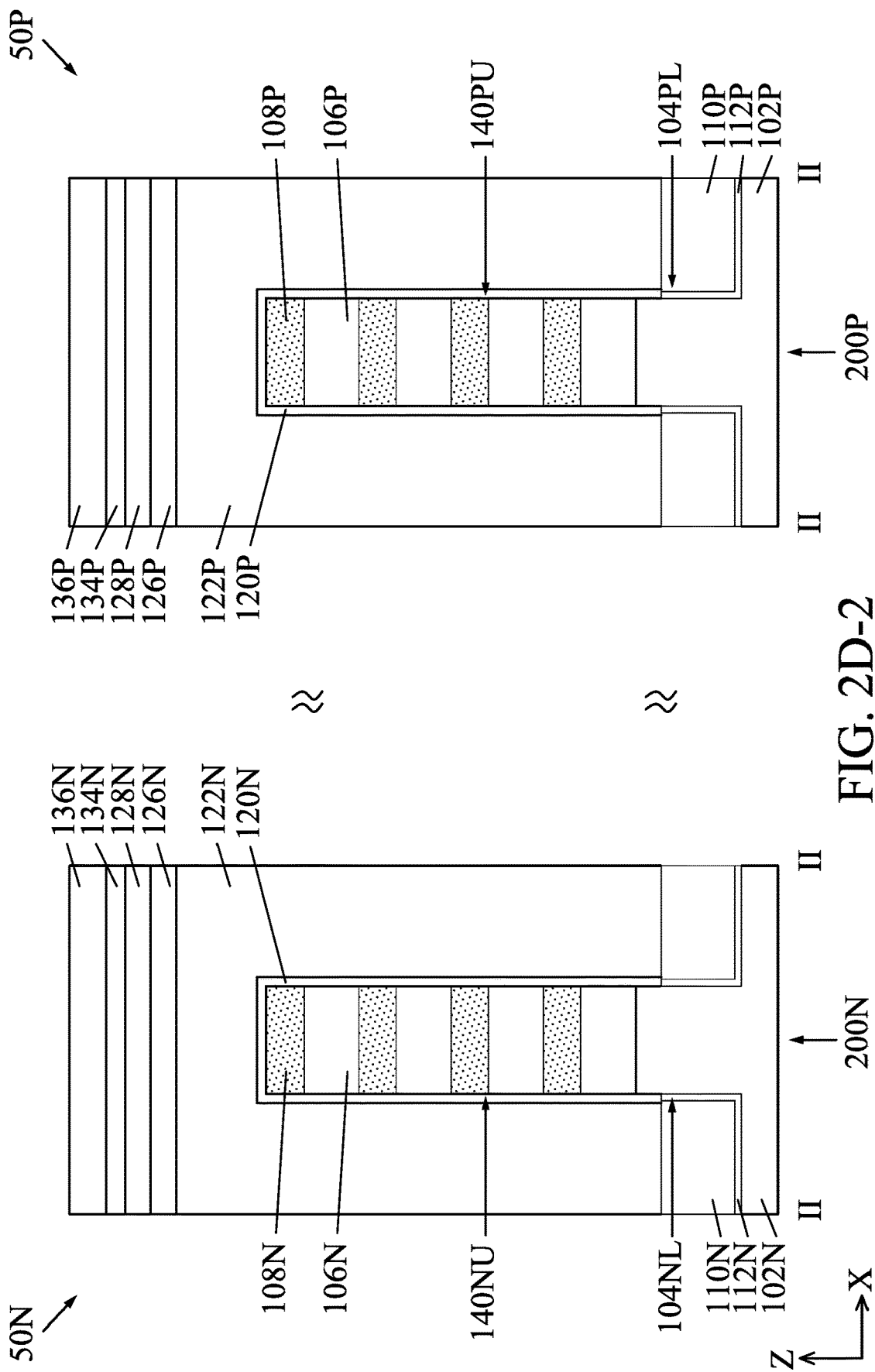
Figure 2E:
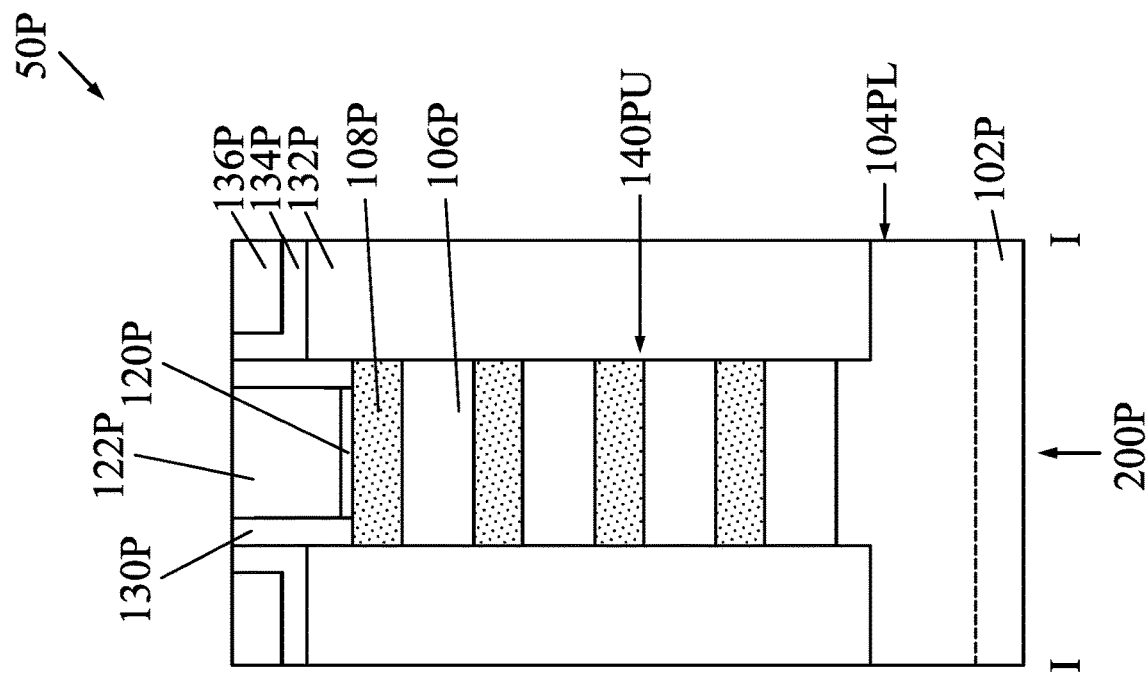
Figure 1:
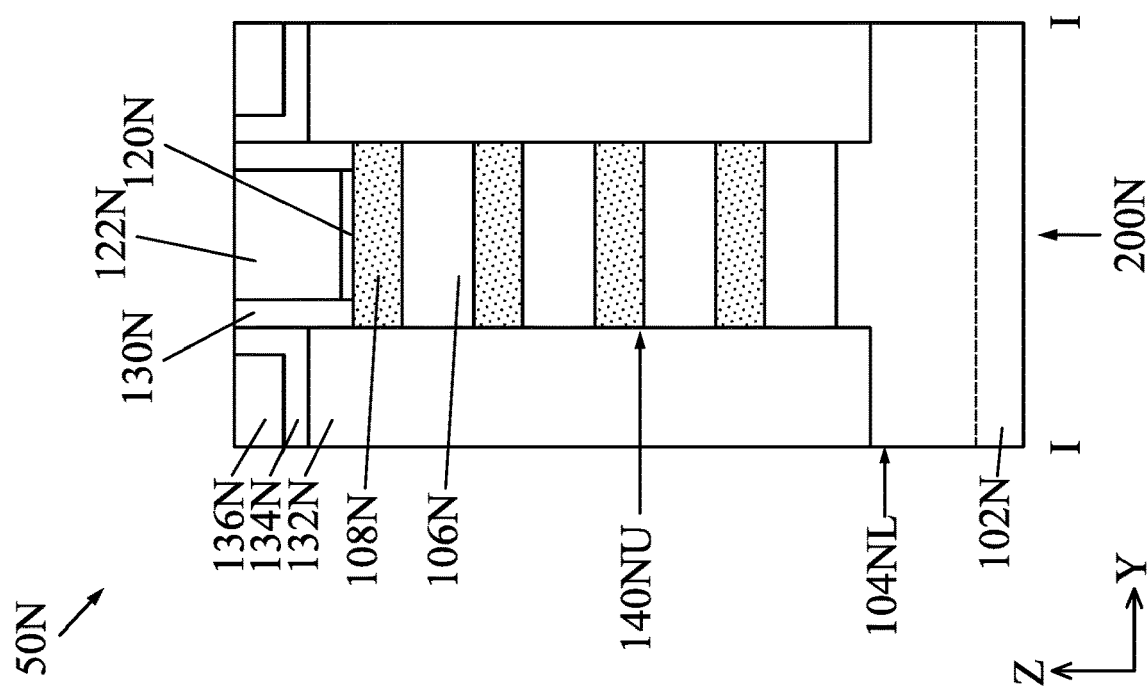
Figures 2, 2E:
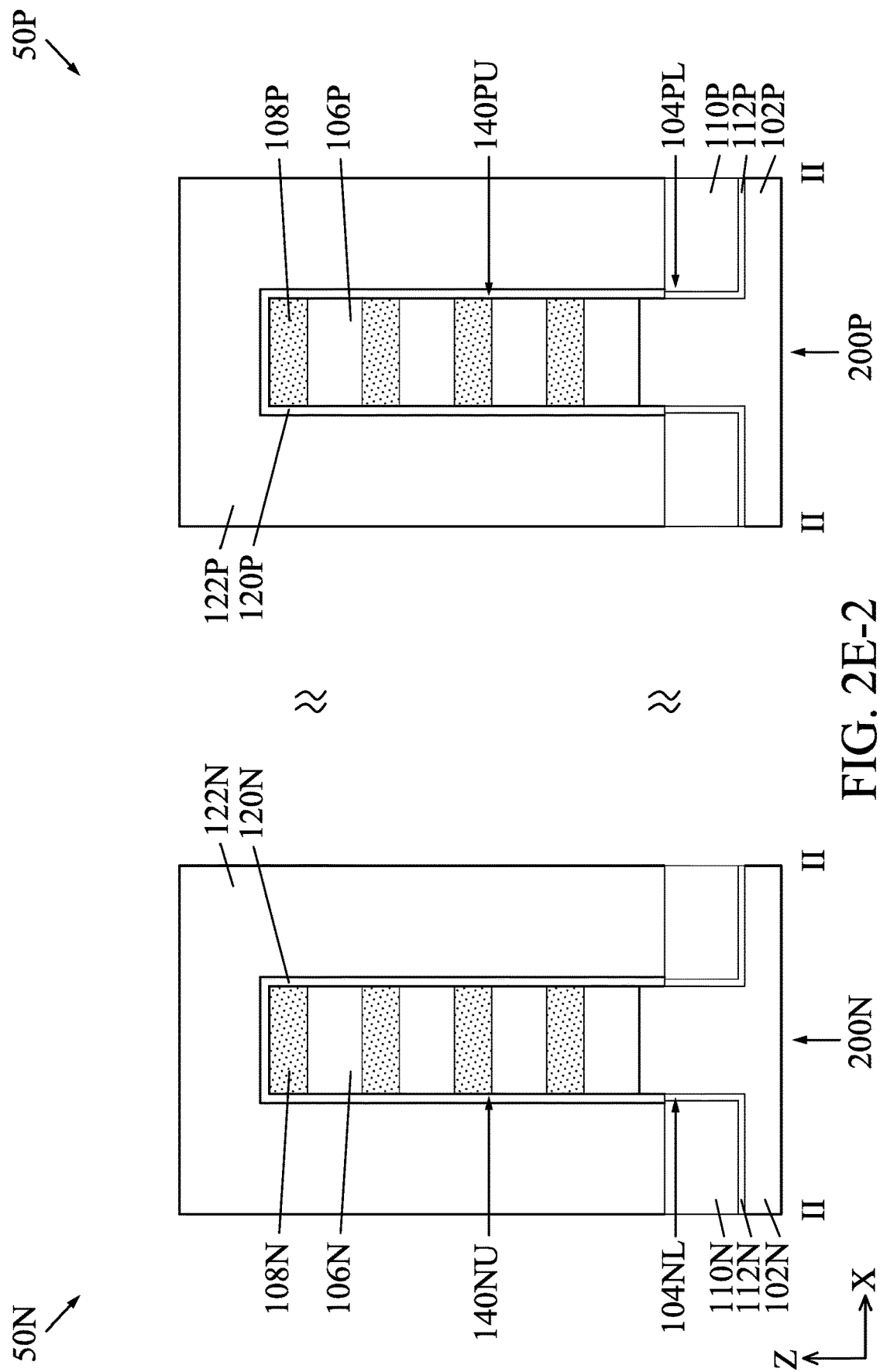
Figures 1, 2F:
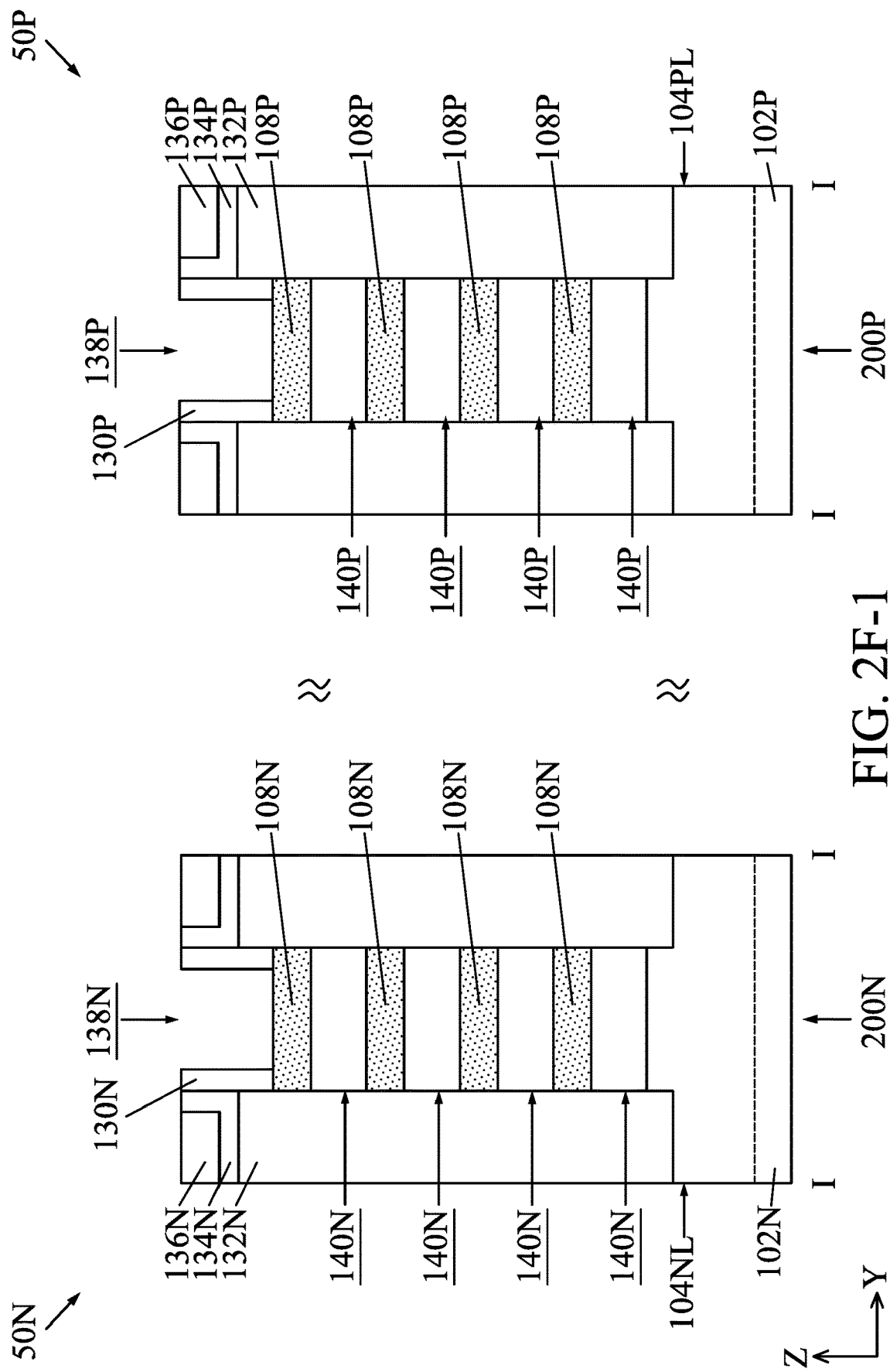
Figures 2, 2F:
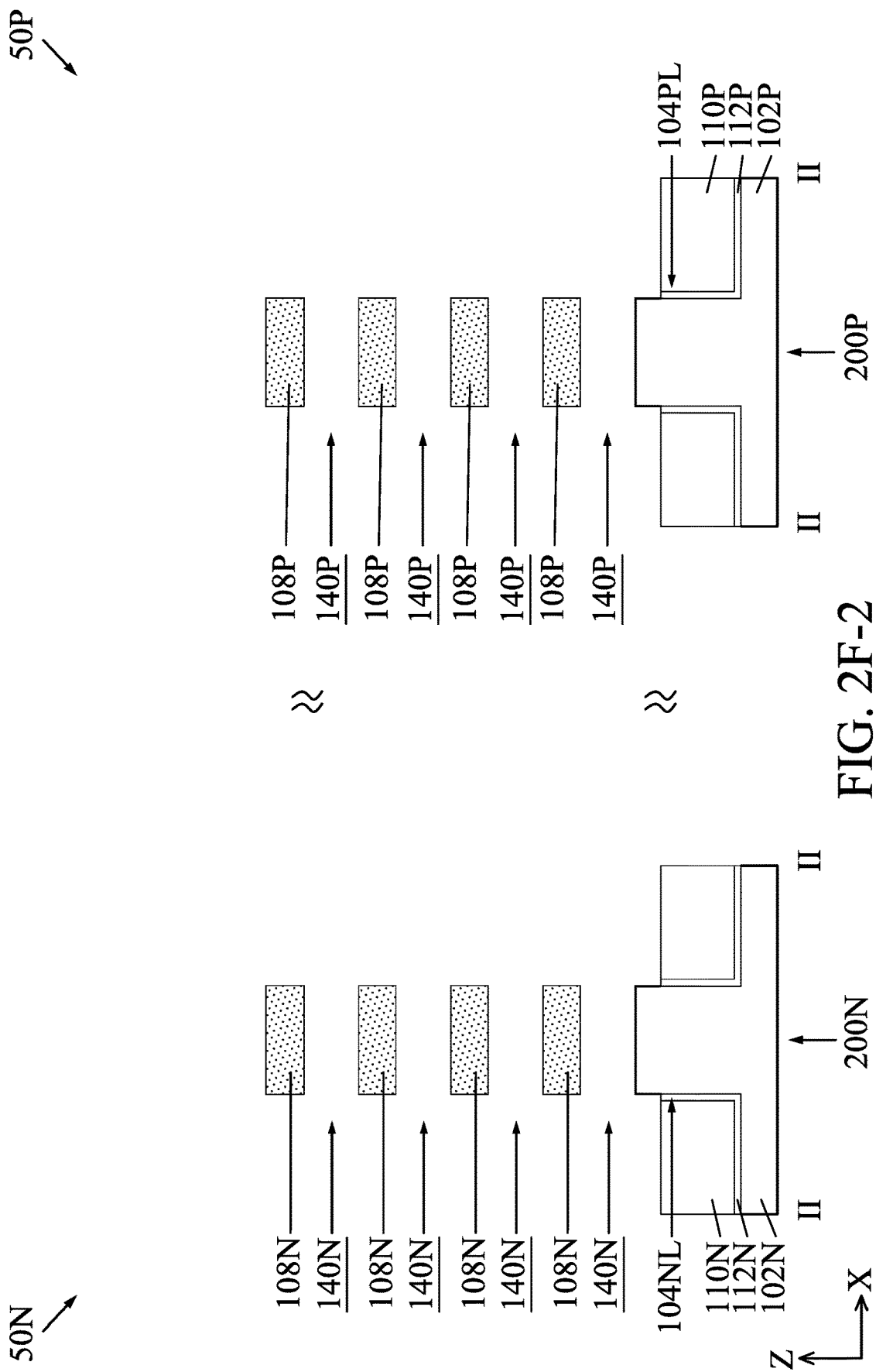
Figures 1, 2G:
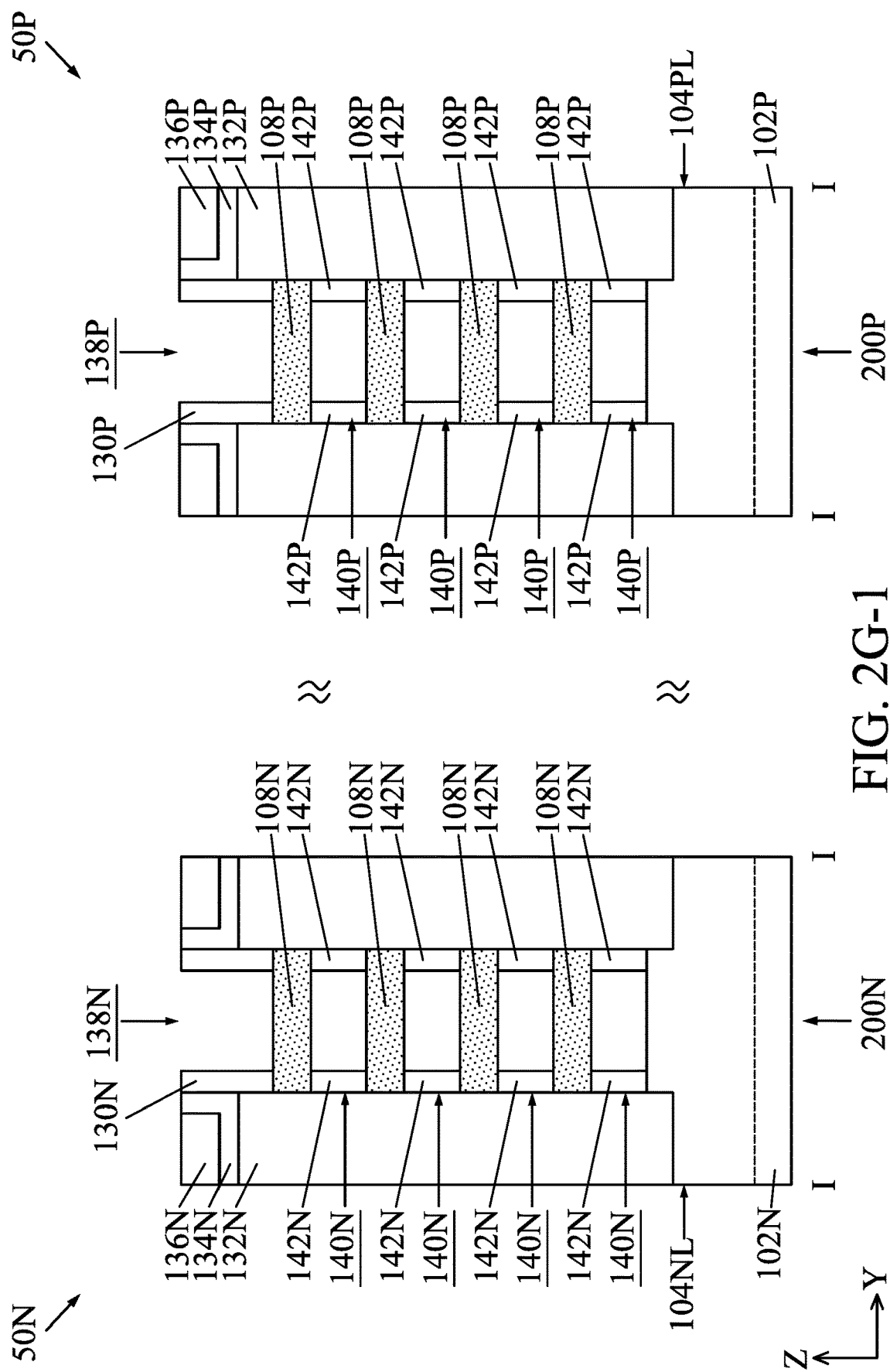
Figures 2, 2G:
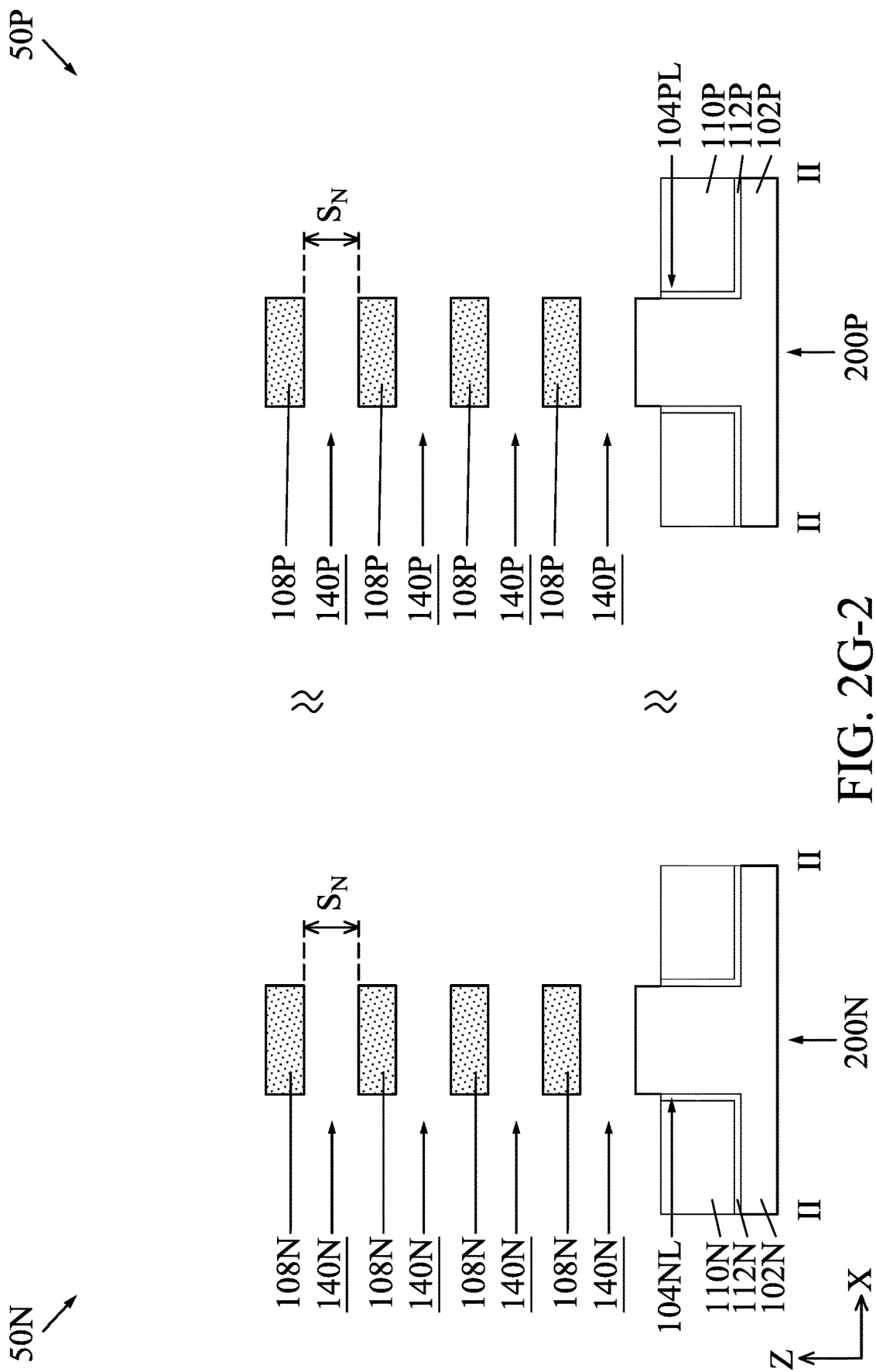
Figures 1, 2H:
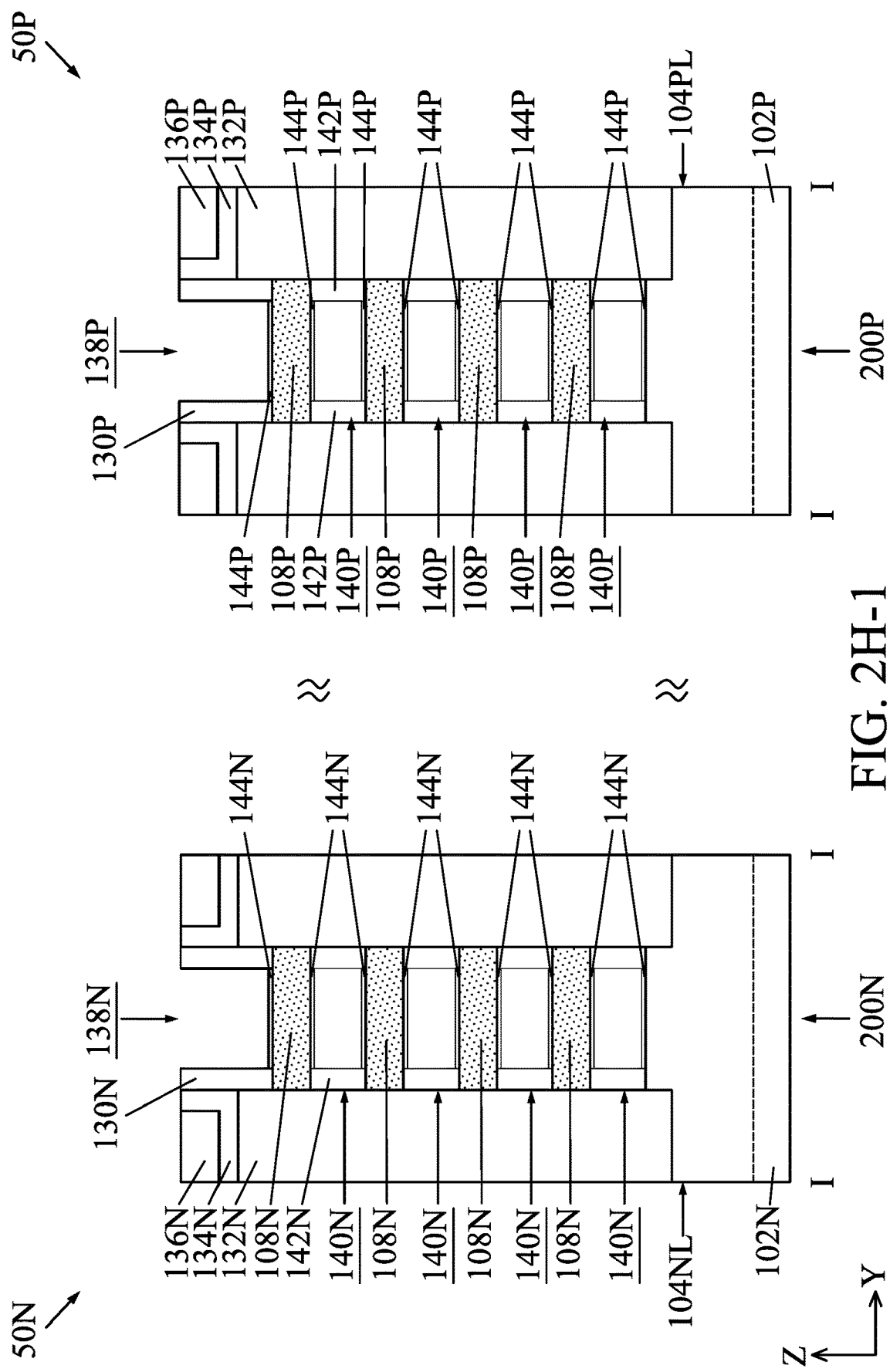
Figures 2, 2H:
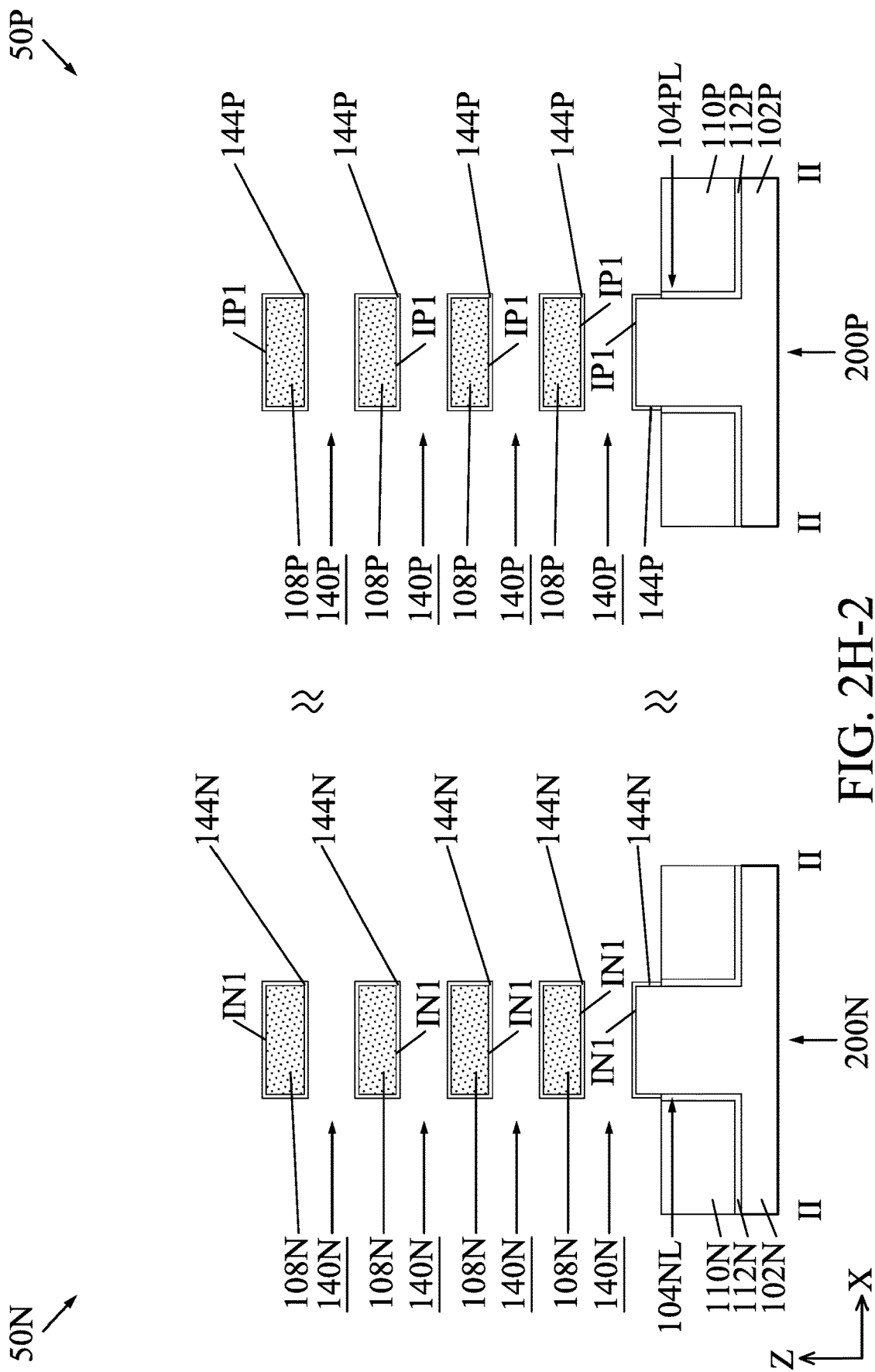
Figures 1, 2I:
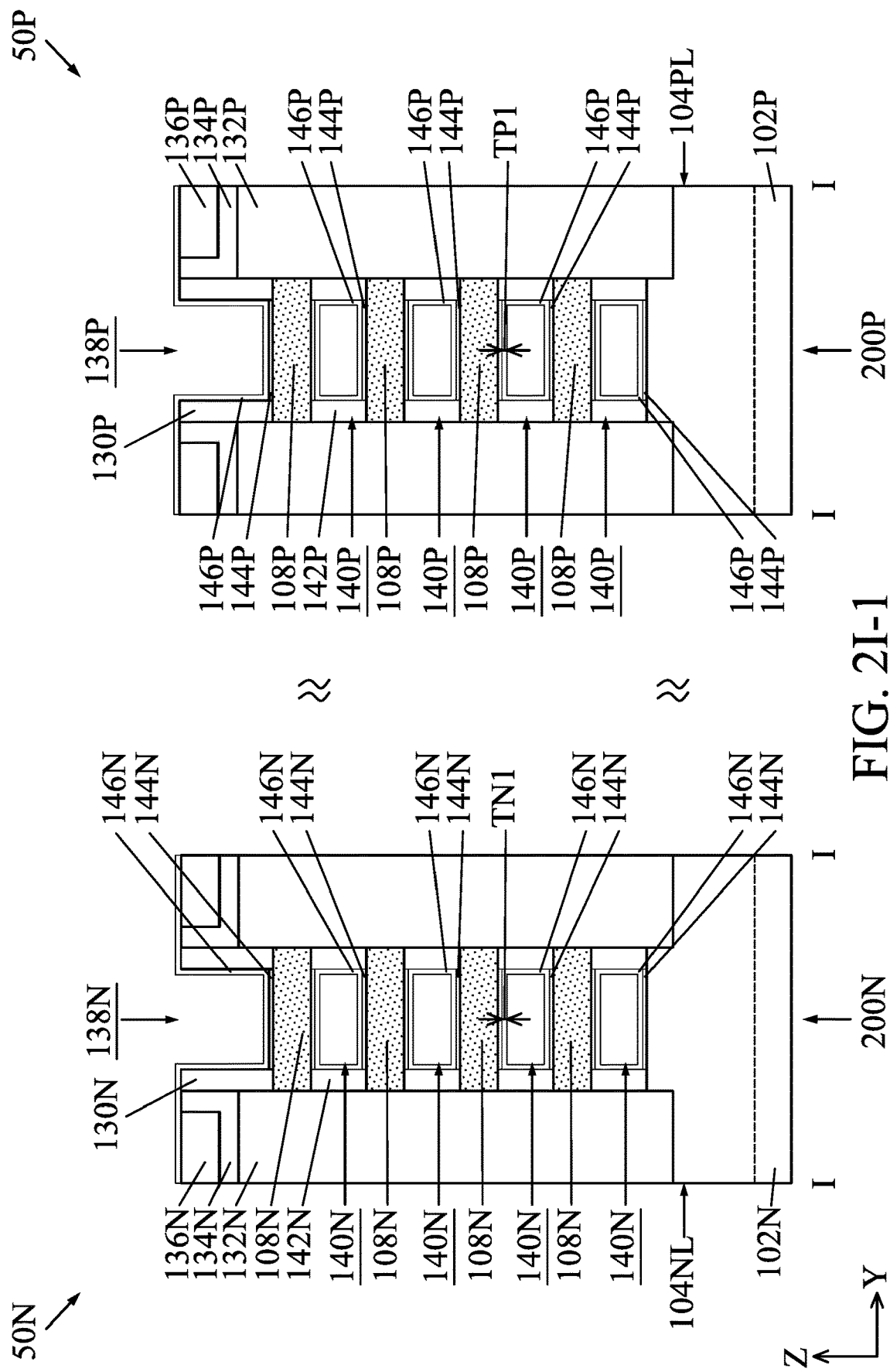
Figures 2, 2I:
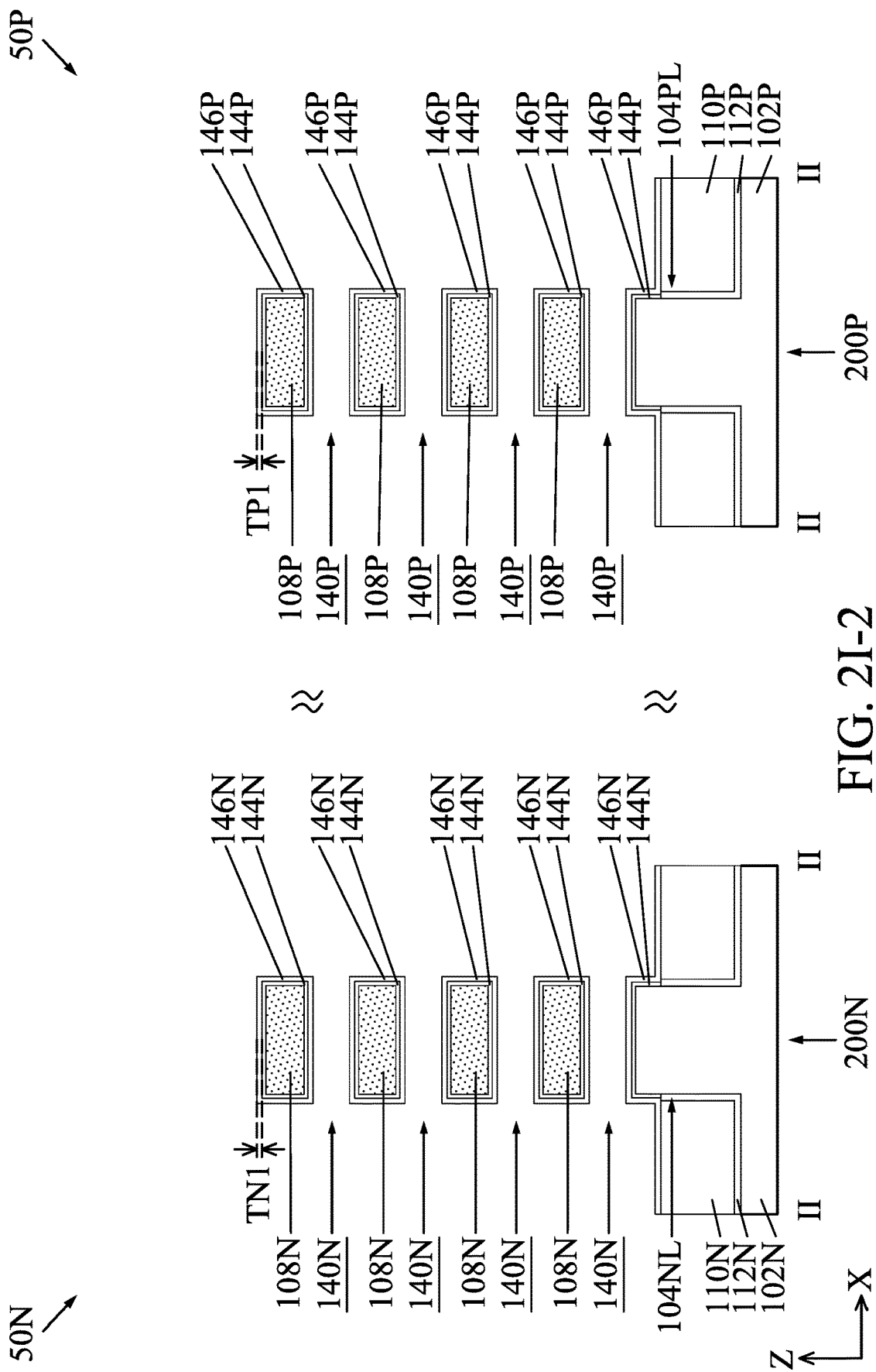
Figures 1, 2J:
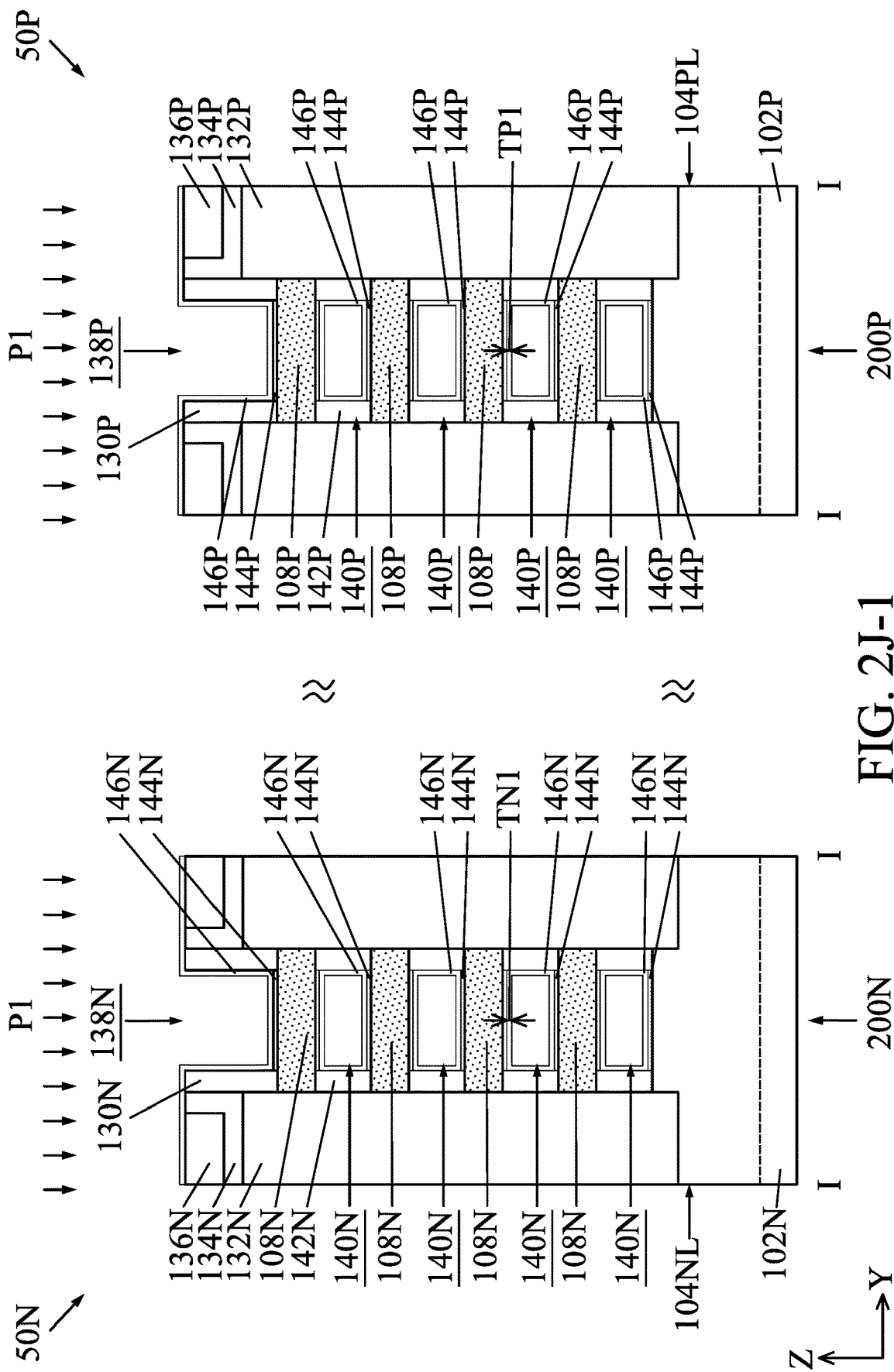
Figures 2, 2J:
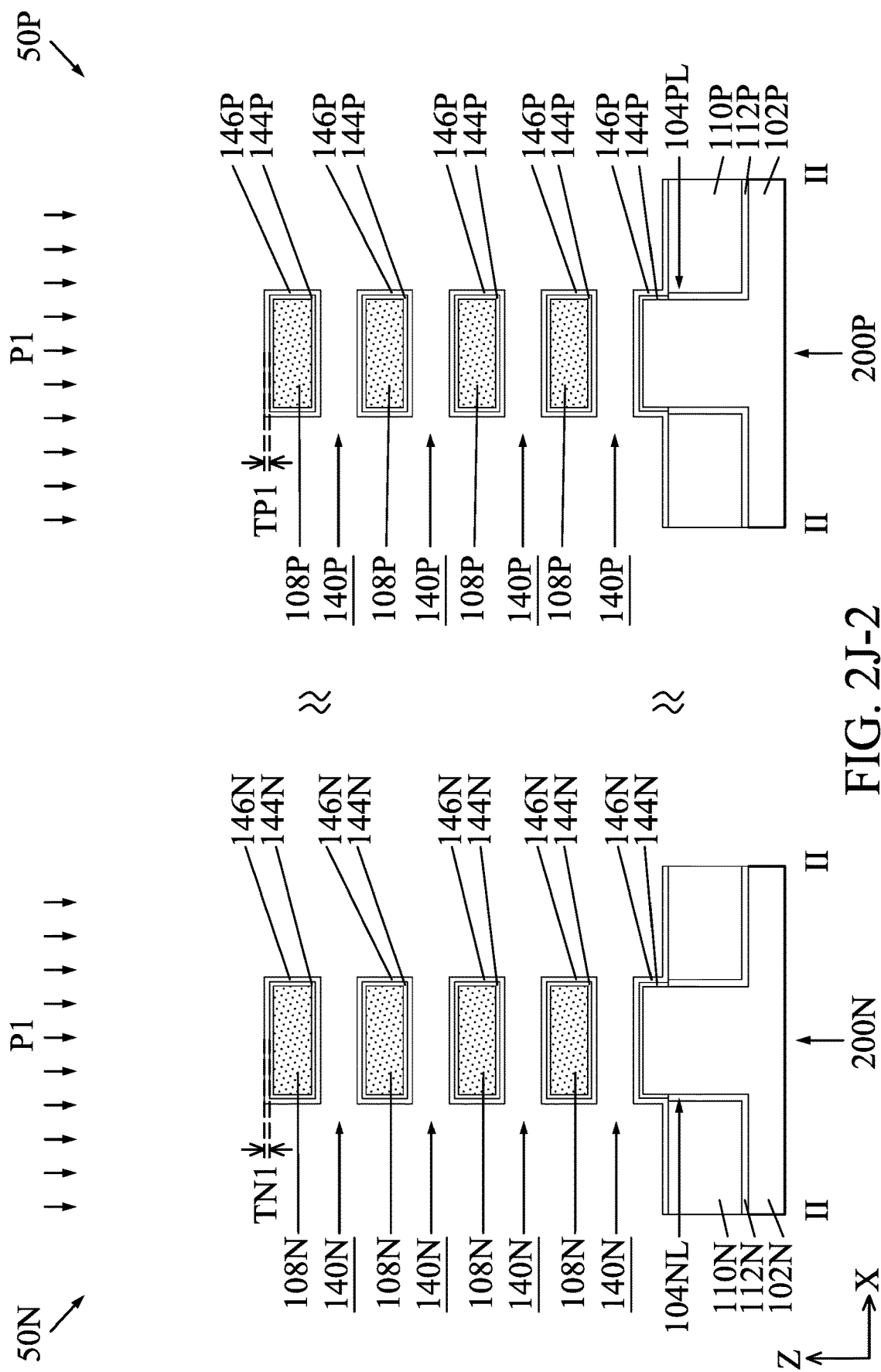
Figures 1, 2K:
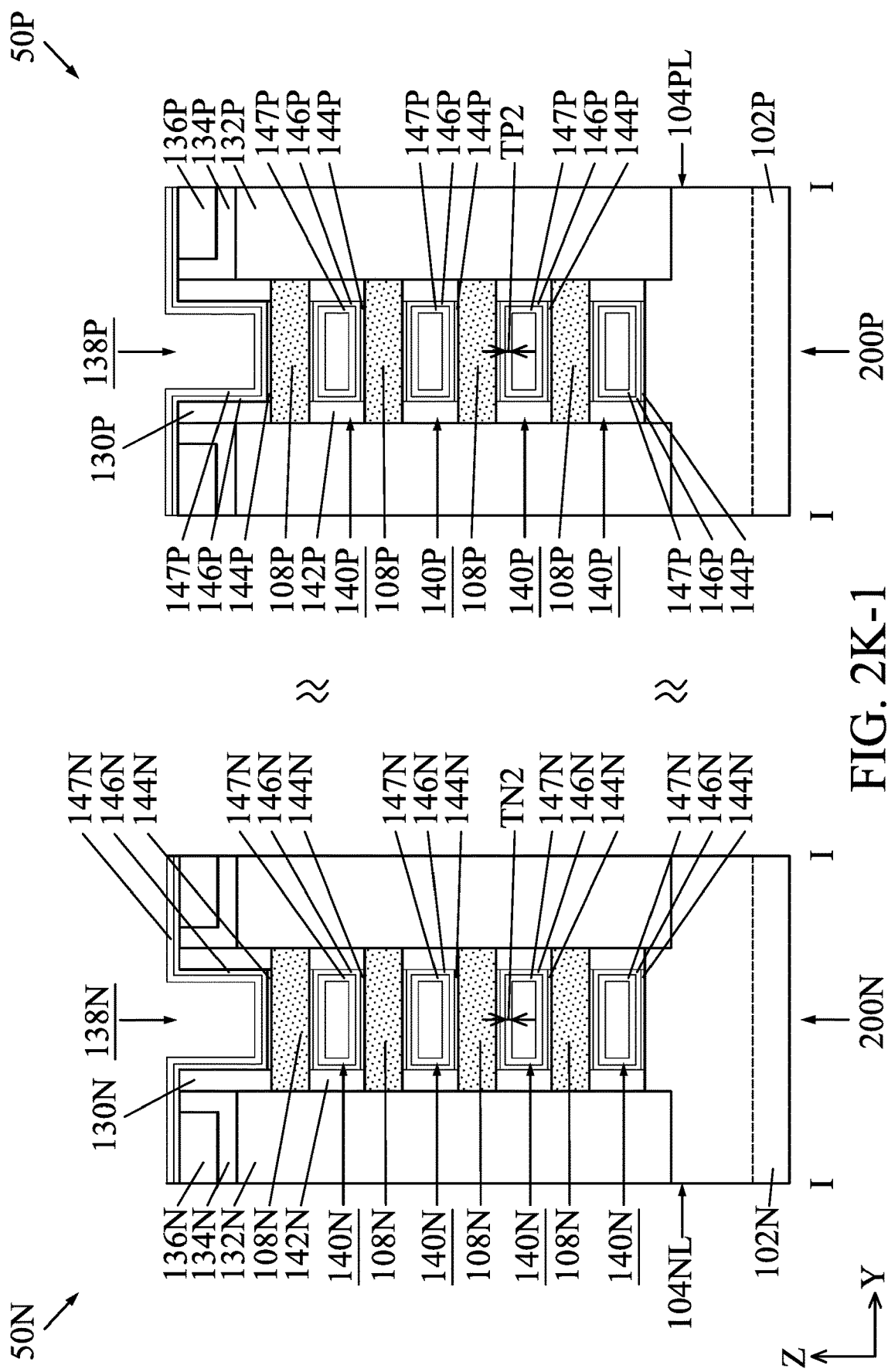
Figures 2, 2K:
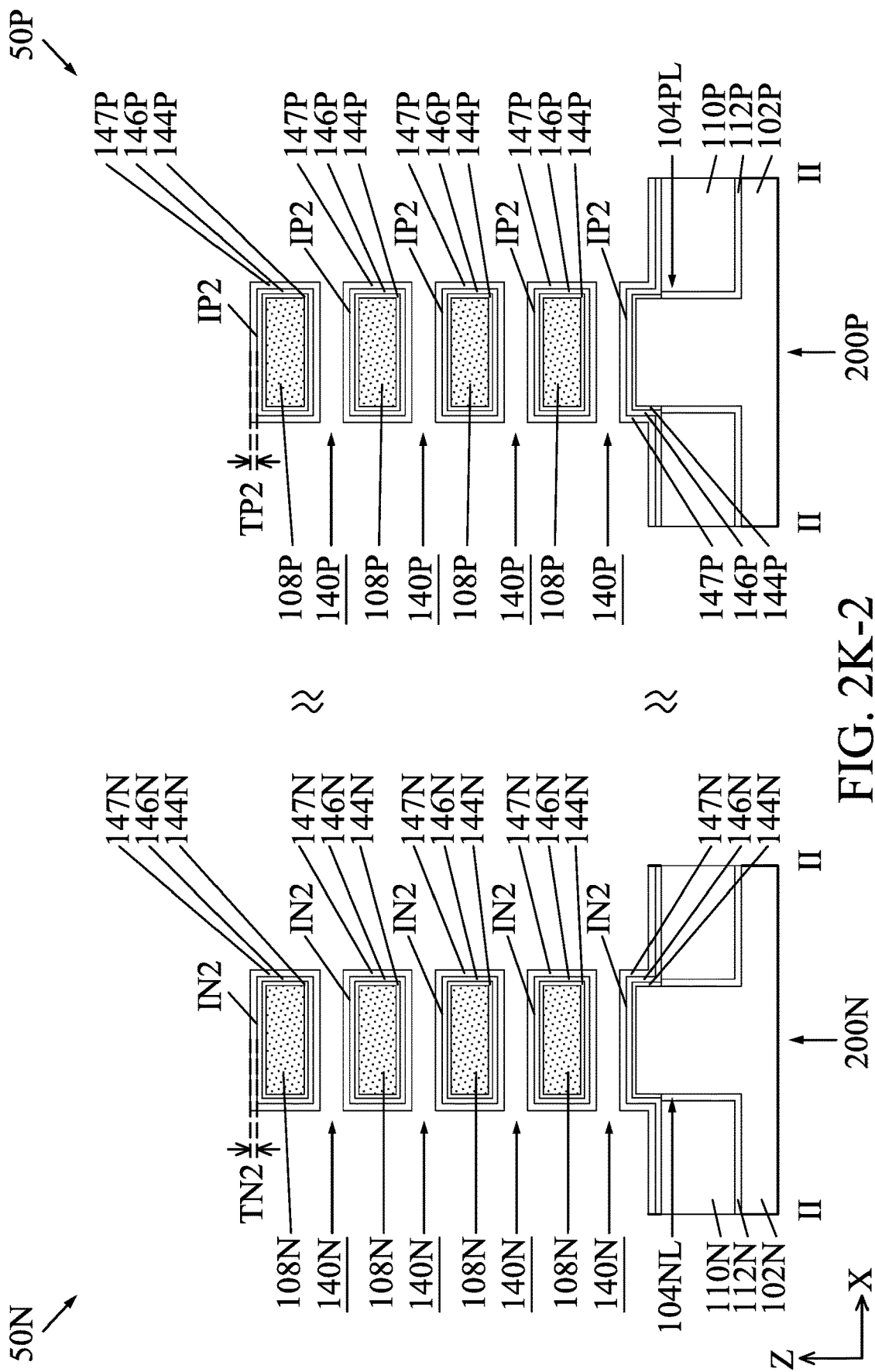
Figures 1, 2L:
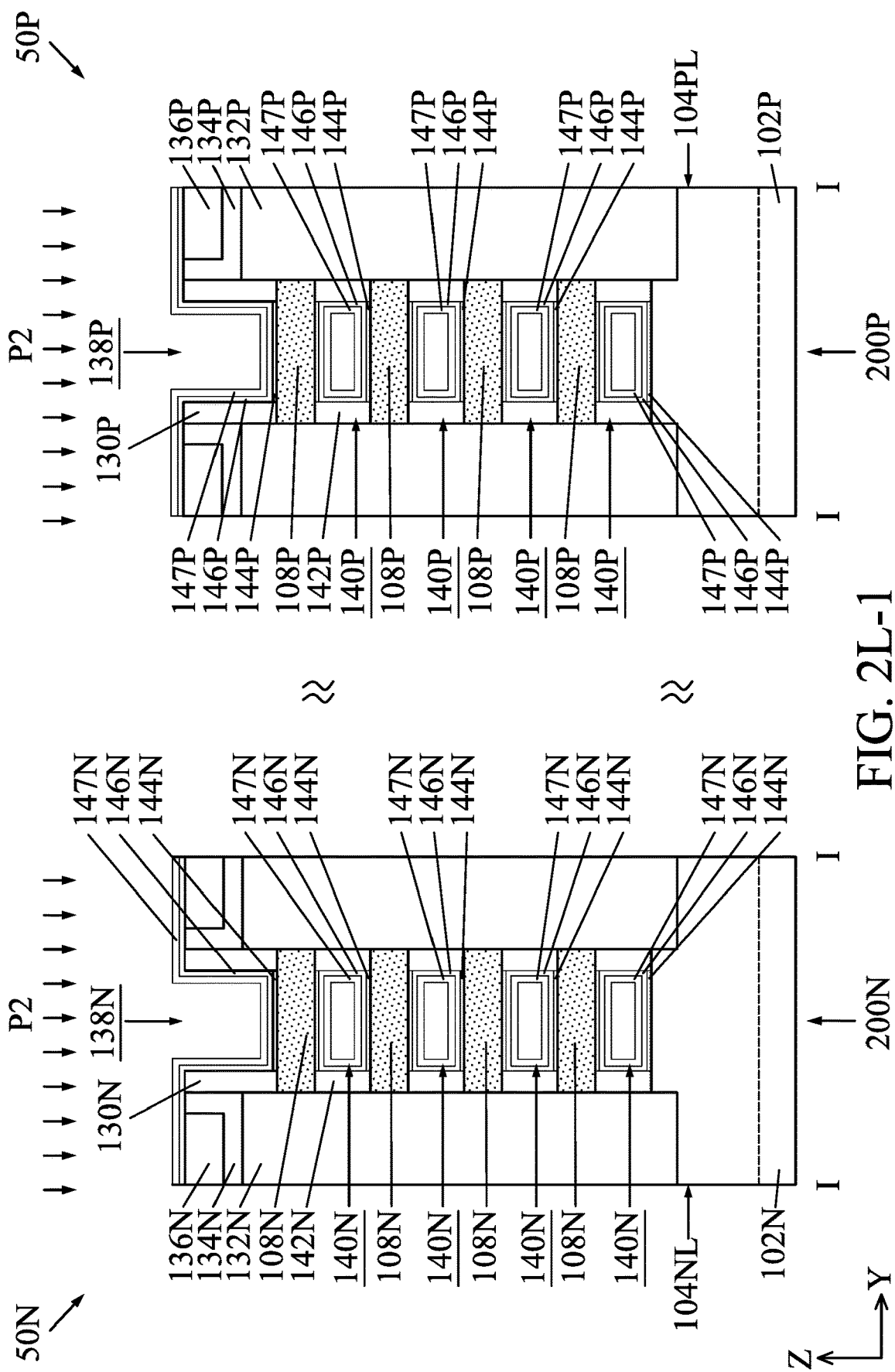
Figures 2, 2L:
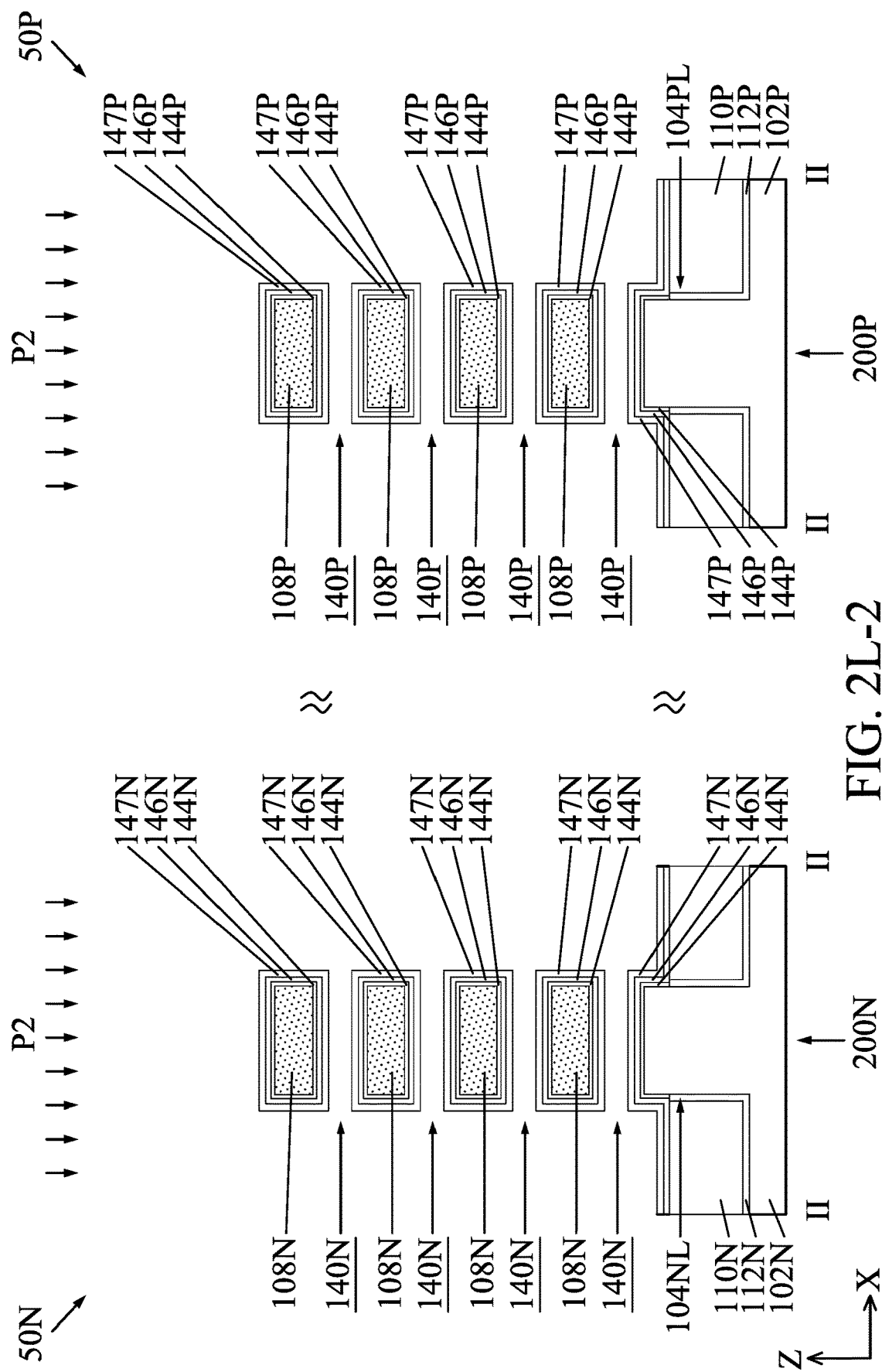
Figures 1, 2M:
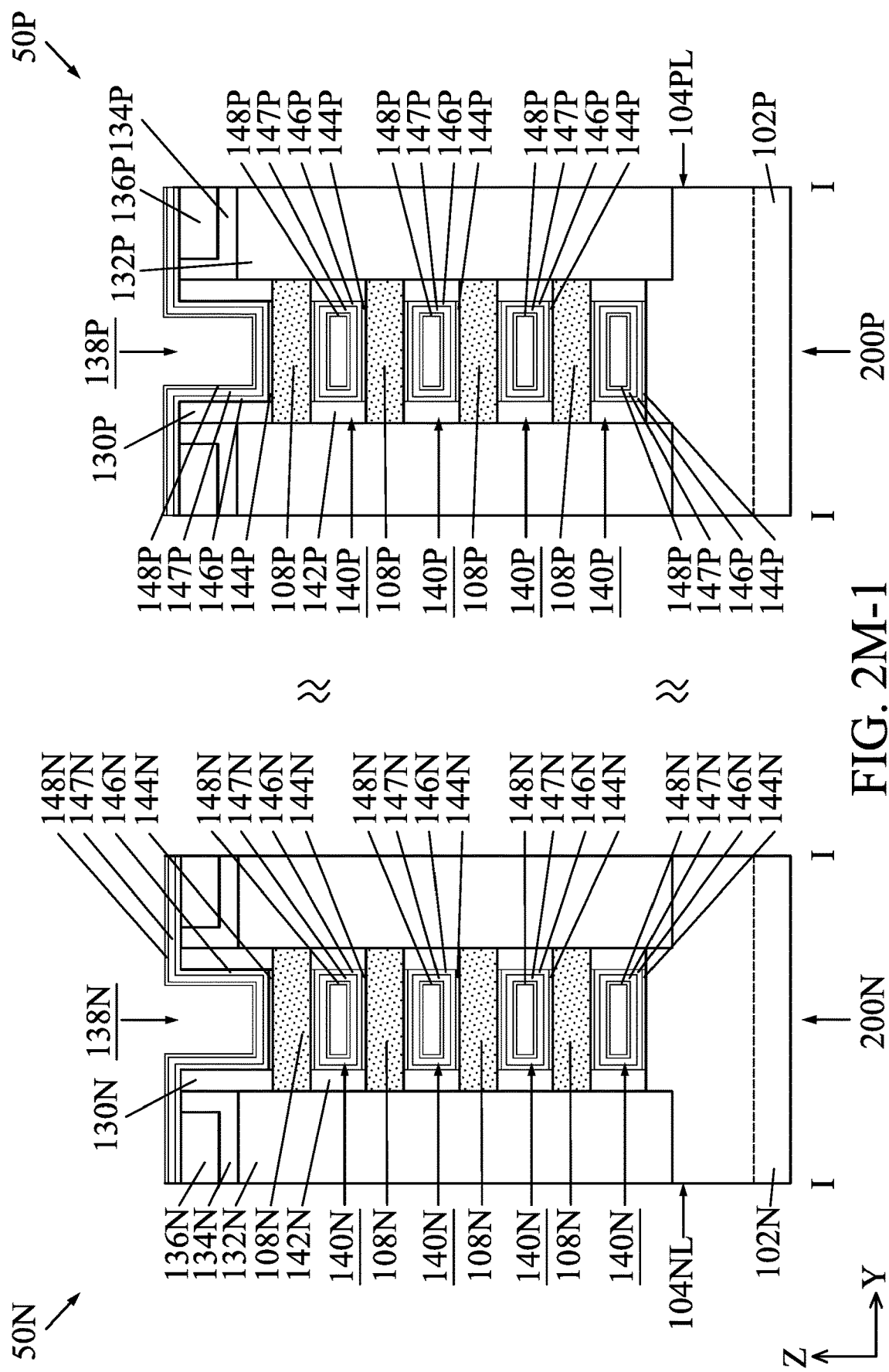
Figures 2, 2M:
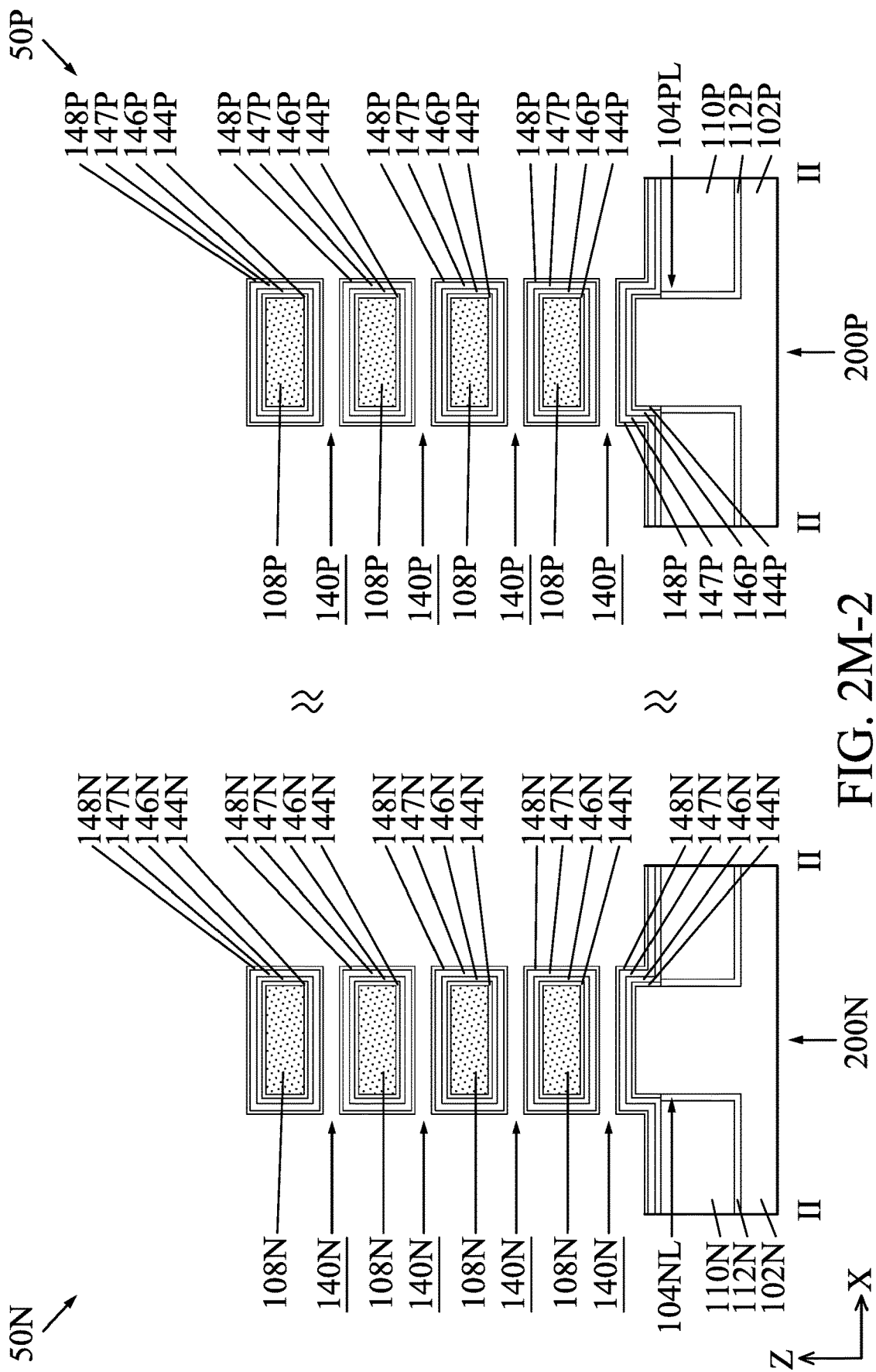
Figures 1, 2N:
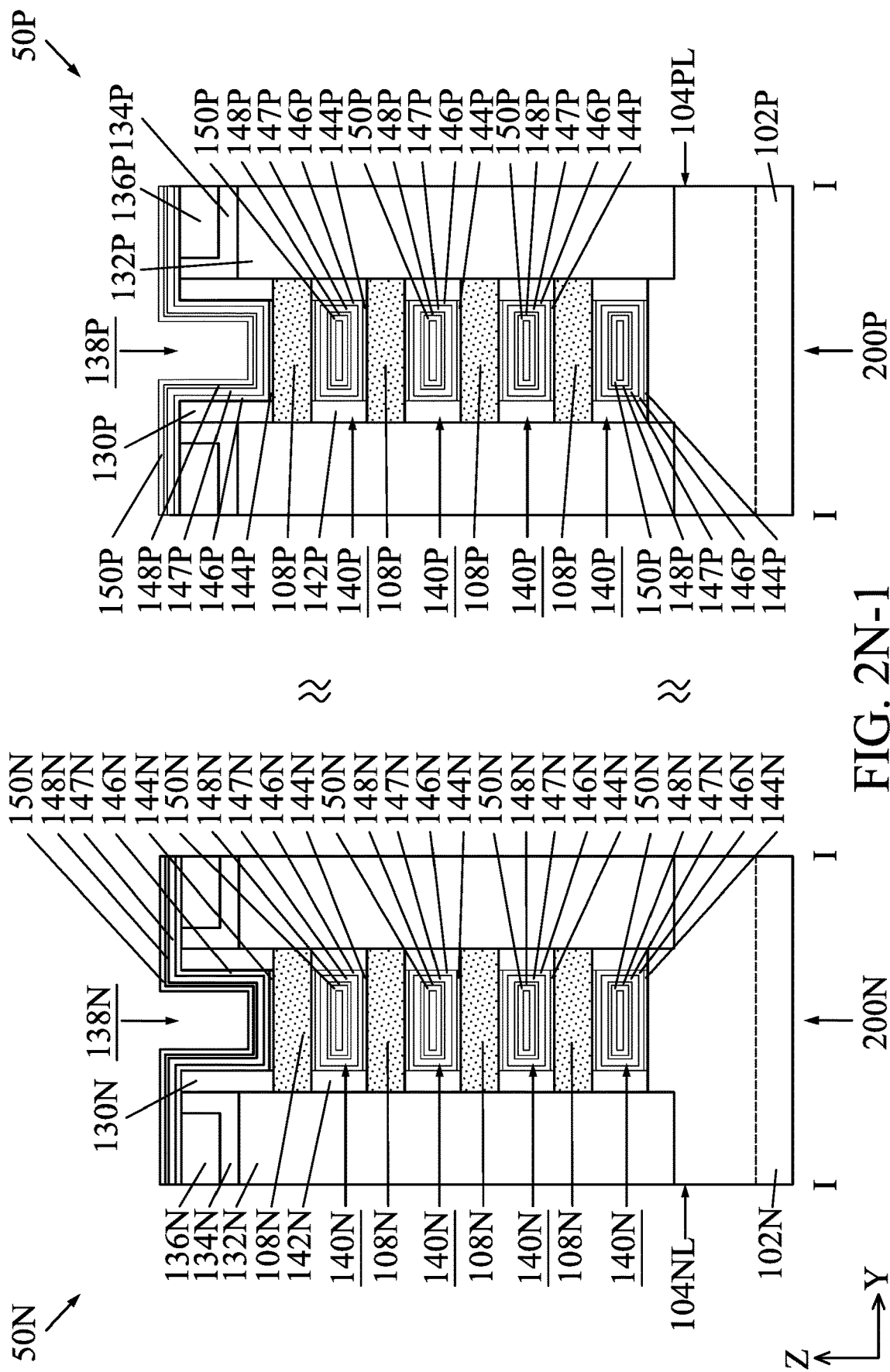
Figures 2, 2N:
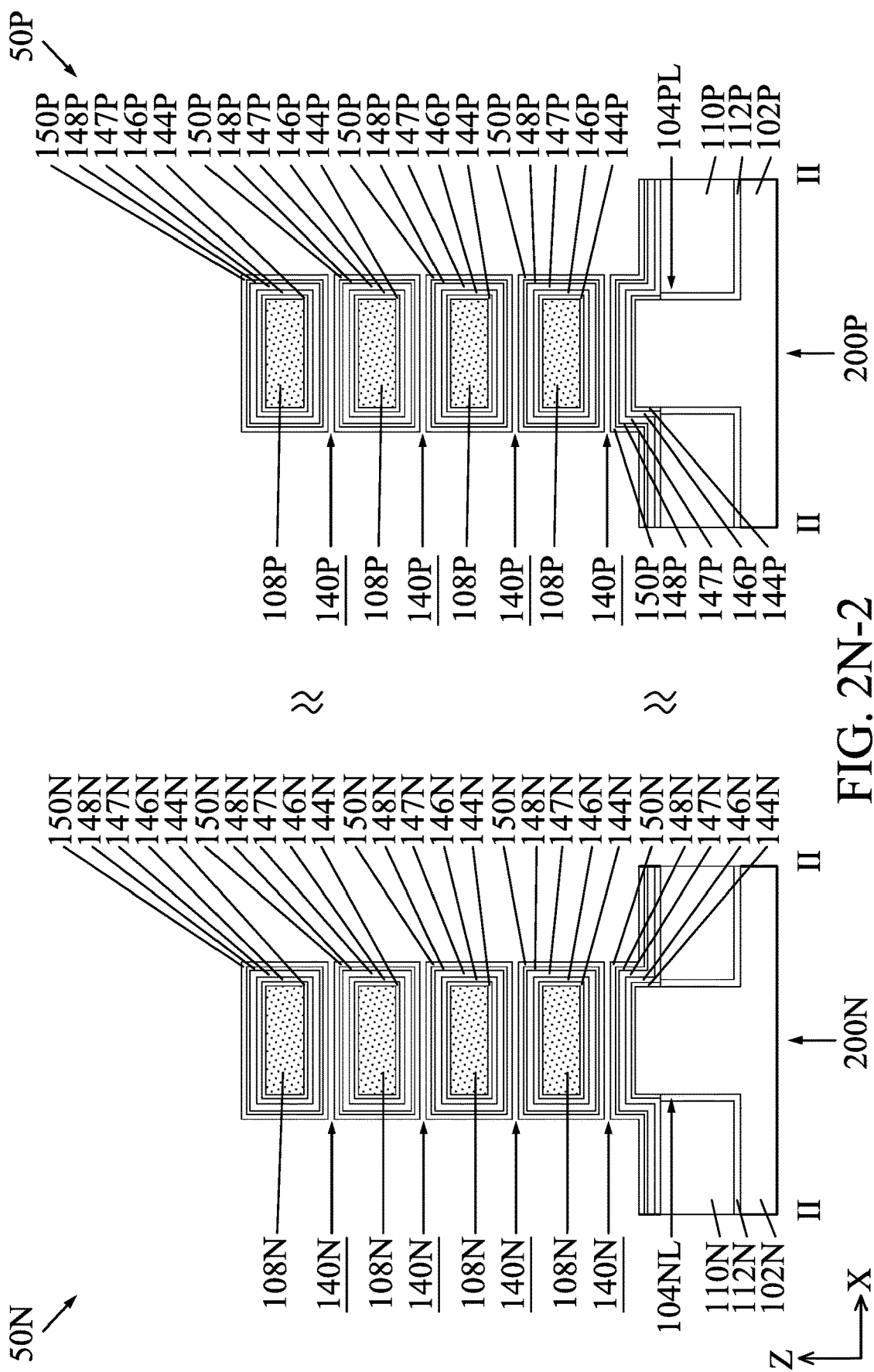
Figures 1, 2O:
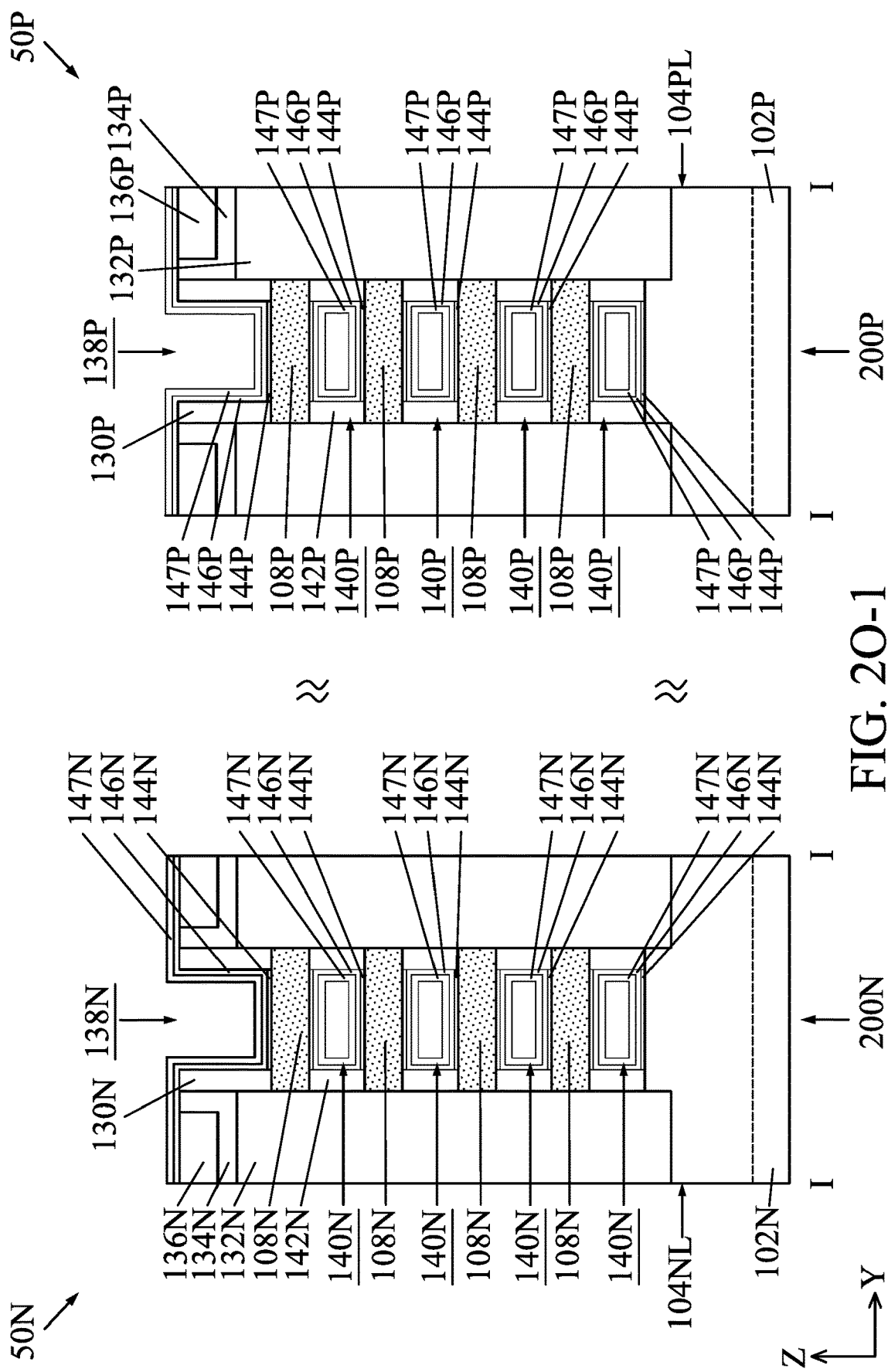
Figures 2, 2O:
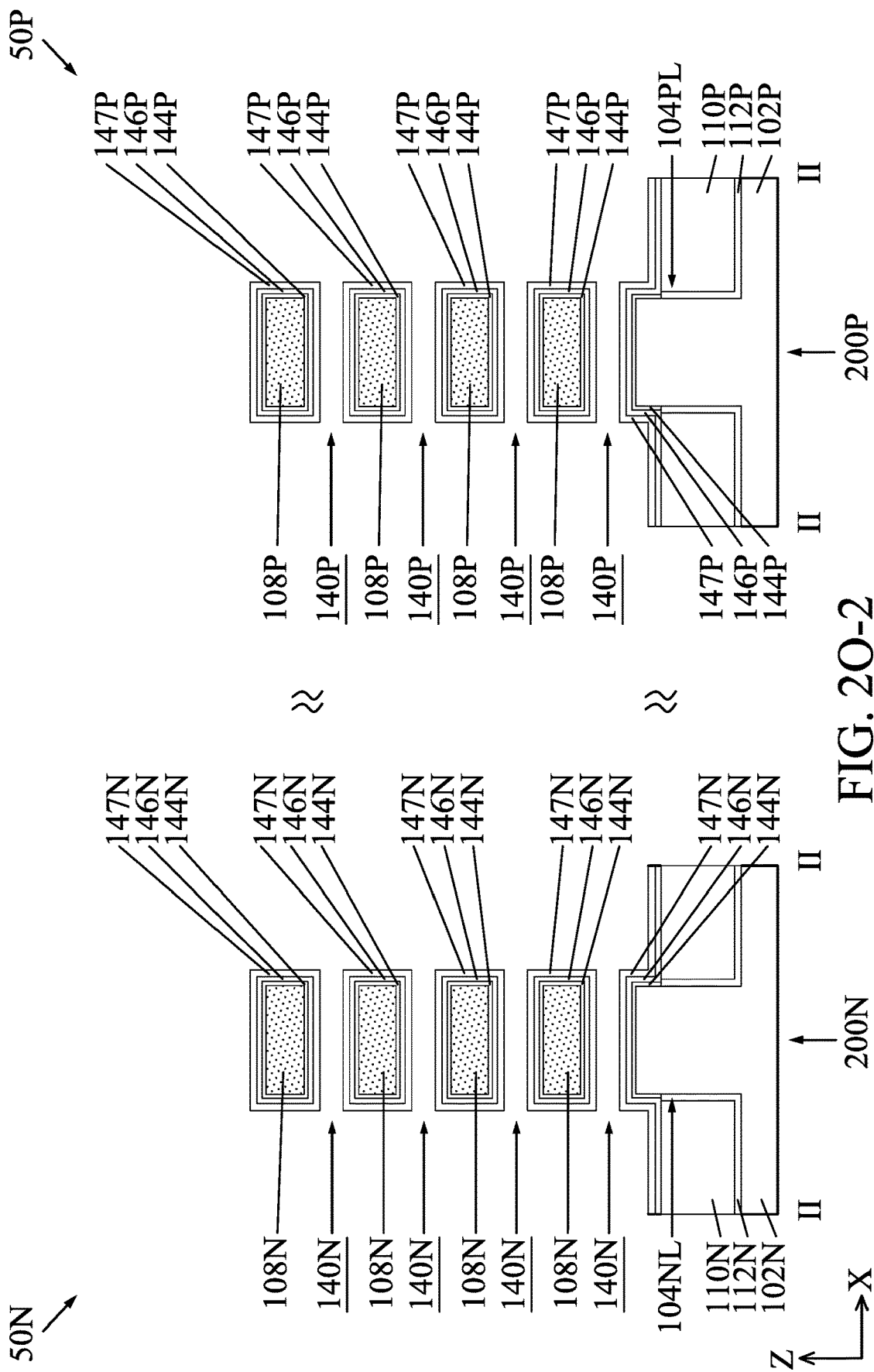
Figures 1, 2P:
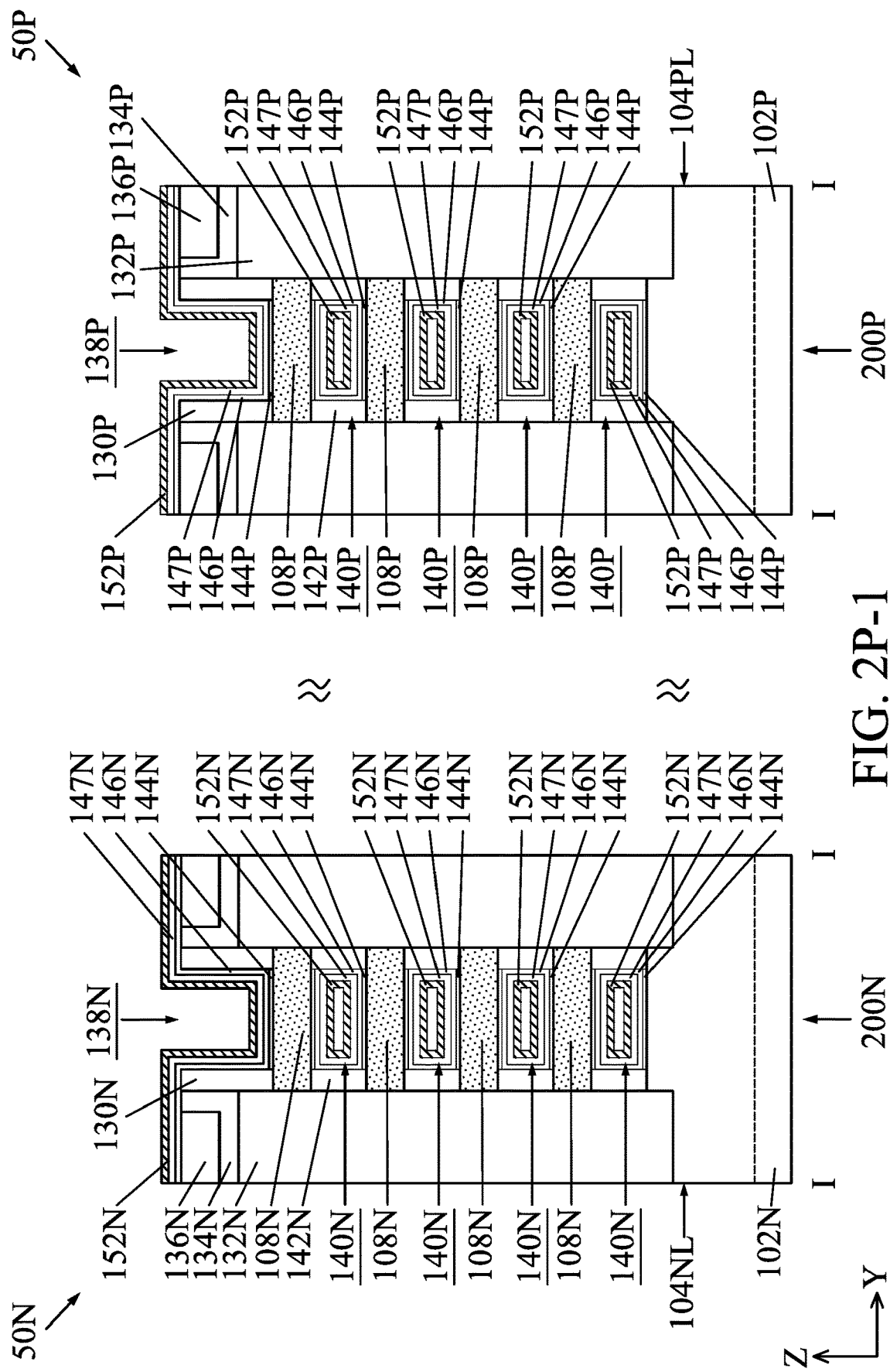
Figures 2, 2P:
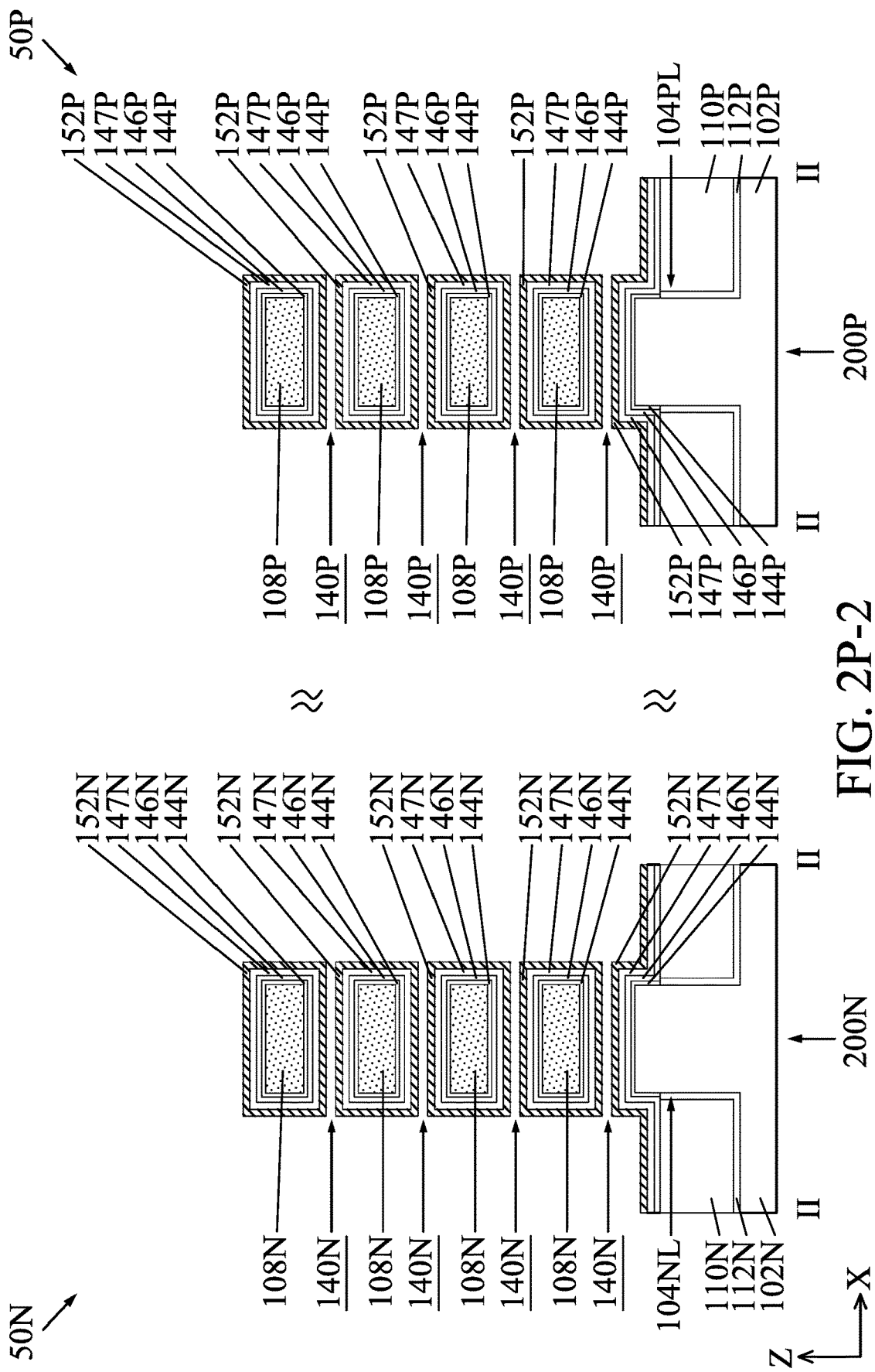
Figures 1, 2Q:
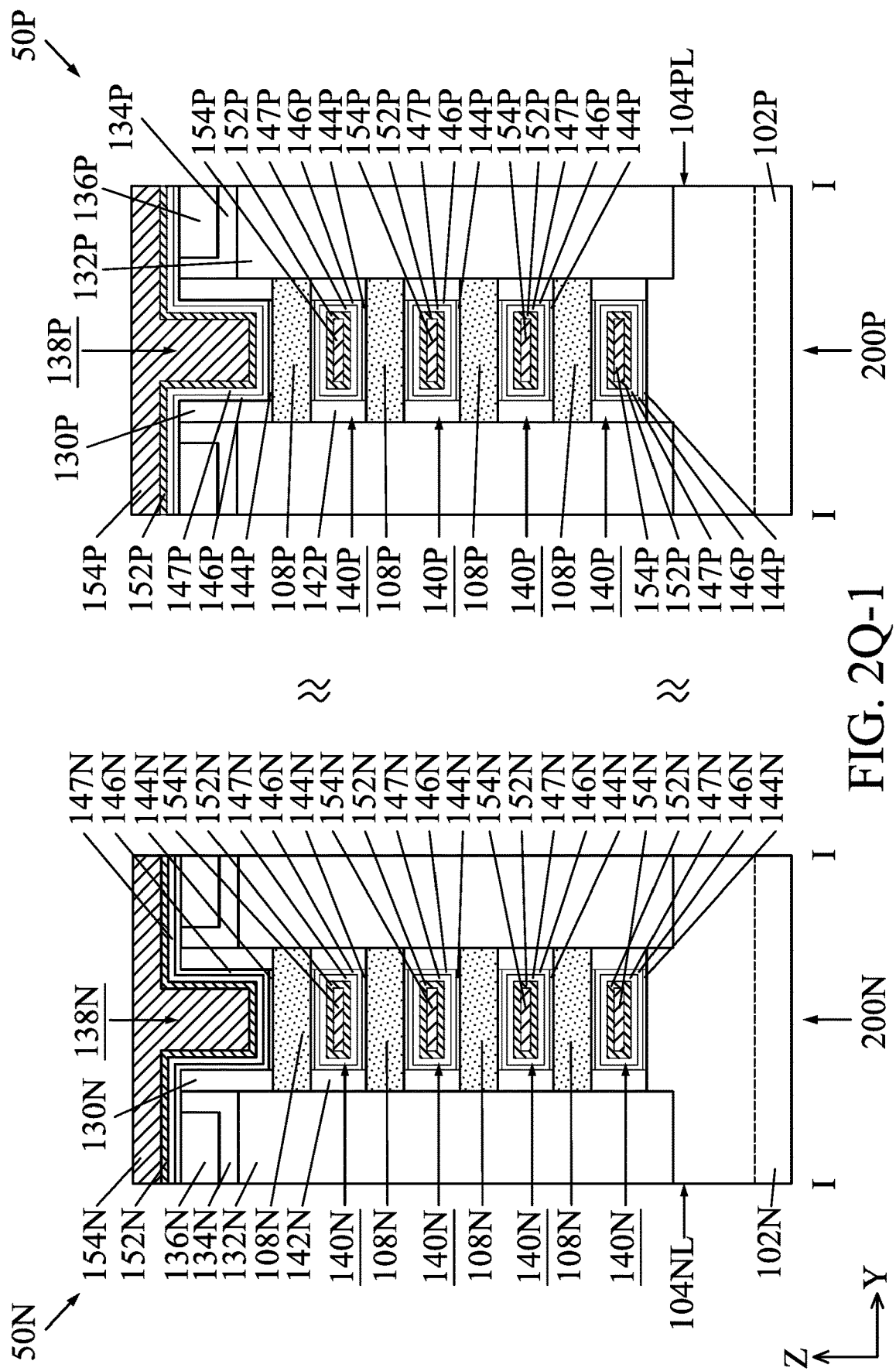
Figures 2, 2Q:
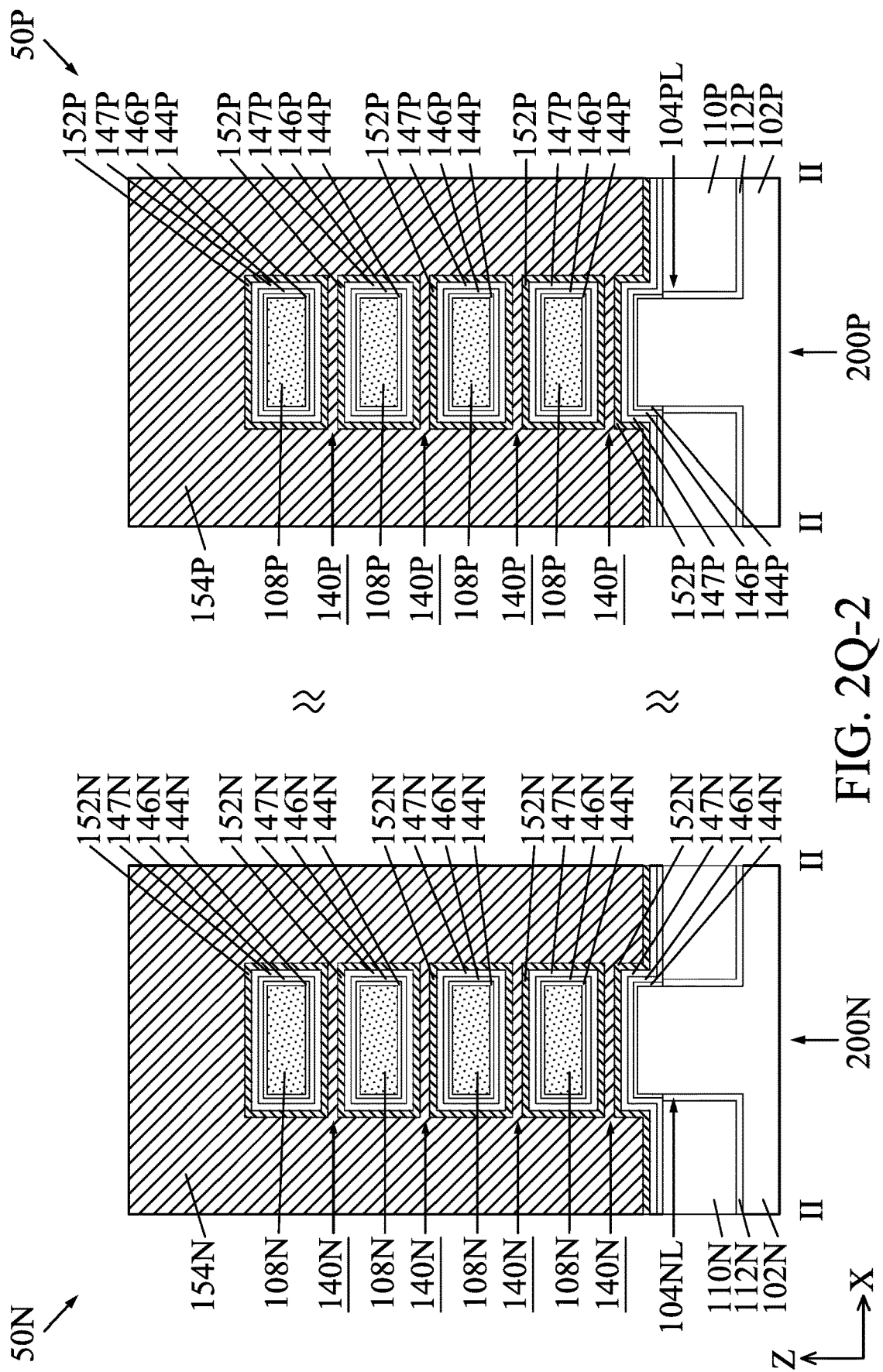

FIGS. 2A-1 through 2Q-1 are cross-sectional views illustrating the formation of semiconductor device structures along line I-I in FIG. 1 at various intermediate stages, in accordance with some embodiments. FIGS. 2A-2 through 2Q-2 are cross-sectional views illustrating the formation of semiconductor device structures along line II-II in FIG. 1 at various intermediate stages, in accordance with some embodiments.

The isolation structure 110N and the lining layer 112N are recessed to form trenches 111N, as shown in FIGS. 2A-1 and 2A-2, in accordance with some embodiments. The trenches 111N expose the sidewalls of the upper portion 104NU of the fin structure 104N, in accordance with some embodiments. In some embodiments, the trenches 111N further expose an upper portion of the lower portion 104NL of the fin structure 104N. In some embodiments, an etch-back process is applied to recess the isolation structure 110N and the lining layer 112N to form trenches 111N.

Similarly, the isolation structure 110P and the lining layer 112P are recessed to form the trenches 111P, as shown in FIGS. 2A-1 and 2A-2 in accordance with some embodiments. The trenches 111P expose the sidewalls of the upper portion 104PU of the fin structure 104P, in accordance with some embodiments. In some embodiments, the trenches 111P further expose an upper portion of the lower portion 104PL of the fin structure 104P. In some embodiments, an etch-back process is applied to recess the isolation structure 110P and the lining layer 112P to form trenches 111P.

In some embodiments, the etch-back process for forming the trenches 111N and 111P includes one or more selective etch processes, such as a dry etching process, a wet etching process, and/or a combination thereof.

A dummy gate structure 118N and a hard mask layer 124N and a dummy gate structure 118P and a hard mask layer 124P are formed over the semiconductor device structures 50N and 50P of FIGS. 2A-1 and 2A-2, as shown in FIGS. 2B-1 and 2B-2, in accordance with some embodiments. The dummy gate structure 118N and the hard mask layer 124N are formed over the fin structure 104N, in accordance with some embodiments. The dummy gate structure 118N extends in the X direction and across the fin structure 104N, in accordance with some embodiments. The dummy gate structure 118N is filled into the recesses 111N (shown in FIG. 2A-2) and covers the upper surfaces and the sidewalls of the fin structure 104N, in accordance with some embodiments. The hard mask layer 124N is formed over the dummy gate structure 118N, in accordance with some embodiments.

The dummy gate structure 118P and the hard mask layer 124P are formed over the fin structure 104P, in accordance with some embodiments. The dummy gate structure 118P extends in the X direction and across the fin structure 104P, in accordance with some embodiments. The dummy gate structure 118P is filled into the recesses 111P (shown in FIG. 2A-2) and covers the upper surfaces and the sidewalls of the fin structure 104P, in accordance with some embodiments. The hard mask layer 124P is formed over the dummy gate structure 118P, in accordance with some embodiments.

In some embodiments, the dummy gate structure 118N defines source/drain regions and channel region of an n-type semiconductor device structure, and the dummy gate structure 118P defines source/drain regions and the channel region of a p-type semiconductor device structure.

The dummy gate structure 118N includes a dummy gate dielectric layer 120N and a dummy gate electrode layer 122N on the dummy gate dielectric layer 120N, in accordance with some embodiments. The dummy gate structure 118P includes a dummy gate dielectric layer 120P and a dummy gate electrode layer 122P on the dummy gate dielectric layer 120P, in accordance with some embodiments.

In some embodiments, the dummy gate dielectric layers 120N and 120P are made of one or more dielectric materials, such as silicon oxide, silicon nitride, silicon oxynitride (SiON), $HfO_2$, HfZrO, HfSiO, HfTiO, HfAlO, and/or a combination thereof. In some embodiments, the dielectric material is formed using thermal oxidation, CVD, ALD, physical vapor deposition (PVD), another suitable method, and/or a combination thereof.

In some embodiments, the dummy gate electrode layers 122N and 122P are made of a conductive material. In some embodiments, the conductive material includes polycrystalline-silicon (poly-Si), poly-crystalline silicon-germanium (poly-SiGe), metallic nitrides, metallic silicides, metals, and/or a combination thereof. In some embodiments, the conductive material is formed using CVD, PVD, and/or a combination thereof.

In some embodiments, the formation of the dummy gate structures 118N and 118P includes conformally forming a dielectric material for the dummy gate dielectric layers 120N and 120P along the upper surfaces of the substrates 102N and 102P and the sidewalls and the upper surfaces of the fin structures 104N and 104P, and forming a conductive material for the dummy gate electrode layers 122N and 122P over the dielectric material.

Afterward, the hard mask layers 124N and 124P are formed over the conductive material for the dummy gate electrode layers 122N and 122P, in accordance with some embodiments.

In some embodiments, the formation of the hard mask layers 124N and 124P includes forming an oxide layer (e.g., silicon oxide) over the conductive material, forming a nitride layer (e.g., silicon nitride) over the oxide layer, and patterning the oxide layer into layers 126N and 126P and the nitride layer into layers 128N and 128P using photolithography and etching processes.

In some embodiments, the dielectric material for the dummy gate dielectric layers 120N and 120P and the conductive material for the dummy gate electrode layers 122N and 122P, uncovered by the hard mask layers 124N and 124P, are removed using one or more etching processes, thereby exposing the source/drain regions of the fin structures 104N and 104P. In some embodiments, the one or more etching processes are dry etching processes, wet etching processes, or a combination thereof.

Gate spacer layers 130N and gate spacers 130P are formed over the semiconductor device structures 50N and 50P, as shown in FIGS. 2B-1 and 2B-2, in accordance with some embodiments. The gate spacer layers 130N are formed along the sidewalls of the dummy gate structure 118N and the hard mask layer 124N, in accordance with some embodiments. The gate spacer layers 130P are formed along the sidewalls of the dummy gate structure 118P and the hard mask layer 124P, in accordance with some embodiments.

In some embodiments, the gate spacer layers 130N and 130P are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the gate spacer layers 130N and 130P are formed using a deposition process followed by an etching process. In some embodiments, the deposition process includes CVD (such as PECVD, LPCVD or HARP) and/or ALD. In some embodiments, the etching process is dry etching.

Afterwards, the fin structure 104N, uncovered by the gate spacer layers 130N, the dummy gate structure 118N, and the hard mask layer 124N, is removed to form source/drain recesses 131N, as shown in FIGS. 2C-1 and 2C-2 in accordance with some embodiments. The source/drain recesses 131N pass through the upper portion 104NU of the fin structure 104N and extend into the lower portion 104NL of the fin structure 104N, in accordance with some embodiments. In some embodiments, an etching process is performed on the semiconductor device structure 50N of FIGS. 2B-1 and 2B-2 to form the source/drain recesses 131N, as shown in FIGS. 2C-1 and 2C-2.

Similarly, the fin structure 104P, uncovered by the gate spacer layers 130P, the dummy gate structure 118P, and the hard mask layer 124P, is removed to form source/drain recesses 131P, as shown in FIGS. 2C-1 and 2C-2 in accordance with some embodiments. The source/drain recesses 131P pass through the upper portions 104PU of the fin structure 104P and extend into the lower portion 104PL of the fin structure 104P, in accordance with some embodiments. In some embodiments, an etching process is performed on the semiconductor device structure 50P of FIGS. 2B-1 and 2B-2 to form the source/drain recesses 131P, as shown in FIGS. 2C-1 and 2C-2.

In some embodiments, the etching process includes a dry etching process, a wet etching process, or a combination thereof.

Source/drain features 132N and source/drain features 132P are formed over the semiconductor device structures 50N and 50P, as shown in FIGS. 2C-1 and 2C-2, in accordance with some embodiments. The source/drain features 132N are formed in the source/drain recesses 131N, in accordance with some embodiments. In some embodiments, the source/drain features 132N are formed to have upper surfaces above the upper surface of the fin structure 104N.

The source/drain features 132P are formed in the source/drain recesses 131P, in accordance with some embodiments. In some embodiments, the source/drain features 132P are formed to have upper surfaces above the upper surface of the fin structure 104P.

In some embodiments, the source/drain features 132N and 132P are made of any suitable material for an n-type semiconductor device and a p-type semiconductor device, such as Ge, Si, GaAs, AlGaAs, SiGe, GaAsP, SiP, SiC, SiCP, and/or a combination thereof. In some embodiments, the source/drain features 132N and 132P are formed using epitaxial growth process, such as MBE, MOCVD, VPE, another suitable epitaxial growth process, and/or a combination thereof.

A contact etching stop layer (CESL) 134N and a CESL 134P are formed over the semiconductor device structures 50N and 50P of FIGS. 2C-1 and 2C-2, as shown in FIGS. 2D-1 and 2D-2, in accordance with some embodiments. The CESL 134N is conformally formed along the upper surfaces of the source/drain features 132N, the sidewalls and the upper surfaces of the gate spacer layers 130N, and the upper surface of the hard mask layer 124N, in accordance with some embodiments.

The CESL 134P is conformally formed along the upper surfaces of the source/drain features 132P, the sidewalls and the upper surfaces of the gate spacer layers 130P, and the upper surface of the hard mask layer 124P, in accordance with some embodiments.

In some embodiments, the CESLs 134N and 134P are made of a dielectric material, such as silicon nitride, silicon oxide, silicon oxynitride, another suitable dielectric material, or a combination thereof. In some embodiments, the CESLs 134N and 134P are formed using CVD (such as PECVD, HARP, and/or a combination thereof), ALD, another suitable method, and/or a combination thereof.

An interlayer dielectric (ILD) layer 136N and an ILD layer 136P are formed over the semiconductor device structures 50N and 50P, as shown in FIGS. 2D-1 and 2D-2, in accordance with some embodiments. The ILD layer 136N is formed over the CESL 134N, in accordance with some embodiments. The ILD layer 136P is formed over the CESL 134P, in accordance with some embodiments.

In some embodiments, the ILD layers 136N and 136P are made of a dielectric material, such as tetraethylorthosilicate (TEOS) oxide, un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the dielectric material for the ILD layers 136N and 136P are formed using CVD (such as HDP-CVD, PECVD, or HARP), ALD, another suitable method, and/or a combination thereof.

Afterwards, the ILD layer 136N and the CESL 134N, formed above the dummy gate structure 118N, are removed to expose the upper surface of the dummy gate electrode layer 122N, as shown in FIGS. 2E-1 and 2E-2, in accordance with some embodiments. In some embodiments, a planarization process such as CMP or an etch-back process is performed on the semiconductor device structure 50N of FIGS. 2D-1 and 2D-2 to expose the upper surface of the dummy gate electrode layer 122N, as shown in FIGS. 2E-1 and 2E-2.

Similarly, the ILD layer 136P and the CESL 134P, formed above the dummy gate structure 118P, are removed to expose the upper surface of the dummy gate electrode layer 122P, as shown in FIGS. 2E-1 and 2E-2 in accordance with some embodiments. In some embodiments, a planarization process such as CMP or an etch-back process is performed on the semiconductor device structure 50P of FIGS. 2D-1 and 2D-2 to expose the upper surface of the dummy gate electrode layer 122P, as shown in FIGS. 2E-1 and 2E-2.

Afterwards, the dummy gate structure 118N (including the dummy gate electrode layer 122N and the dummy gate dielectric layer 120N) is removed to form a trench 138N, as shown in FIGS. 2F-1 and 2F-2 in accordance with some embodiments. In some embodiments, an etching process is performed on the semiconductor device structure 50N of FIGS. 2E-1 and 2E-2 to form the trench 138N, as shown in FIGS. 2F-1 and 2F-2.

Similarly, the dummy gate structure 118P (including the dummy gate electrode layer 122P and the dummy gate dielectric layer 120P) is removed to form a trench 138P, as shown in FIGS. 2F-1 and 2F-2 in accordance with some embodiments. In some embodiments, an etching process is performed on the semiconductor device structure 50P of FIGS. 2E-1 and 2E-2 to form the trench 138P, as shown in FIGS. 2F-1 and 2F-2.

In some embodiments, the etching process includes one or more etching processes. For example, when the dummy gate electrode layers 122N and 122P are polysilicon, a wet etchant such as a tetramethylammonium hydroxide (TMAH) solution may be used to selectively remove the dummy gate electrode layers 122N and 122P. For example, the dummy gate dielectric layers 120N and 120P may be thereafter removed using a plasma dry etching, a dry chemical etching, and/or a wet etching.

Afterwards, the first semiconductor layers 106N of the fin structure 104N are removed to form gaps 140N, as shown in FIGS. 2F-1 and 2F-2, in accordance with some embodiments. The gaps 140N extend between the neighboring second semiconductor layers 108N and between the lowermost second semiconductor layer 108N and the lower portion 104NL of the fin structure 104N, in accordance with some embodiments. The gaps 140N laterally extend directly below the gate spacer layers 130N, in accordance with some embodiments. In some embodiments, an etching process is performed on the semiconductor device structure 50N to form the gaps 140N, as shown in FIGS. 2F-1 and 2F-2.

After the etching process for forming the gaps 140N, four main surfaces (an upper surface, two side surfaces, and a bottom surface) of each of the second semiconductor layers 108N are exposed, in accordance with some embodiments. The exposed second semiconductor layers 108N form a nanowire structure (or a nanosheet structure) in the NMOS region 200N, which will function as a channel region of an n-type semiconductor device structure and be surrounded by gate stack structures, in accordance with some embodiments. In some embodiments, each of the second semiconductor layers 108N is referred to as a semiconductor nanowire (or nanosheet). For example, after the etching process, each of the second semiconductor layers 108N may have a thickness in a range from about 5 nm to about 8 nm. For example, after the etching process, each of the second semiconductor layers 108N may have a width in a range from about 15 nm to about 50 nm in the X direction.

Similarly, the first semiconductor layers 106P of the fin structure 104P are removed to form gaps 140P, as shown in FIGS. 2F-1 and 2F-2, in accordance with some embodiments. The gaps 140P extend between the neighboring second semiconductor layers 108P and between the lowermost second semiconductor layer 108P and the lower portion 104PL of the fin structure 104P, in accordance with some embodiments. The gaps 140P laterally extend directly below the gate spacer layers 130P, in accordance with some embodiments. In some embodiments, an etching process is performed on the semiconductor device structure 50P to form the gaps 140P, as shown in FIGS. 2F-1 and 2F-2.

After the etching process for forming the gaps 140P, four main surfaces (an upper surface, two side surfaces, and a bottom surface) of each of the second semiconductor layers 108P are exposed, in accordance with some embodiments. The exposed second semiconductor layers 108P form a nanowire structure (or nanosheet structure) in the PMOS region 200P. The nanowire structure in the PMOS region 200P will function as a channel region of a p-type semiconductor device structure and be surrounded by gate stack structures, in accordance with some embodiments. In some embodiments, each of the second semiconductor layers 108P is referred to as a semiconductor nanowire (or nanosheet). For example, after the etching process, each of the second semiconductor layers 108P may have a thickness in a range from about 5 nm to about 8 nm. For example, after the etching process, each of the second semiconductor layers 108P may have a width in a range from about 15 nm to about 50 nm in the X direction.

In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

Afterwards, inner spacer layers 142N and inner spacer layers 142P are formed on the semiconductor device structures 50N and 50P of FIGS. 2F-1 and 2F-2, as shown in FIGS. 2G-1 and 2G-2, in accordance with some embodiments. The inner spacer layers 142N are formed in the gaps 140N and on the source/drain features 132N, in accordance with some embodiments. The inner spacer layers 142N are formed between neighboring second semiconductor layers 108N and between the lowermost second semiconductor layer 108N and the lower portion 104NL, in accordance with some embodiments. The inner spacer layers 142N are formed directly below the gate spacer layers 130N, in accordance with some embodiments.

The inner spacer layers 142P are formed in the gaps 140P and on the source/drain features 132P, in accordance with some embodiments. The inner spacer layers 142P are formed between neighboring second semiconductor layers 108P and between the lowermost second semiconductor layer 108P and the lower portion 104PL, in accordance with some embodiments. The inner spacer layers 142P are formed directly below the gate spacer layers 130P, in accordance with some embodiments.

The inner spacer layers 142N and 142P formed between the source/drain feature and a subsequently formed gate stack structure can reduce the parasitic capacitance between the gate stack structure and the source/drain feature (e.g., Cgs and Cgd), in accordance with some embodiments.

In some embodiments, the inner spacer layers 142N and 142P are made of a low-k dielectric material. For example, the inner spacer layers 142N and 142P may be made of SiN, SiCN, SiON, SiOCN, another applicable dielectric material, or a combination thereof. In some embodiments, the inner spacer layers 142N and 142P are formed using a deposition process followed by an etching process. In some embodiments, the deposition process includes CVD (such as PECVD or LPCVD) and/or ALD. In some embodiments, the etching process includes a plasma dry etching, a dry chemical etching, and/or a wet etching.

It is worth noting that as the scale of the semiconductor devices continues to shrink, the spacing between neighboring second semiconductor layers 108N and the spacing between neighboring second semiconductor layers 108P become smaller and smaller. For example, the spacing $S_N$ between neighboring second semiconductor layers 108N may be in a range from about 8 nm to about 12 nm. The spacing Sp between neighboring second semiconductor layers 108P may be in a range from about 8 nm to about 12 nm.

Interfacial layers 144N and interfacial layers 144P are formed over the semiconductor device structures 50N and 50P of FIGS. 2G-1 and 2G-2, as shown in FIGS. 2H-1 and 2H-2, in accordance with some embodiments. The interfacial layers 144N are formed on the exposed main surfaces of the second semiconductor layers 108N, in accordance with some embodiments. The interfacial layers 144N are formed around respective second semiconductor layers 108N, in accordance with some embodiments. In some embodiments, the interfacial layers 144N are further formed on the upper surface and sidewalls of the lower portion 104NL, as shown in FIGS. 2H-1 and 2H-2.

The interfacial layers 144P are formed on the exposed main surfaces of the second semiconductor layers 108P, in accordance with some embodiments. The interfacial layers 144P are formed around respective second semiconductor layers 108P, in accordance with some embodiments. In some embodiments, the interfacial layers 144P are further formed on the upper surface and sidewalls of the lower portion 104PL, as shown in FIGS. 2H-1 and 2H-2.

In some embodiments, each of the interfacial layers 144N and its corresponding second semiconductor layer 108N have an interface IN1, and each of the interfacial layers 144P and its corresponding second semiconductor layer 108P have an interface IP1, as shown in FIGS. 2H-1 and 2H-2.

In some embodiments, the interfacial layers 144N and 144P are made of a chemically formed silicon oxide. In some embodiments, the interfacial layers 144N and 144P are formed using one or more cleaning processes. In some embodiments, the one or more cleaning process includes, in sequence, ozone ($O_3$) clean, standard clean 1 (SC1) and standard clean 2 (SC2) performed on the semiconductor device structures 50N and 50P. In some embodiments, the SC1 includes ammonia hydroxide-hydrogen peroxide-water mixture. In some embodiments, the SC2 includes hydrochloric acid-hydrogen peroxide-water mixture. In some embodiments, each of the interfacial layers 144N and 144P has a thickness ranging from about 5 angstrom (A) to about 10 Å.

Afterwards, first gate dielectric layers 146N and first gate dielectric layers 146P are formed over the semiconductor device structures 50N and 50P of FIGS. 2H-1 and 2H-2, as shown in FIGS. 2I-1 and 2I-2 in accordance with some embodiments. The first gate dielectric layers 146N are conformally formed along the interfacial layers 144N, in accordance with some embodiments. The first gate dielectric layers 146N are formed around respective second semiconductor layers 108N, in accordance with some embodiments. The first gate dielectric layers 146N are further conformally formed along the inner spacers 142N in the gaps 140N, in accordance with some embodiments. The first gate dielectric layers 146N are further conformally formed along the upper surfaces of the ILD layer 136N, the CESL 134N and the gate spacer layers 130N and the side surfaces of the gate spacer layers 130N, in accordance with some embodiments. The first gate dielectric layers 146N are further conformally formed along the upper surface of the isolation structure 110N, in accordance with some embodiments.

The first gate dielectric layers 146P are conformally formed along the interfacial layers 144P, in accordance with some embodiments. The first gate dielectric layers 146P are formed around respective second semiconductor layers 108P, in accordance with some embodiments. The first gate dielectric layers 146P are further conformally formed along the inner spacers 142P in the gaps 140P, in accordance with some embodiments. The first gate dielectric layers 146P are further conformally formed along the upper surfaces of the ILD layer 136P, the CESL 134P and the gate spacer layers 130P and the side surfaces of the gate spacer layers 130P, in accordance with some embodiments. The first gate dielectric layers 146P are further conformally formed along the upper surface of the isolation structure 110P, in accordance with some embodiments.

The first gate dielectric layers 146N and 146P are made of a dielectric material with high dielectric constant (k-value), for example, greater than 3.9. In some embodiments, the high-k dielectric material is $HfO_2$, which is deposited by ALD using $HfCl_4$ and $H_2O$ as precursors. The number of the ALD cycles for forming the first gate dielectric layers 146N and 146P may be in a range from about 8 to about 12. In some embodiments, the high-k dielectric material is HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, and/or a combination thereof. In some embodiments, the high-k dielectric material is formed using CVD, ALD, another suitable method, and/or a combination thereof.

In some embodiments, each of the first gate dielectric layers 146N has a thickness TN1 ranging from about 4 Å to 6 Å, and each of the first gate dielectric layers 146P has a thickness TP1 ranging from about 4 Å to 6 Å.

Afterwards, a process P1 is performed on the semiconductor device structures 50N and 50P, as shown in FIGS. 2J-1 and 2J-2 in accordance with some embodiments. In some embodiments, the process P1 is performed on the semiconductor device structures 50N and 50P to reduce the defects (e.g., dangling bonds) at the interfaces IN1 and the interfaces IP1.

In some embodiments, the process P1 includes introducing fluorine on the first gate dielectric layers 146N and 146P to increase the fluorine content in the first gate dielectric layers 146N and 146P. For example, in some embodiments, the process P1 includes exposing the first gate dielectric layers 146N and 146P to a fluorine-containing plasma (e.g., $SF_6/O_2$ plasma, $CF_4$ plasma, another applicable fluorine-containing plasma, or a combination thereof), so as to increase the fluorine content in the first gate dielectric layers 146N and 146P. For example, the precursor gas for forming the fluorine-containing plasma may include $SF_6$, $CF_4$, $CH_3F$, $CH_2F_2$, $C_2F_2$, $O_2$, another applicable gas or a combination thereof.

In some embodiments, the process P1 includes treating the semiconductor device structures 50N and 50P with $SF_6/O_2$ plasma in a chamber with a pressure in a range from about 20 mTorr to about 60 mTorr. In some embodiments, the semiconductor device structures 50N and 50P are treated with $SF_6/O_2$ plasma in the chamber for a duration in a range from about 1 minute to about 3 minutes. In some embodiments, $SF_6$ gas is introduced into the chamber at a flow rate in a range from about 20 sccm to about 60 sccm, $O_2$ gas is introduced into the chamber at a flow rate in a range from about 3 sccm to about 7 sccm, and a RF power in a range from about 20 W to about 40 W is applied to generate the fluorine-containing plasma to treat the semiconductor device structures 50N and 50P. The above process parameters may be adjusted to facilitate the reduction of the defects at the interfaces IN1 and IP1.

In some embodiments, after introducing fluorine on the first gate dielectric layers 146N and 146P (e.g., by introducing a fluorine-containing plasma on the first gate dielectric layers 146N and 146P), the process P1 further includes annealing the first gate dielectric layers 146N and 146P (e.g., by an annealing process), so as to drive fluorine from the first gate dielectric layers 146N and 146P into the interfacial layers 144N and 144P.

In some embodiments, the first gate dielectric layers 146N and 146P are annealed, so that some fluorine diffuse from the first gate dielectric layers 146N and 146P to the interfaces IN1 and IP1 and react with the dangling bonds at the interfaces IN1 and IP1, reducing the dangling bonds at the interfaces IN1 and IP1. In some embodiments, the performance of the semiconductor device structures 50N and 50P are improved due to the reduction of the dangling bond defects at the interfaces IN1 and IP1.

In some embodiments, since the first gate dielectric layers 146N and 146P are annealed to drive fluorine from the first gate dielectric layers 146N and 146P to the interfaces IN1 and IP1, the fluorine content at the interfaces IN1 and IP1 is increased. In some embodiments, the interfaces IN1 and IP1 are referred to as fluorinated interfaces after the first gate dielectric layers 146N and 146P are annealed.

In some embodiments, the annealing process for the first gate dielectric layers 146N and 146P is performed at a temperature in a range from about 450° C. to about 550° C. for a duration in a range from about 1 minute to about 2 minutes. In some embodiments, the annealing process for the first gate dielectric layers 146N and 146P is performed in a chamber with a pressure in a range from about 3 torr to about 5 torr, and $N_2$ gas is introduced into the chamber at a flow rate in a range from about 8000 sccm to about 12000 sccm. The above process parameters may be adjusted to improve the quality of the interfaces IN1 and IP1.

For example, the annealing process performed on the first gate dielectric layers 146N and 146P may include a rapid thermal annealing (RTA) process, a furnace annealing process, a laser spike annealing process (LSA), another applicable annealing process, or a combination thereof.

In some embodiments, since the interfacial layers 144N and 144P are covered by the first gate dielectric layers 146N and 146P during the process P1, the defects (e.g., dangling bonds) at the interfaces IN1 and IP1 can be reduced without undesirably increasing the thickness of the interfacial layers 144N and 144P.

In some embodiments, the thickness TN1 of the first gate dielectric layers 146N and the thickness TP1 of the first gate dielectric layers 146P are adjusted, so that the interfacial layers 144N and 144P can be protected by the first gate dielectric layers 146N and 146P during the process P1 without overly hindering fluorine from diffusing to the interfaces IN1 and IP1. For example, the thickness TN1 may be less than or equal to 6 Å (e.g., the thickness TN1 may be in a range from about 4 Å to 6 Å), and the thickness TP1 may be less than or equal to 6 Å (e.g., the thickness TP1 may be in a range from about 4 Å to 6 Å).

Afterwards, second gate dielectric layers 147N and second gate dielectric layers 147P are formed over the semiconductor device structures 50N and 50P of FIGS. 2J-1 and 2J-2, as shown in FIGS. 2K-1 and 2K-2, in accordance with some embodiments. The second gate dielectric layers 147N are conformally formed along the first gate dielectric layers 146N, in accordance with some embodiments. The second gate dielectric layers 147N are formed around respective first gate dielectric layers 146N, in accordance with some embodiments. The second gate dielectric layers 147N are further conformally formed along the inner spacers 142N in the gaps 140N, in accordance with some embodiments. The second gate dielectric layers 147N are further conformally formed along the upper surfaces of the ILD layer 136N, the CESL 134N and the gate spacer layers 130N and the side surfaces of the gate spacer layers 130N, in accordance with some embodiments. The second gate dielectric layers 147N are further conformally formed along the upper surface of the isolation structure 110N, in accordance with some embodiments.

The second gate dielectric layers 147P are conformally formed along the first gate dielectric layers 146P, in accordance with some embodiments. The second gate dielectric layers 147P are formed around respective first gate dielectric layers 146P, in accordance with some embodiments. The second gate dielectric layers 147P are further conformally formed along the inner spacers 142P in the gaps 140P, in accordance with some embodiments. The second gate dielectric layers 147P are further conformally formed along the upper surfaces of the ILD layer 136P, the CESL 134P and the gate spacer layers 130P and the side surfaces of the gate spacer layers 130P, in accordance with some embodiments. The second gate dielectric layers 147P are further conformally formed along the upper surface of the isolation structure 110P, in accordance with some embodiments.

In some embodiments, each of the second gate dielectric layers 147N and its corresponding first gate dielectric layer 146N have an interface IN2, and each of the second gate dielectric layers 147P and its corresponding first gate dielectric layer 146P have an interface IP2, as shown in FIGS. 2K-2.

The second gate dielectric layers 147N and 147P are made of a dielectric material with high dielectric constant (k-value), for example, greater than 3.9. In some embodiments, the high-k dielectric material is $HfO_2$, which is deposited by ALD using $HfCl_4$ and $H_2O$ as precursors. The number of the ALD cycles for forming the second gate dielectric layers 147N and 147P may be in a range from about 16 to about 20. In some embodiments, the high-k dielectric material is HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, and/or a combination thereof. In some embodiments, the high-k dielectric material is formed using CVD, ALD, another suitable method, and/or a combination thereof.

In some embodiments, each of the second gate dielectric layers 147N has a thickness TN2 ranging from about 8 Å to 10 Å, and each of the second gate dielectric layers 147P has a thickness TP2 ranging from about 8 Å to 10 Å. In some embodiments, the second gate dielectric layers 147N and 147P are thicker than the first gate dielectric layers 146N and 146P (i.e., the thickness TN2 is greater than the thickness TN1, and the thickness TP2 is greater than the thickness TP1). The thickness TN2 and TP2 may be adjusted to reduce the current leakage of the semiconductor device structures 50N and 50P.

Afterwards, a process P2 is performed on the semiconductor device structures 50N and 50P, as shown in FIGS. 2L-1 and 2L-2 in accordance with some embodiments. In some embodiments, the process P2 is performed on the semiconductor device structures 50N and 50P to reduce the defects (e.g., dangling bonds) at the interfaces IN2 and the interfaces IP2.

In some embodiments, the process P2 includes introducing fluorine on the second gate dielectric layers 147N and 147P to increase the fluorine content in the second gate dielectric layers 147N and 147P. For example, in some embodiments, the process P2 includes exposing the second gate dielectric layers 147N and 147P to a fluorine-containing plasma (e.g., $SF_6/O_2$ plasma, $CF_4$ plasma, another applicable fluorine-containing plasma, or a combination thereof), so as to increase the fluorine content in the second gate dielectric layers 147N and 147P. For example, the precursor gas for forming the fluorine-containing plasma may include $SF_6$, $CF_4$, $CH_3F$, $CH_2F_2$, $C_2F_2$, $O_2$, another applicable gas or a combination thereof.

In some embodiments, the process P2 includes treating the semiconductor device structures 50N and 50P with $SF_6/O_2$ plasma in a chamber with a pressure in a range from about 20 mTorr to about 60 mTorr. In some embodiments, the semiconductor device structures 50N and 50P are treated with $SF_6/O_2$ plasma in the chamber for a duration in a range from about 1 minute to about 3 minutes. In some embodiments, $SF_6$ gas is introduced into the chamber at a flow rate in a range from about 20 sccm to about 60 sccm, $O_2$ gas is introduced into the chamber at a flow rate in a range from about 3 sccm to about 7 sccm, and a RF power in a range from about 20 W to about 40 W is applied to generate the fluorine-containing plasma to treat the semiconductor device structures 50N and 50P. The above process parameters may be adjusted to facilitate the reduction of the defects at the interfaces IN2 and IP2.

In some embodiments, after introducing fluorine on the second gate dielectric layers 147N and 147P (e.g., by introducing a fluorine-containing plasma on the second gate dielectric layers 147N and 147P), the process P2 further includes annealing the second gate dielectric layers 147N and 147P (e.g., by an annealing process), so as to drive fluorine from the second gate dielectric layers 147N and 147P into the first gate dielectric layers 146N and 146P.

In some embodiments, the second gate dielectric layers 147N and 147P are annealed, so that some fluorine diffuse from the second gate dielectric layers 147N and 147P to the interfaces IN2 and IP2 and react with the dangling bonds at the interfaces IN2 and IP2, reducing the dangling bonds at the interfaces IN2 and IP2. In some embodiments, the performance of the semiconductor device structures 50N and 50P are improved due to the reduction of the dangling bond defects at the interfaces IN2 and IP2.

In some embodiments, since the second gate dielectric layers 147N and 147P are annealed to drive fluorine from the second gate dielectric layers 147N and 147P to the interfaces IN2 and IP2, the fluorine content at the interfaces IN2 and IP2 is increased. In some embodiments, the interfaces IN2 and IP2 are referred to as fluorinated interfaces after the second gate dielectric layers 147N and 147P are annealed.

In some embodiments, the annealing process for the second gate dielectric layers 147N and 147P is performed at a temperature in a range from about 450° C. to about 550° C. for a duration in a range from about 1 minute to about 2 minutes. In some embodiments, the annealing process for the second gate dielectric layers 147N and 147P is performed in a chamber with a pressure in a range from about 3 torr to about 5 torr, and $N_2$ gas is introduced into the chamber at a flow rate in a range from about 8000 sccm to about 12000 sccm. The above process parameters may be adjusted to improve the quality of the interfaces IN2 and IP2.

For example, the annealing process performed on the second gate dielectric layers 147N and 147P may include a rapid thermal annealing (RTA) process, a furnace annealing process, a laser spike annealing process (LSA), another applicable annealing process, or a combination thereof.

Afterwards, first capping layers 148N and first capping layers 148P are formed over the semiconductor device structures 50N and 50P of FIGS. 2L-1 and 2L-2, as shown in FIGS. 2M-1 and 2M-2, in accordance with some embodiments. The first capping layers 148N are conformally formed along the second gate dielectric layers 147N, in accordance with some embodiments. The first capping layers 148N are formed around respective second gate dielectric layers 147N, in accordance with some embodiments.

The first capping layers 148P are conformally formed along the second gate dielectric layers 147P, in accordance with some embodiments. The first capping layers 148P are formed around respective second gate dielectric layers 147P, in accordance with some embodiments.

In some embodiments, the first capping layers 148N and 148P are made of TiN, TiSiN, another applicable material, or a combination thereof. In some embodiments, the first capping layers 148N and 148P are formed using ALD. The ALD for forming the first capping layers 148N and 148P may use $TiCl_4$, $SiH_4$ and $NH_3$ as precursors. In some embodiments, each of the first capping layers 148N and 148P has a thickness ranging from about 10 Å to about 15 Å.

Afterward, an annealing process is performed on the first capping layers 148N and 148P, in accordance with some embodiments. In some embodiments, the deposition process of the first capping layers 148N and 148P and the annealing process are continuously performed in a single process tool, improving the quality of the first capping layers 148N and 148P. In some embodiments, the annealing process is a spike anneal, which is performed at a temperature in a range from about 850° C. to about 950° C., and in an ambient atmosphere containing $N_2$. The formation of the first capping layers 148N and 148P followed by the annealing process may improve the quality of the second gate dielectric layers 147N and 147P, thereby enhancing the performance of the semiconductor device structures 50N and 50P.

Afterwards, second capping layers 150N and second capping layers 150P are formed over the semiconductor device structures 50N and 50P of FIGS. 2M-1 and 2M-2, as shown in FIGS. 2N-1 and 2N-2, in accordance with some embodiments. The second capping layers 150N are conformally formed along the first capping layer 148N, in accordance with some embodiments. The second capping layers 150N are formed around respective first capping layers 148N, in accordance with some embodiments.

The second capping layers 150P are conformally formed along the first capping layers 148P, in accordance with some embodiments. The second capping layers 150P are formed around respective first capping layers 148P, in accordance with some embodiments.

The second capping layers 150N and 150P are made of silicon deposited using CVD, in accordance with some embodiments. In some embodiments, the CVD is performed at a temperature in a range from about 350° C. to about 450° C. and uses $Si_2H_6$ and $H_2$ as precursors. In some embodiments, each of the second capping layers 150N and 150P has a thickness ranging from about 15 Å to about 30 Å.

Afterwards, an annealing process is performed on the second capping layers 150N and 150P, in accordance with some embodiments. In some embodiments, the annealing process is a spike anneal, which is performed in an ambient atmosphere containing $N_2$ and at a temperature in a range from about 900° C. to about 950° C. The formation of the second capping layers 150N and 150P followed by the annealing process may improve the quality of the second gate dielectric layers 147N and 147P, thereby enhancing the performance of the semiconductor device structures 50N and 50P.

Afterwards, the second capping layers 150N and 150P and the first capping layers 148N and 148P are removed, as shown in FIGS. 2O-1 and 2O-2, in accordance with some embodiments. The removal of the second capping layers 150N and 150P and the first capping layers 145N and 148P can provide more space to accommodate the subsequently formed work function material and metal fill material, in accordance with some embodiments.

After the removal process, the second gate dielectric layers 147N and 147P are exposed in accordance with some embodiments. In some embodiments, the removal process includes one or more etching process, such as plasma dry etching, dry chemical etching, wet etching, and/or a combination thereof.

Afterwards, work function layers 152P are formed over the semiconductor device structure 50P of FIGS. 2O-1 and 2O-2, as shown in FIGS. 2P-1 and 2P-2 in accordance with some embodiments. The work function layers 152P are conformally formed along the second gate dielectric layers 147P, in accordance with some embodiments. The work function layers 152P are formed around respective second gate dielectric layers 147P, in accordance with some embodiments. The work function layers 152P are further conformally formed along the inner spacers 142P in the gaps 140P, in accordance with some embodiments. The work function layers 152P are further conformally formed along the upper surfaces of the ILD layer 136P, the CESL 134P and the gate spacer layers 130P and the side surfaces of the gate spacer layers 130P, in accordance with some embodiments. The work function layers 152P are further conformally formed along the upper surface of the isolation structure 110P, in accordance with some embodiments.

The work function layers 152P are made of p-type work function metal (e.g., TiN, TaN, and WCN), in accordance with some embodiments. The work function layers 152P are used to tune the threshold voltage of the resulting p-type semiconductor device structure 50P, in accordance with some embodiments. In some embodiments, a p-type work function metal is formed on the semiconductor device structures 50P and 50N using ALD, and then a patterning process (e.g., a lithography process, an etching process, another applicable process, or a combination thereof) is performed to remove the p-type work function metal on the semiconductor device structure 50N, and the p-type work function metal on the semiconductor device structure 50P is remained to serve as the work function layers 152P. In some embodiments, each of the work function layers 152P has a thickness ranging from about 15 Å to about 30 Å.

Afterwards, work function layers 152N are formed over the semiconductor device structure 50N, as shown in FIGS. 2P-1 and 2P-2 in accordance with some embodiments. The work function layers 152N are conformally formed along the second gate dielectric layers 147N, in accordance with some embodiments. The work function layers 152N are formed around respective second gate dielectric layers 147N, in accordance with some embodiments. The work function layers 152N are further conformally formed along the inner spacers 142N in the gaps 140N, in accordance with some embodiments. The work function layers 152N are further conformally formed along the upper surfaces of the ILD layer 136N, the CESL 134N and the gate spacer layers 130N and the side surfaces of the gate spacer layers 130N, in accordance with some embodiments. The work function layers 152N are further conformally formed along the upper surface of the isolation structure 110N, in accordance with some embodiments.

The work function layers 152N are made of n-type work function metal (e.g., TiAl, TiAlN, TiAlC, TiAlCN, TaAl, TaAlN, TaAlC, and TaAlCN), in accordance with some embodiments. The work function layers 152N are used to tune the threshold voltage of the resulting n-type semiconductor device structure 50N, in accordance with some embodiment. In some embodiments, an n-type work function metal is formed on the semiconductor device structures 50N and 50P using ALD, and then a patterning process (e.g., a lithography process, an etching process, another applicable process, or a combination thereof) is performed to remove the n-type work function metal on the semiconductor device structure 50P, and the n-type work function metal on the semiconductor device structure 50N is remained to serve as the work function layers 152N. In some embodiments, the n-type work function metal on the semiconductor device structure 50P is not removed, such that the n-type work function metal and the p-type work function metal are both remained on the semiconductor device structure 50P to serve as the work function layers 152P. In some embodiments, each of the work function layers 152N has a thickness ranging from about 15 Å to about 30 Å.

Afterwards, conductive structure 154N and conductive structure 154P are formed over the semiconductor device structures 50N and 50P of FIGS. 2P-1 and 2P-2, as shown in FIGS. 2Q-1 and 2Q-2 in accordance with some embodiments. In some embodiments, the conductive structure 154N is formed on the work function layers 152N, and the conductive structure 154P is formed on the work function layers 152P, as shown in FIGS. 2Q-1 and 2Q-2.

Each of the work function layers 152N combined with the conductive structure 154N thereon may be referred to as a gate stack structure. In some embodiments, each of the gate stack structures surrounds its corresponding semiconductor layer (nanowire) 108N. Each of the work function layers 152P combined with the conductive structure 154P thereon may be referred to as a gate stack structure. In some embodiments, each of the gate stack structures surrounds its corresponding semiconductor layer (nanowire) 108P.

In some embodiments, the remaining portions of the gaps 140N are filled with the conductive structure 154N, and the remaining portions of the gaps 140P are filled with the conductive structure 154P, as shown in FIGS. 2Q-1 and 2Q-2. In some embodiments, since the spacing $S_N$ between adjacent semiconductor layers 108N and the spacing $S_p$ between adjacent semiconductor layers 108P are small, the gaps 140N and 140P are filled with the layers (e.g., the interfacial layers, the gate dielectric layers, and the work function layers) formed before the conductive structures 154N and 154P are formed, and thus the conductive structures 154N and 154P are not formed in the gaps 140N and 140P.

In some embodiments, the conductive structure 154N and the conductive structure 154P include one or more capping layers (not shown in the figures). The capping layer(s) of the conductive structure 154N may be formed on the work function layers 152N, and the capping layer(s) of the conductive structure 154P may be formed on the work function layers 152P. For example, the capping layer(s) may include TiN, TiSiN, Si, or a combination thereof. For example, the thickness of the capping layer(s) may be in a range from about 10 Å to about 15 Å. For example, the thickness of the capping layer(s) may be in a range from about 5 Å to about 10 Å. For example, the capping layer(s) may be formed using ALD. In some embodiments, the work function layers 152N and the capping layer(s) are in-situ formed in the same chamber, so that the oxygen content at the interface between work function layer 152N and the capping layer is low. In some embodiments, the interface between the work function layer 152N and the capping layer is substantially free of oxygen.

In some embodiments, the conductive structure 154N and the conductive structure 154P include one or more glue layers (not shown in the figures). The glue layer(s) of the conductive structure 154N may be formed on the work function layers 152N, and the glue layer(s) of the conductive structure 154P may be formed on the work function layers 152P. In some embodiments, the glue layer(s) may include tungsten. For example, the thickness of the glue layer(s) may be in a range from about 30 Å to about 50 Å. In some embodiments, the glue layer(s) are formed using ALD. The ALD for forming the glue layer(s) may use $WCl_5$ as the precursor. In some embodiments, the precursors for forming the glue layer(s) are substantially free from fluorine, and thus the glue layer(s) are also substantially free from fluorine.

In some embodiments, the conductive structure 154N and the conductive structure 154P include a metal fill material (not shown in the figures). The metal fill material of the conductive structure 154N may be formed on the work function layers 152N, and the metal fill material of the conductive structure 154P may be formed on the work function layers 152P. In some embodiments, the metal fill material has low resistivity, improving the performance of the semiconductor structures 50N and 50P. For example, the metal fill material may include W, Co, Ru, Ir, another applicable metal, or a combination thereof. In some embodiments, the metal fill material is formed using a CVD. For example, the metal fill material may have a thickness in a range from about 1500 Å to about 2000 Å.

Figures 1, 2R:
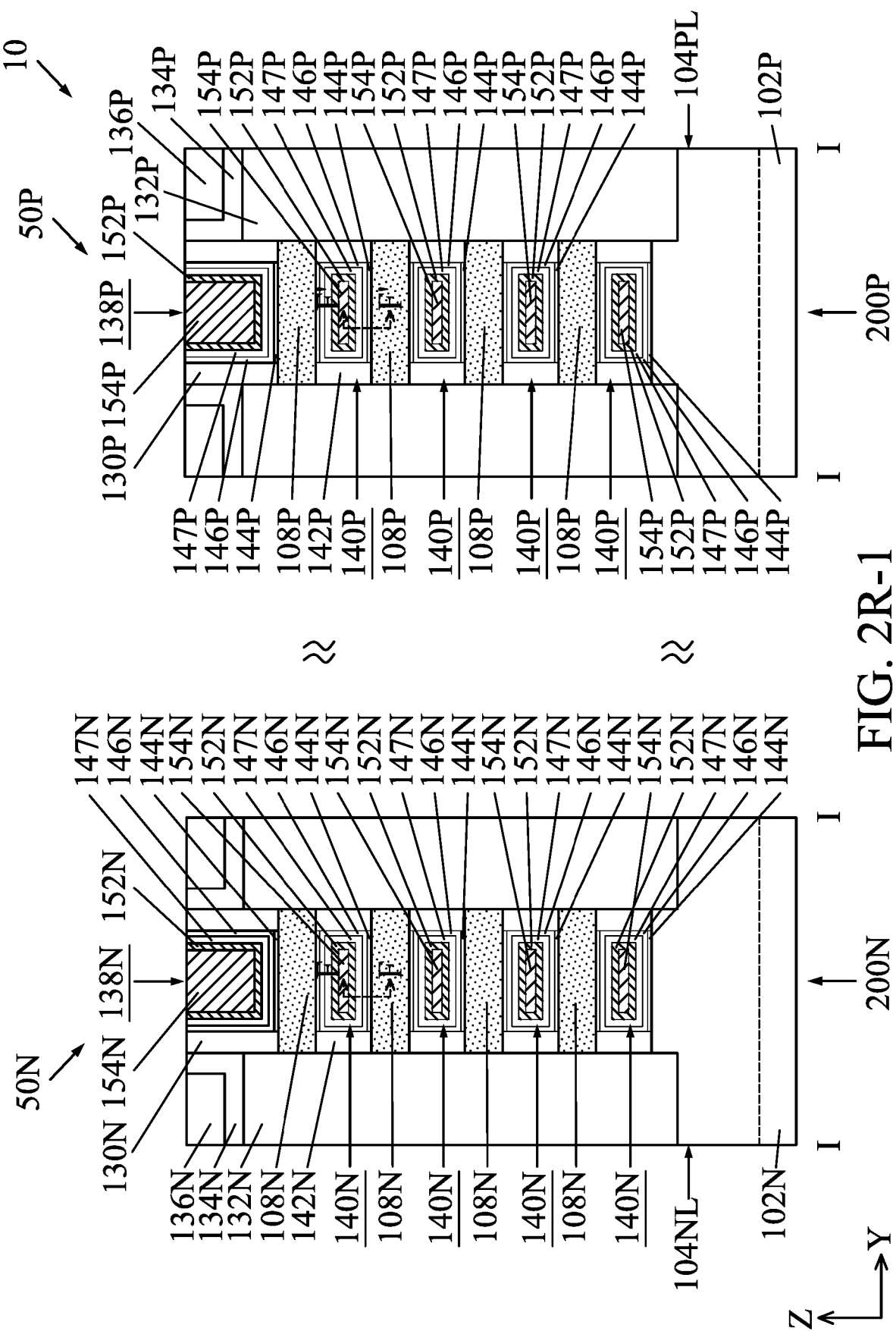
Figures 2, 2R:
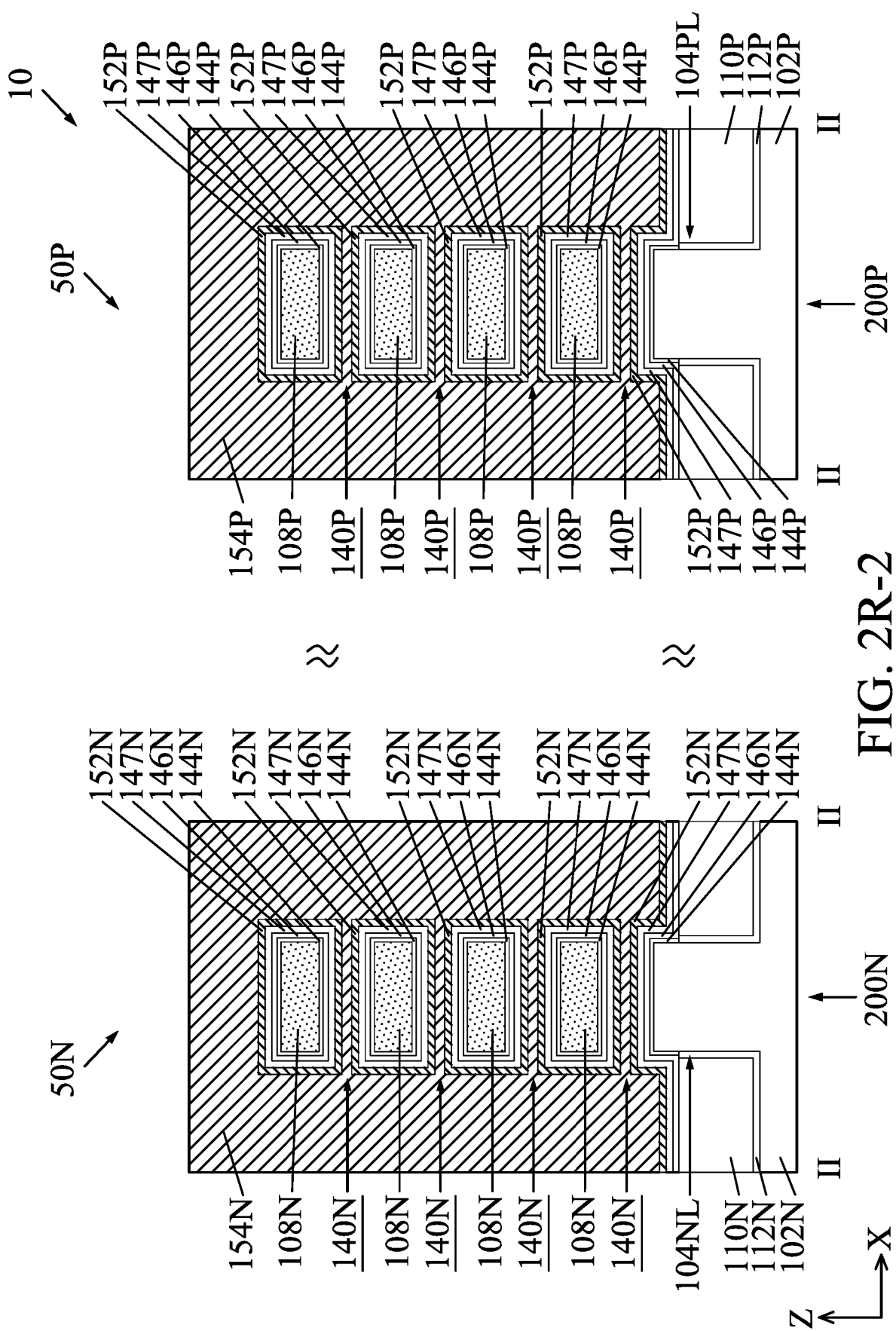

A planarization process such as CMP is performed on the semiconductor device structures 50N and 50P of FIGS. 2Q-1 and 2Q-2, as shown in FIGS. 2R-1 and 2R-2, in accordance with some embodiments. The first gate dielectric layer 146N, the second gate dielectric layer 147N, the work function layer 152N and the conductive structure 154N, formed above the ILD layer 136N, are removed by the planarization process, so as to expose the upper surfaces of the ILD layer 136N, the CESL 134N and the gate spacer layers 130N, in accordance with some embodiments. Similarly, the first gate dielectric layer 146P, the second gate dielectric layer 147P, the work function layer 152P and the conductive structure 154P, formed above the ILD layer 136P, are removed by the planarization process, so as to expose the upper surfaces of the ILD layer 136P, the CESL 134P and the gate spacer layers 130P, in accordance with some embodiments.

After the planarization process, a semiconductor device structure 10 is formed, as shown in FIGS. 2R-1 and 2R-2 in accordance with some embodiments. In some embodiments, the semiconductor device structure 10 includes a p-type semiconductor device structure 50P formed in the PMOS region 200P and an n-type semiconductor device structure 50N formed in the NMOS region 200N.

Figure 3A:
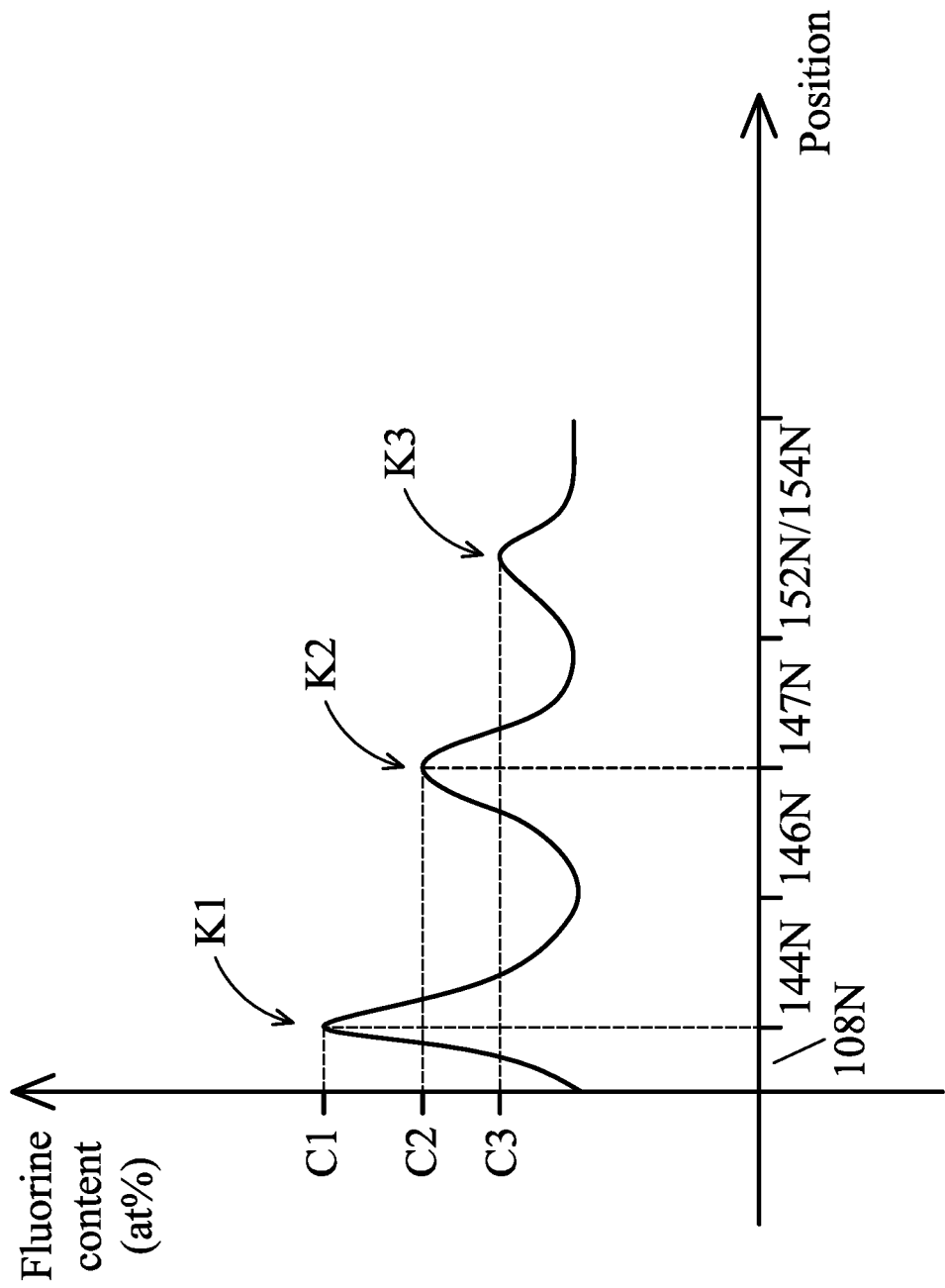
FIG. 3A illustrates the fluorine concentration profile of the semiconductor device structure 50N along line F-F of FIG. 2R-1, in accordance with some embodiments.

FIG. 3A illustrates the fluorine concentration profile of the n-type semiconductor device structure 50N of the semiconductor device structure 10 along the line F-F of FIG. 2R-1, in accordance with some embodiments. As shown in FIG. 3A, at least partially due to the process P1 and the process P2, the fluorine concentration profile of the n-type semiconductor device structure 50N includes a first peak K1, a second peak K2, and/or a third peak K3. In some embodiments, the first peak K1 is located at the interface IN1, the second peak K2 is located at the interface IN2, and the third peak K3 is located in the gate stack structure. In some embodiments, the fluorine content C1 of the first peak K1 is greater than the fluorine content C2 of the second peak K2, and the fluorine content C2 of the second peak K2 is greater than the fluorine content C3 of the third peak K3. The fluorine content C1 of the first peak K1 may be in a range from about 2 at % to about 7 at %. The fluorine content C2 of the second peak K2 may be in a range from about 1 at % to about 3 at %. The fluorine content C3 of the third peak K3 may be equal to or less than 1 at %. The fluorine content C1, the fluorine content C2, and the fluorine content C3 may be adjusted to improve the performance of the n-type semiconductor device structure 50N.

Figure 3B:
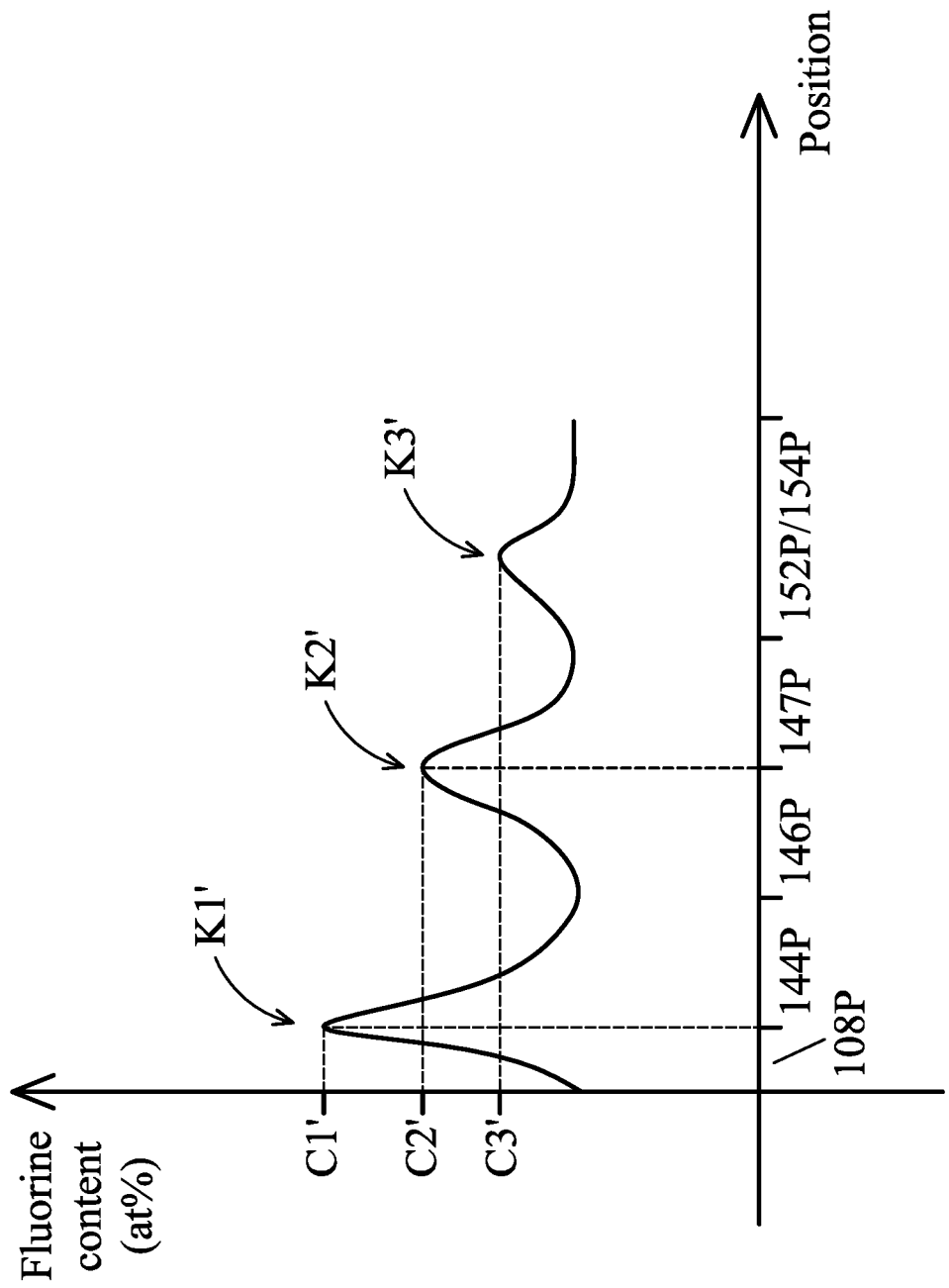
FIG. 3B illustrates the fluorine concentration profile of the semiconductor device structure 50P along line F'-F' of FIG. 2R-1, in accordance with some embodiments.

FIG. 3B illustrates the fluorine concentration profile of the p-type semiconductor device structure 50P of the semiconductor device structure 10 along the line F'-F' of FIG. 2R-1, in accordance with some embodiments. As shown in FIG. 3B, at least partially due to the process P1 and the process P2, the fluorine concentration profile of the p-type semiconductor device structure 50P includes a first peak K1', a second peak K2', and/or a third peak K3'. In some embodiments, the first peak K1' is located at the interface IP1, the second peak K2' is located at the interface IP2, and the third peak K3' is located in the gate stack structure. In some embodiments, the fluorine content C1' of the first peak K1' is greater than the fluorine content C2' of the second peak K2', and the fluorine content C2' of the second peak K2' is greater than the fluorine content C3' of the third peak K3'. The fluorine content C1' of the first peak K1' may be in a range from about 2 at % to about 7 at %. The fluorine content C2' of the second peak K2' may be in a range from about 1 at % to about 3 at %. The fluorine content C3' of the third peak K3' may be equal to or less than 1 at %. The fluorine content C1', the fluorine content C2', and the fluorine content C3' may be adjusted to improve the performance of the p-type semiconductor device structure 50P.

In some embodiments, interconnect structures (not shown in the figures) is formed on the semiconductor device structure 10. The interconnect structure may include a dielectric layer and one or more contact structure formed in the dielectric layer. The contact structure may be made of W, Co, Ru, Ir, or a combination thereof, so that the contact resistance may be reduced.

Figure 4:
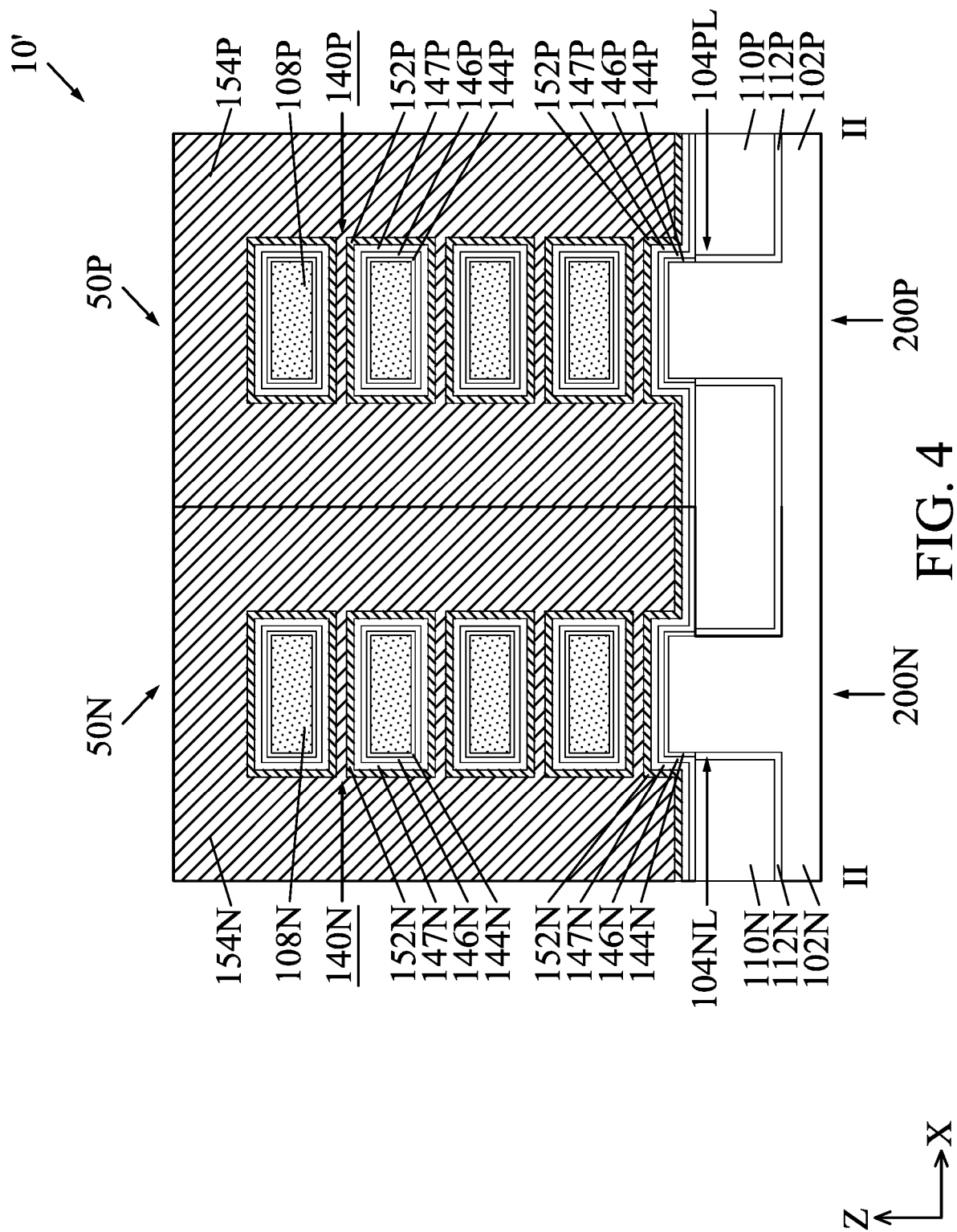
FIG. 4 is illustrates a cross-sectional view of a semiconductor device structure along line II-II in FIG. 1, in accordance with some embodiments.

FIG. 4 is illustrates a cross-sectional view of a semiconductor device structure 10' along line II-II in FIG. 1, in accordance with some embodiments. One difference between the semiconductor device structure 10 and the semiconductor device structure 10' is that the NMOS region 200N and the PMOS region 200P of the semiconductor device structure 10' are located close to each other, as show in FIG. 4. In some embodiments, the conductive structure 154N of the n-type semiconductor device structure 50N interfaces with the conductive structure 154P of the p-type semiconductor device structure 50P, as shown in FIG. 4.

As described previously, in some embodiments, the method for forming the semiconductor device structure 50N includes forming the interfacial layer 144N on the semiconductor layer 108N, forming the first gate dielectric layer 146N on the interfacial layer 144N, and forming the second gate dielectric layer 147N on the first gate dielectric layer 146N. Fluorine may be introduced on the first gate dielectric layer 146N and the second gate dielectric layer 147N, and the first gate dielectric layer 146N and the second gate dielectric layer 147N may be annealed, so that the defects (e.g., dangling bonds) at the interface IN1 between the semiconductor layer 108N and the interfacial layer 144N and the defects (e.g., dangling bonds) at the interface IN2 between the first gate dielectric layer 146N and the second gate dielectric layer 147N may be reduced. Similarly, in some embodiments, the method for forming the semiconductor device structure 50P includes forming the interfacial layer 144P on the semiconductor layer 108P, forming the first gate dielectric layer 146P on the interfacial layer 144P, and forming the second gate dielectric layer 147P on the first gate dielectric layer 146P. Fluorine may be introduced on the first gate dielectric layer 146P and the second gate dielectric layer 147P, and the first gate dielectric layer 146P and the second gate dielectric layer 147P may be annealed, so that the defects (e.g., dangling bonds) at the interface IP1 between the semiconductor layer 108P and the interfacial layer 144P and the defects (e.g., dangling bonds) at the interface IP2 between the first gate dielectric layer 146P and the second gate dielectric layer 147P may be reduced.

Embodiments of a method for forming a semiconductor device structure are provided. The method for forming the semiconductor device structure may include forming an interfacial layer on a semiconductor layer, forming a first gate dielectric layer on the interfacial layer, and forming a second gate dielectric layer on the second gate dielectric layer. The method may also include introducing fluorine on the first gate dielectric layer, annealing the first gate dielectric layer, introducing fluorine on the second gate dielectric layer, and annealing the second gate dielectric layer. As a result, the defects at the interface between the interfacial layer and the semiconductor layer and the defects at the interface between the first gate dielectric layer and the second gate dielectric layer may be reduced.

In some embodiments, a method for forming a semiconductor device structure is provided. The method includes forming a semiconductor layer on a semiconductor substrate, forming an interfacial layer on the semiconductor layer, forming a first gate dielectric layer on the interfacial layer, introducing fluorine on the first gate dielectric layer, annealing the first gate dielectric layer, forming a second gate dielectric layer on the first gate dielectric layer, introducing fluorine on the second gate dielectric layer, annealing the second gate dielectric layer, and forming a gate stack structure on the second gate dielectric layer.

In some embodiments, a method for forming a semiconductor device structure is provided. The method includes forming a fin structure on a semiconductor substrate. The fin structure includes first semiconductor layers and second semiconductor layers alternately stacked. The method also includes removing the first semiconductor layers of the fin structure, forming interfacial layers on the second semiconductor layers, forming first gate dielectric layers on the interfacial layers, applying a first fluorine-containing plasma on the first gate dielectric layers, performing a first annealing process on the first gate dielectric layers, forming second gate dielectric layers on the first gate dielectric layers, applying a second fluorine-containing plasma on the second gate dielectric layers, performing a second annealing process on the second gate dielectric layers, and forming gate stack structures on the second gate dielectric layers.

In some embodiments, a semiconductor device structure is provided. The semiconductor device structure includes a semiconductor nanowire over a semiconductor substrate, and an interfacial layer on the semiconductor nanowire. The semiconductor nanowire and the interfacial layer have a first fluorinated interface therebetween. The semiconductor device structure also includes a first gate dielectric layer on the interfacial layer, and a second gate dielectric layer on the first gate dielectric layer. The first gate dielectric layer and the second gate dielectric layer have a second fluorinated interface therebetween. The semiconductor device structure also includes a gate stack structure on the second gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a semiconductor layer on a semiconductor substrate;
    forming an interfacial layer on the semiconductor layer;
    forming a first gate dielectric layer on the interfacial layer;
    introducing fluorine on the first gate dielectric layer;
    annealing the first gate dielectric layer;
    forming a second gate dielectric layer on the first gate dielectric layer;
    introducing fluorine on the second gate dielectric layer;
    annealing the second gate dielectric layer; and
    forming a gate stack structure on the second gate dielectric layer.

2. The method for forming the semiconductor device structure as claimed in claim 1, wherein a thickness of the first gate dielectric layer is smaller than a thickness of the second gate dielectric layer.

3. The method for forming the semiconductor device structure as claimed in claim 1, wherein the introducing fluorine on the first gate dielectric layer comprises exposing the first gate dielectric layer to a fluorine-containing plasma.

4. The method for forming the semiconductor device structure as claimed in claim 1, wherein the introducing fluorine on the second gate dielectric layer comprises exposing the second gate dielectric layer to a fluorine-containing plasma.

5. The method for forming the semiconductor device structure as claimed in claim 1, wherein a fluorine content at an interface between the semiconductor layer and the interfacial layer is increased after the annealing of the first gate dielectric layer.

6. The method for forming the semiconductor device structure as claimed in claim 1, wherein a fluorine content at an interface between the first gate dielectric layer and the second gate dielectric layer is increased after the annealing of the second gate dielectric layer.

7. The method for forming the semiconductor device structure as claimed in claim 1, wherein the annealing of the first gate dielectric layer comprises driving fluorine from the first gate dielectric layer into the interfacial layer.

8. The method for forming the semiconductor device structure as claimed in claim 1, wherein the annealing of the second gate dielectric layer comprises driving fluorine from the second gate dielectric layer into the first gate dielectric layer.

9. A method for forming a semiconductor device structure, comprising:
    forming a fin structure on a semiconductor substrate, wherein the fin structure comprises first semiconductor layers and second semiconductor layers alternately stacked;
    removing the first semiconductor layers of the fin structure;
    forming interfacial layers on the second semiconductor layers;
    forming first gate dielectric layers on the interfacial layers;
    applying a first fluorine-containing plasma on the first gate dielectric layers;
    performing a first annealing process on the first gate dielectric layers;
    forming second gate dielectric layers on the first gate dielectric layers;
    applying a second fluorine-containing plasma on the second gate dielectric layers;
    performing a second annealing process on the second gate dielectric layers; and
    forming gate stack structures on the second gate dielectric layers.

10. The method for forming the semiconductor device structure as claimed in claim 9, wherein the first fluorine-containing plasma is applied on the first gate dielectric layers under a pressure in a range from about 20 mTorr to about 60 mTorr for a duration in a range from about 1 minute to about 3 minutes.

11. The method for forming the semiconductor device structure as claimed in claim 10, wherein the first fluorine-containing plasma is generated with a RF power in a range from about 20 W to about 40 W.

12. The method for forming the semiconductor device structure as claimed in claim 9, wherein the second fluorine-containing plasma is applied on the second gate dielectric layers under a pressure in a range from about 20 mTorr to about 60 mTorr for a duration in a range from about 1 minute to about 3 minutes.

13. The method for forming the semiconductor device structure as claimed in claim 12, wherein the second fluorine-containing plasma is generated with a RF power in a range from about 20 W to about 40 W.

14. The method for forming the semiconductor device structure as claimed in claim 9, wherein the first annealing process is performed at a temperature in a range from about 450° C. to about 550° C. for a duration in a range from about 1 minute to about 2 minutes.

15. The method for forming the semiconductor device structure as claimed in claim 9, wherein the second annealing process is performed at a temperature in a range from about 450° C. to about 550° C. for a duration in a range from about 1 minute to about 2 minutes.

16. A method for forming a semiconductor device structure, comprising:
    forming a semiconductor nanowire over a semiconductor substrate;
    forming a first gate dielectric layer over the semiconductor nanowire;
    introducing fluorine on the first gate dielectric layer;
    forming a second gate dielectric layer on the first gate dielectric layer;
    introducing fluorine on the second gate dielectric layer;
    forming a first capping layer on the second gate dielectric layer;
    annealing the first capping layer;
    removing the first capping layer; and
    forming a gate stack structure on the second gate dielectric layer.

17. The method for forming the semiconductor device structure as claimed in claim 16, further comprising:
    forming an interfacial layer between the first gate dielectric layer and the semiconductor nanowire.

18. The method for forming the semiconductor device structure as claimed in claim 17, wherein the semiconductor nanowire and the interfacial layer have a first fluorinated interface therebetween, and the first gate dielectric layer and the second gate dielectric layer have a second fluorinated interface therebetween, and wherein a first fluorine content at the first fluorinated interface is greater than a second fluorine content at the second fluorinated interface.

19. The method for forming the semiconductor device structure as claimed in claim 18, wherein the second fluorine content at the second fluorinated interface is greater than a third fluorine content in the gate stack structure.

20. The method for forming the semiconductor device structure as claimed in claim 16, further comprising:
    forming a second capping layer on the first capping layer after annealing the first capping layer, wherein the first capping layer and the second capping layer are made of different materials;
    annealing the second capping layer; and
    removing the second capping layer.

* * * * *